United States Patent
Shibutani et al.

[11] Patent Number: 5,818,776
[45] Date of Patent: Oct. 6, 1998

[54] SEMICONDUCTOR MEMORY DEVICE AND METHOD OF READING DATA THEREFROM

[75] Inventors: Koji Shibutani; Hideshi Maeno, both of Tokyo, Japan

[73] Assignee: Mitsubishi Denki Kabushiki Kaisha, Tokyo, Japan

[21] Appl. No.: 838,287

[22] Filed: Apr. 17, 1997

[30]  Foreign Application Priority Data

Oct. 31, 1996 [JP] Japan .................................. 8-289982

[51] Int. Cl.$^6$ .................................................. G11C 7/00
[52] U.S. Cl. .................... 365/221; 365/220; 365/149; 365/230.05
[58] Field of Search .................................. 365/220, 221, 365/230.05, 149

[56]  References Cited

U.S. PATENT DOCUMENTS

| | | | |
|---|---|---|---|
| 4,710,789 | 12/1987 | Furutani et al. | 365/149 |
| 5,010,519 | 4/1991 | Yoshimoto et al. | 365/149 |
| 5,029,141 | 7/1991 | Yoshimoto et al. | 365/230.03 |
| 5,291,453 | 3/1994 | Aoto et al. | 365/221 |
| 5,471,420 | 11/1995 | Nii et al. | 365/182 |
| 5,473,756 | 12/1995 | Traylor | 395/877 |
| 5,612,926 | 3/1997 | Yazawa et al. | 365/239 |
| 5,701,267 | 12/1997 | Masuda et al. | 365/201 |

FOREIGN PATENT DOCUMENTS

| | | |
|---|---|---|
| 62-202397 | 9/1987 | Japan . |
| 62-298077 | 12/1987 | Japan . |
| 6-176559 | 6/1994 | Japan . |
| 7-83062 | 9/1995 | Japan . |

*Primary Examiner*—David C. Nelms
*Assistant Examiner*—Hoai Ho
*Attorney, Agent, or Firm*—Burns, Doane, Swecker & Mathis, LLP

[57]  ABSTRACT

When stored data of a plurality of memory cells (MC00 to MC03, MC10 to MC13, MC20 to MC23, MC30 to MC33) arranged in a matrix are sequentially read out, a reading access control circuit (101) outputs a row address and a column address to a row decoder (102) and a reading bit-line selector (103), respectively, for an access to the memory cells. The reading access control circuit (101) outputs the row address and the column address so that an n-type memory cell may be first selected by the reading bit-line selector (103) after activation of the selected reading word line every time one of the reading word lines (RWL0 to RWL3) is selected by the row decoder (102). With this configuration, data can be sequentially read out at higher speed from a plurality of memory cells arranged in a matrix.

13 Claims, 28 Drawing Sheets

| INPUT | | OUTPUT | | | |
|---|---|---|---|---|---|
| A0 | A1 | Y0 | Y1 | Y2 | Y3 |
| L | L | H | L | L | L |
| H | L | L | H | L | L |
| L | H | L | L | H | L |
| H | H | L | L | L | H |

| INPUT | | OUTPUT | | | |
|---|---|---|---|---|---|
| A2 | A3 | X0 | X1 | X2 | X3 |
| L | L | H | L | L | L |
| H | L | L | H | L | L |
| L | H | L | L | H | L |
| H | H | L | L | L | H |

FIG. 7A

| T | AD # | A3 | A2 | A1 | A0 | BL # | WL # | MC # |
|---|------|----|----|----|----|------|------|------|
| 0 | AD0  | 0  | 0  | 0  | 0  | RBL0 | RWL0 | MC00 |
| 1 | AD1  | 0  | 0  | 0  | 1  | RBL1 | RWL0 | MC10 |
| 2 | AD2  | 0  | 0  | 1  | 0  | RBL2 | RWL0 | MC20 |
| 3 | AD3  | 0  | 0  | 1  | 1  | RBL3 | RWL0 | MC30 |
| 4 | AD4  | 0  | 1  | 0  | 0  | RBL0 | RWL1 | MC01 |
| 5 | AD5  | 0  | 1  | 0  | 1  | RBL1 | RWL1 | MC11 |
| 6 | AD6  | 0  | 1  | 1  | 0  | RBL2 | RWL1 | MC21 |
| 7 | AD7  | 0  | 1  | 1  | 1  | RBL3 | RWL1 | MC31 |
| 8 | AD8  | 1  | 0  | 0  | 0  | RBL0 | RWL2 | MC02 |
| 9 | AD9  | 1  | 0  | 0  | 1  | RBL1 | RWL2 | MC12 |
| 10 | AD10 | 1 | 0  | 1  | 0  | RBL2 | RWL2 | MC22 |
| 11 | AD11 | 1 | 0  | 1  | 1  | RBL3 | RWL2 | MC32 |
| 12 | AD12 | 1 | 1  | 0  | 0  | RBL0 | RWL3 | MC30 |
| 13 | AD13 | 1 | 1  | 0  | 1  | RBL1 | RWL3 | MC31 |
| 14 | AD14 | 1 | 1  | 1  | 0  | RBL2 | RWL3 | MC32 |
| 15 | AD15 | 1 | 1  | 1  | 1  | RBL3 | RWL3 | MC33 |

FIG. 7B

| MC00 | MC01 | MC02 | MC03 |
|------|------|------|------|
| 0    | 4    | 8    | 12   |

| MC10 | MC11 | MC12 | MC13 |
|------|------|------|------|
| (1)  | (5)  | (9)  | (13) |

| MC20 | MC21 | MC22 | MC23 |
|------|------|------|------|
| 2    | 6    | 10   | 14   |

| MC30 | MC31 | MC32 | MC33 |
|------|------|------|------|
| (3)  | (7)  | (11) | (15) |

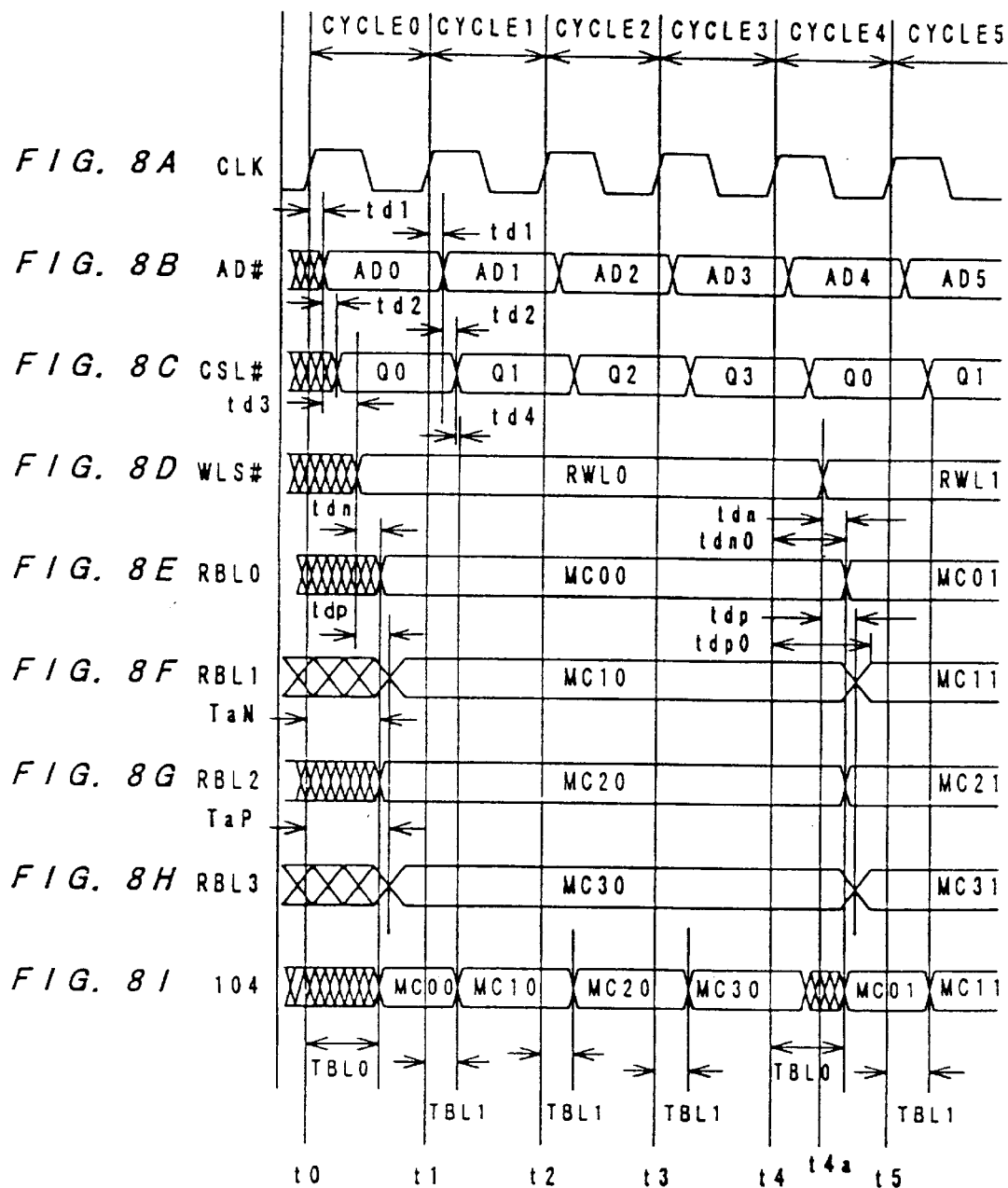

F I G. 1 0

| INPUT | | | OUTPUT | | | |
|---|---|---|---|---|---|---|
| WP | A0 | A1 | Y0 | Y1 | Y2 | Y3 |
| H | L | L | H | L | L | L |
|   | H | L | L | H | L | L |
|   | L | H | L | L | H | L |
|   | H | H | L | L | L | H |
| L | * | * | L | L | L | L |

( * ANY VALUE)

F I G. 1 1

| INPUT | | | OUTPUT | | | |
|---|---|---|---|---|---|---|
| WP0 | A2 | A3 | X0 | X1 | X2 | X3 |
| H | L | L | H | L | L | L |
|   | H | L | L | H | L | L |
|   | L | H | L | L | H | L |
|   | H | H | L | L | L | H |
| L | * | * | L | L | L | L |

( * ANY VALUE)

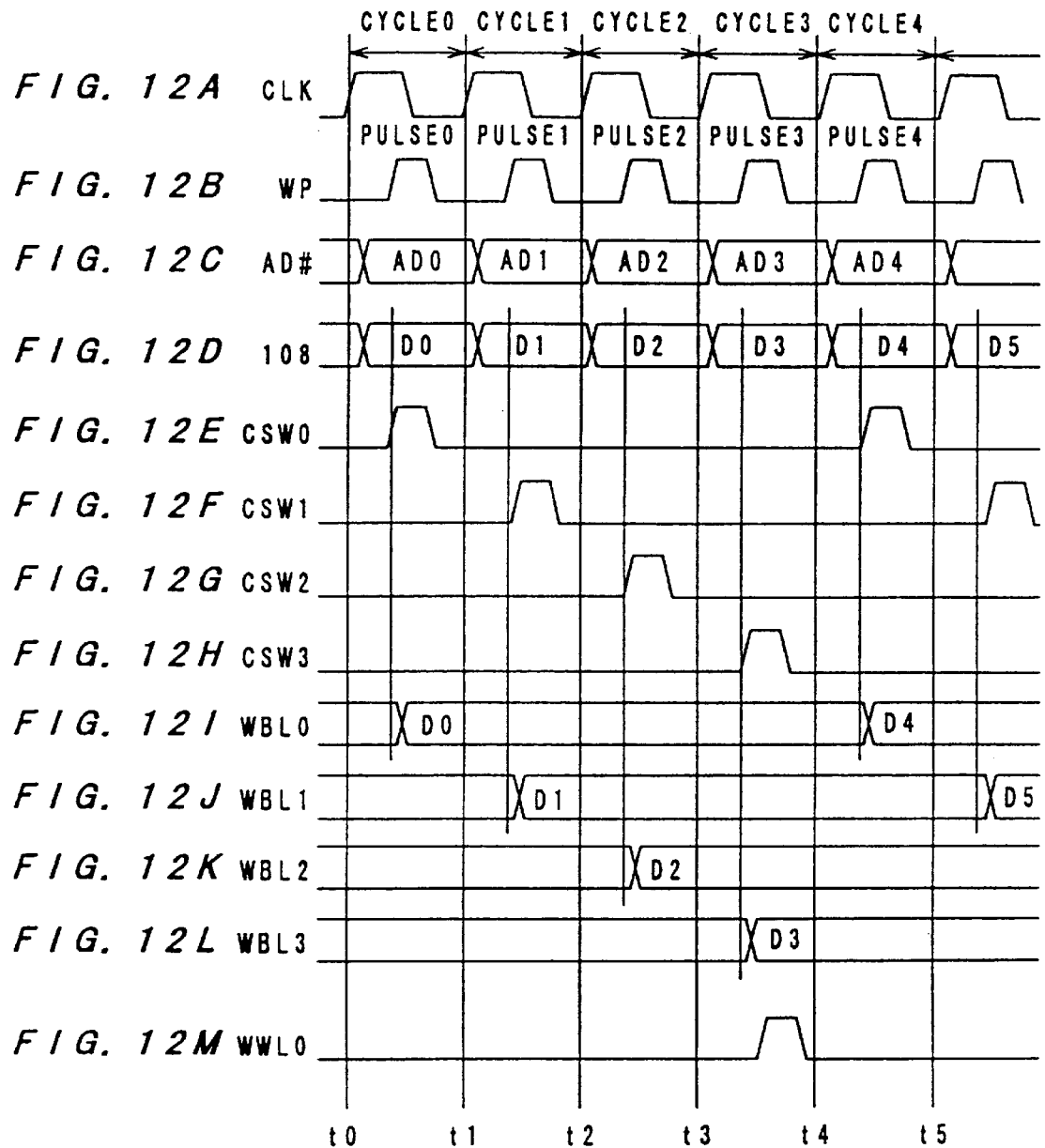

FIG. 14A CLK
FIG. 14B A0
FIG. 14C A1
FIG. 14D EN
FIG. 14E COLUMN ADDRESS

FIG. 15A

| T | AD # | A3 | A2 | A1 | A0 | BL # | WL # | MC # |
|---|------|----|----|----|----|------|------|------|
| 0 | AD0 | 0 | 0 | 0 | 0 | RBL0 | RWL0 | MC00 |
| 1 | AD1 | 0 | 0 | 1 | 0 | RBL2 | RWL0 | MC20 |
| 2 | AD2 | 0 | 0 | 1 | 1 | RBL3 | RWL0 | MC30 |
| 3 | AD3 | 0 | 0 | 0 | 1 | RBL1 | RWL0 | MC10 |
| 4 | AD4 | 0 | 1 | 0 | 0 | RBL0 | RWL1 | MC01 |
| 5 | AD5 | 0 | 1 | 1 | 0 | RBL2 | RWL1 | MC21 |
| 6 | AD6 | 0 | 1 | 1 | 1 | RBL3 | RWL1 | MC31 |
| 7 | AD7 | 0 | 1 | 0 | 1 | RBL1 | RWL1 | MC11 |
| 8 | AD8 | 1 | 0 | 0 | 0 | RBL0 | RWL2 | MC02 |
| 9 | AD9 | 1 | 0 | 1 | 0 | RBL2 | RWL2 | MC22 |
| 10 | AD10 | 1 | 0 | 1 | 1 | RBL3 | RWL2 | MC32 |
| 11 | AD11 | 1 | 0 | 0 | 1 | RBL1 | RWL2 | MC12 |
| 12 | AD12 | 1 | 1 | 0 | 0 | RBL0 | RWL3 | MC30 |
| 13 | AD13 | 1 | 1 | 1 | 0 | RBL2 | RWL3 | MC32 |
| 14 | AD14 | 1 | 1 | 1 | 1 | RBL3 | RWL3 | MC33 |
| 15 | AD15 | 1 | 1 | 0 | 1 | RBL1 | RWL3 | MC32 |

FIG. 15B

| MC00 | MC01 | MC02 | MC03 |
|------|------|------|------|
| 0 | 4 | 8 | 12 |

| MC10 | MC11 | MC12 | MC13 |
|------|------|------|------|
| 3 | 7 | 11 | 15 |

| MC20 | MC21 | MC22 | MC23 |
|------|------|------|------|
| 1 | 5 | 9 | 13 |

| MC30 | MC31 | MC32 | MC33 |
|------|------|------|------|
| 2 | 6 | 10 | 14 |

FIG. 17A

| T | AD # | A3 | A2 | A1 | A0 | BL # | WL # | MC # |
|---|------|----|----|----|----|------|------|------|
| 0 | AD0 | 0 | 0 | 0 | 0 | RBL0 | RWL0 | MC00 |
| 1 | AD1 | 0 | 0 | 1 | 0 | RBL2 | RWL0 | MC20 |
| 2 | AD2 | 0 | 0 | 1 | 1 | RBL3 | RWL0 | MC30 |
| 3 | AD3 | 0 | 0 | 0 | 1 | RBL1 | RWL0 | MC10 |
| 4 | AD4 | 1 | 0 | 0 | 0 | RBL0 | RWL2 | MC02 |
| 5 | AD5 | 1 | 0 | 1 | 0 | RBL2 | RWL2 | MC22 |
| 6 | AD6 | 1 | 0 | 1 | 1 | RBL3 | RWL2 | MC32 |
| 7 | AD7 | 1 | 0 | 0 | 1 | RBL1 | RWL2 | MC12 |
| 8 | AD8 | 1 | 1 | 0 | 0 | RBL0 | RWL3 | MC30 |
| 9 | AD9 | 1 | 1 | 1 | 0 | RBL2 | RWL3 | MC32 |
| 10 | AD10 | 1 | 1 | 1 | 1 | RBL3 | RWL3 | MC33 |
| 11 | AD11 | 1 | 1 | 0 | 1 | RBL1 | RWL3 | MC32 |
| 12 | AD12 | 0 | 1 | 0 | 0 | RBL0 | RWL1 | MC01 |
| 13 | AD13 | 0 | 1 | 1 | 0 | RBL2 | RWL1 | MC21 |
| 14 | AD14 | 0 | 1 | 1 | 1 | RBL3 | RWL1 | MC31 |
| 15 | AD15 | 0 | 1 | 0 | 1 | RBL1 | RWL1 | MC11 |

FIG. 17B

| MC00 | MC01 | MC02 | MC03 |
|------|------|------|------|
| 0 | 12 | 4 | 8 |

| MC10 | MC11 | MC12 | MC13 |
|------|------|------|------|
| (3) | (15) | (7) | (11) |

| MC20 | MC21 | MC22 | MC23 |
|------|------|------|------|
| 1 | 13 | 5 | 9 |

| MC30 | MC31 | MC32 | MC33 |
|------|------|------|------|
| (2) | (14) | (6) | (10) |

FIG. 19A

| T | RWL0 | RWL1 | RWL2 | RWL3 | A1 | A0 | BL # | MC # |
|---|---|---|---|---|---|---|---|---|
| 0 | 1 | 0 | 0 | 0 | 0 | 0 | RBL0 | MC00 |
| 1 | 1 | 0 | 0 | 0 | 1 | 0 | RBL2 | MC20 |
| 2 | 1 | 0 | 0 | 0 | 1 | 1 | RBL3 | MC30 |
| 3 | 1 | 0 | 0 | 0 | 0 | 1 | RBL1 | MC10 |
| 4 | 0 | 1 | 0 | 0 | 0 | 0 | RBL0 | MC01 |
| 5 | 0 | 1 | 0 | 0 | 1 | 0 | RBL2 | MC21 |
| 6 | 0 | 1 | 0 | 0 | 1 | 1 | RBL3 | MC31 |
| 7 | 0 | 1 | 0 | 0 | 0 | 1 | RBL1 | MC11 |
| 8 | 0 | 0 | 1 | 0 | 0 | 0 | RBL0 | MC02 |
| 9 | 0 | 0 | 1 | 0 | 1 | 0 | RBL2 | MC22 |
| 10 | 0 | 0 | 1 | 0 | 1 | 1 | RBL3 | MC32 |
| 11 | 0 | 0 | 1 | 0 | 0 | 1 | RBL1 | MC12 |
| 12 | 0 | 0 | 0 | 1 | 0 | 0 | RBL0 | MC30 |
| 13 | 0 | 0 | 0 | 1 | 1 | 0 | RBL2 | MC32 |
| 14 | 0 | 0 | 0 | 1 | 1 | 1 | RBL3 | MC33 |
| 15 | 0 | 0 | 0 | 1 | 0 | 1 | RBL1 | MC32 |

FIG. 19B

| MC00 | MC01 | MC02 | MC03 |
|---|---|---|---|
| [0] | [4] | [2] | [12] |

| MC10 | MC11 | MC12 | MC13 |
|---|---|---|---|
| (3) | (7) | (11) | (15) |

| MC20 | MC21 | MC22 | MC23 |
|---|---|---|---|
| [1] | [5] | [9] | [13] |

| MC30 | MC31 | MC32 | MC33 |
|---|---|---|---|
| (2) | (6) | (10) | (14) |

FIG. 23A

| T | AD # | A3 | A2 | A1 | A0 | BL # | WL # | MC # |
|---|---|---|---|---|---|---|---|---|
| 0 | AD0 | 0 | 0 | 0 | 0 | RBL0 | RWL0 | MC00 |
| 1 | AD1 | 0 | 0 | 0 | 1 | RBL1 | RWL0 | MC10 |
| 2 | AD2 | 0 | 1 | 0 | 0 | RBL0 | RWL1 | MC01 |
| 3 | AD3 | 0 | 1 | 0 | 1 | RBL1 | RWL1 | MC11 |
| 4 | AD4 | 1 | 0 | 0 | 0 | RBL0 | RWL2 | MC02 |
| 5 | AD5 | 1 | 0 | 0 | 1 | RBL1 | RWL2 | MC12 |
| 6 | AD6 | 1 | 1 | 0 | 0 | RBL0 | RWL3 | MC03 |
| 7 | AD7 | 1 | 1 | 0 | 1 | RBL1 | RWL3 | MC13 |
| 8 | AD8 | 0 | 0 | 1 | 0 | RBL2 | RWL0 | MC20 |
| 9 | AD9 | 0 | 0 | 1 | 1 | RBL3 | RWL0 | MC30 |
| 10 | AD10 | 0 | 1 | 1 | 0 | RBL2 | RWL1 | MC21 |
| 11 | AD11 | 0 | 1 | 1 | 1 | RBL3 | RWL1 | MC31 |
| 12 | AD12 | 1 | 0 | 1 | 0 | RBL2 | RWL2 | MC22 |
| 13 | AD13 | 1 | 0 | 1 | 1 | RBL3 | RWL2 | MC32 |
| 14 | AD14 | 1 | 1 | 1 | 0 | RBL2 | RWL3 | MC23 |
| 15 | AD15 | 1 | 1 | 1 | 1 | RBL3 | RWL3 | MC33 |

FIG. 23B

| MC00 | MC01 | MC02 | MC03 |
|---|---|---|---|
| [0] | [2] | [4] | [6] |

| MC10 | MC11 | MC12 | MC13 |
|---|---|---|---|
| (1) | (3) | (5) | (7) |

| MC20 | MC21 | MC22 | MC23 |
|---|---|---|---|
| [8] | [10] | [12] | [14] |

| MC30 | MC31 | MC32 | MC33 |
|---|---|---|---|
| (9) | (11) | (13) | (15) |

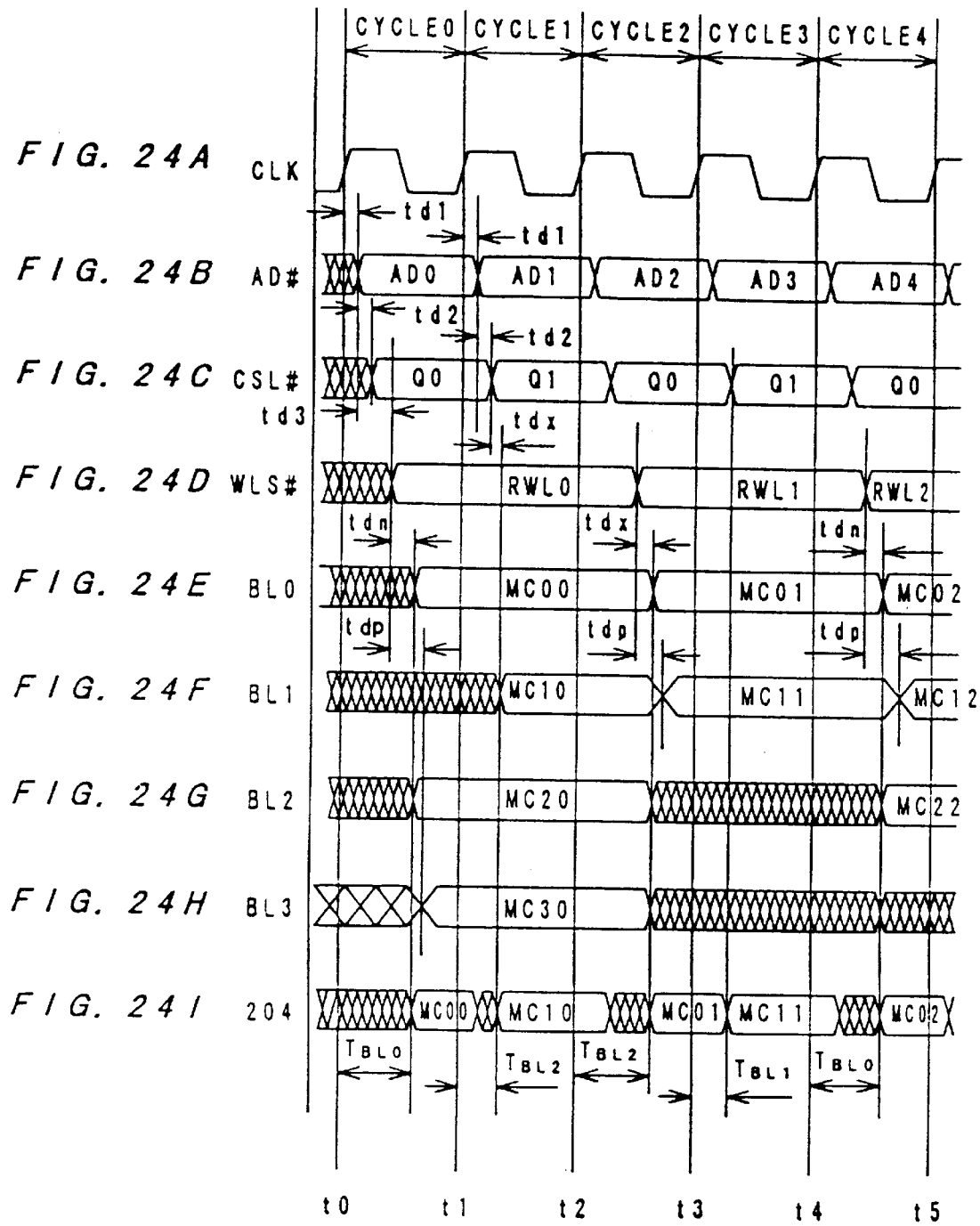

F I G. 2 5
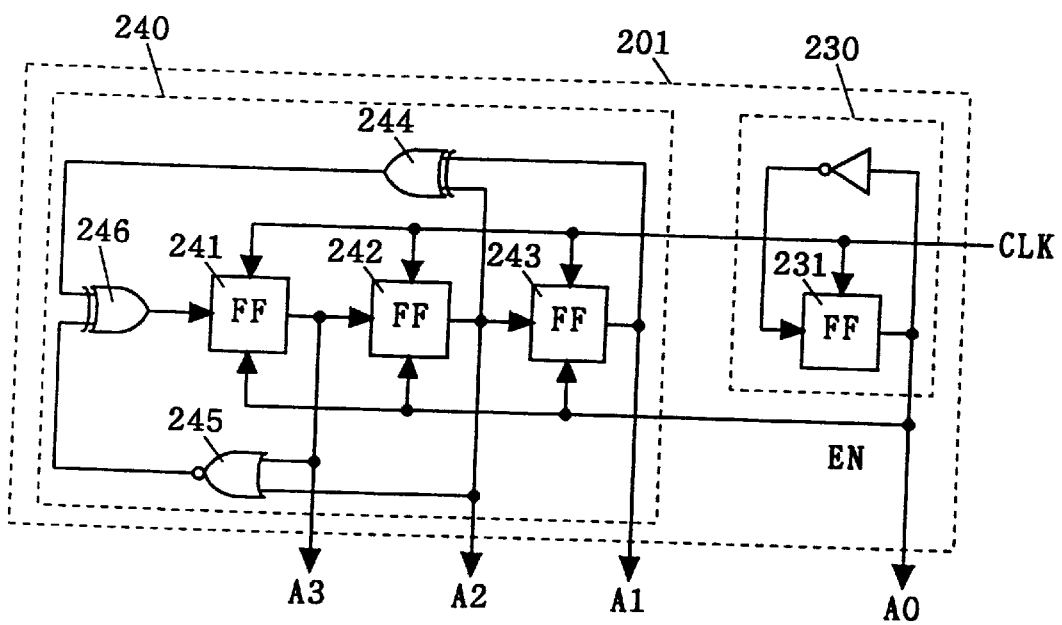

| T | AD # | A3 | A2 | A1 | A0 | BL # | WL # | MC # |
|---|------|----|----|----|----|------|------|------|
| 0 | AD0 | 0 | 0 | 0 | 0 | RBL0 | RWL0 | MC00 |
| 1 | AD1 | 0 | 0 | 0 | 1 | RBL1 | RWL0 | MC10 |
| 2 | AD2 | 1 | 0 | 0 | 0 | RBL0 | RWL2 | MC02 |
| 3 | AD3 | 1 | 0 | 0 | 1 | RBL1 | RWL2 | MC12 |
| 4 | AD4 | 0 | 1 | 0 | 0 | RBL0 | RWL1 | MC01 |
| 5 | AD5 | 0 | 1 | 0 | 1 | RBL1 | RWL1 | MC11 |
| 6 | AD6 | 1 | 0 | 1 | 0 | RBL2 | RWL2 | MC22 |
| 7 | AD7 | 1 | 0 | 1 | 1 | RBL3 | RWL2 | MC32 |
| 8 | AD8 | 1 | 1 | 0 | 0 | RBL0 | RWL3 | MC03 |
| 9 | AD9 | 1 | 1 | 0 | 1 | RBL1 | RWL3 | MC13 |
| 10 | AD10 | 1 | 1 | 1 | 0 | RBL2 | RWL3 | MC23 |
| 11 | AD11 | 1 | 1 | 1 | 1 | RBL3 | RWL3 | MC33 |
| 12 | AD12 | 0 | 1 | 1 | 0 | RBL2 | RWL1 | MC21 |
| 13 | AD13 | 0 | 1 | 1 | 1 | RBL3 | RWL1 | MC31 |
| 14 | AD14 | 0 | 0 | 1 | 0 | RBL2 | RWL0 | MC20 |
| 15 | AD15 | 0 | 0 | 1 | 1 | RBL3 | RWL0 | MC30 |

FIG. 28A

| T | RWL0 | RWL1 | RWL2 | RWL3 | A1 | A0 | BL # | MC # |
|---|---|---|---|---|---|---|---|---|
| 0 | 1 | 0 | 0 | 0 | 0 | 0 | RBL0 | MC00 |
| 1 | 1 | 0 | 0 | 0 | 0 | 1 | RBL1 | MC10 |
| 2 | 0 | 1 | 0 | 0 | 0 | 0 | RBL0 | MC01 |
| 3 | 0 | 1 | 0 | 0 | 0 | 1 | RBL1 | MC11 |
| 4 | 0 | 0 | 1 | 0 | 0 | 0 | RBL0 | MC02 |
| 5 | 0 | 0 | 1 | 0 | 0 | 1 | RBL1 | MC12 |
| 6 | 0 | 0 | 0 | 1 | 0 | 0 | RBL0 | MC03 |
| 7 | 0 | 0 | 0 | 1 | 0 | 1 | RBL1 | MC13 |
| 8 | 1 | 0 | 0 | 0 | 1 | 0 | RBL2 | MC20 |
| 9 | 1 | 0 | 0 | 0 | 1 | 1 | RBL3 | MC30 |
| 10 | 0 | 1 | 0 | 0 | 1 | 0 | RBL2 | MC21 |
| 11 | 0 | 1 | 0 | 0 | 1 | 1 | RBL3 | MC31 |
| 12 | 0 | 0 | 1 | 0 | 1 | 0 | RBL2 | MC22 |
| 13 | 0 | 0 | 1 | 0 | 1 | 1 | RBL3 | MC23 |
| 14 | 0 | 0 | 0 | 1 | 1 | 0 | RBL2 | MC32 |
| 15 | 0 | 0 | 0 | 1 | 1 | 1 | RBL3 | MC33 |

FIG. 28B

| MC00 | MC01 | MC02 | MC03 |
|---|---|---|---|
| □ 0 | □ 2 | □ 4 | □ 6 |

| MC10 | MC11 | MC12 | MC13 |
|---|---|---|---|
| ○ 1 | ○ 3 | ○ 5 | ○ 7 |

| MC20 | MC21 | MC22 | MC23 |
|---|---|---|---|
| □ 8 | □ 10 | □ 12 | □ 14 |

| MC30 | MC31 | MC32 | MC33 |
|---|---|---|---|
| ○ 9 | ○ 11 | ○ 13 | ○ 15 |

SEMICONDUCTOR MEMORY DEVICE AND METHOD OF READING DATA THEREFROM

BACKGROUND OF THE INVENTION

1. Field of the Invention

The present invention relates to a semiconductor memory device including a plurality of memory cells, and more particularly to a semiconductor memory device capable of performing a faster read of data from the memory cells which are accessed in a predetermined order and a method of reading data therefrom.

2. Description of the Background Art

Until now, various types of semiconductor memory devices including a plurality of memory cells have been proposed, such as ROM (Read Only Memory), dynamic memory, static memory and FIFO (First-In First-Out) memory. For example, FIG. 33A to 33C each illustrate a circuit configuration of a background-art semiconductor memory device including a plurality of memory cells arranged in a matrix with 4 columns and 4 rows, which is a ROM circuit disclosed in Japanese Patent Examined Gazette 7-83062. Configuration and operation of the circuit will be discussed below.

A memory cell array shown in FIG. 33A includes a plurality of memory cells which are classified into two types: memory cells MCN each including an n-channel field effect transistor (referred to as "nMOS transistor" hereinafter) and memory cells MCP each including a p-channel field effect transistor (referred to as "pMOS transistor" hereinafter). In each row, particularly, the memory cells MCN and memory cells MCP are alternately arranged. Word lines WL0 to WL3 are provided correspondingly to rows of the memory cells and bit lines BL0 to BL3 are provided correspondingly to columns of the memory cells. Each of the word lines WL0 to WL3 is separated into a word line WLN and a word line WLP through an inverter 2. The memory cell MCN is connected to the word line WLN and a memory cell MCP is connected to a word line WLP. As shown in FIG. 33B, the memory cell MCN has an nMOS transistor N0 to be accessed which is connected between a storage node in the memory cell MCN and a corresponding bit line and of which the gate terminal is connected to a corresponding word line WLN. As shown in FIG. 33C, the memory cell MCP has a pMOS transistor P0 to be accessed which is connected between a storage node in the memory cell MCP and a corresponding bit line and of which the gate terminal is connected to a corresponding word line WLP. An address decoder 1 selects one of the word lines WL0 to WL3.

When the address decoder 1 selects the word line WL0, for example, the word line WL0 is activated and charged to a high-level voltage. The word line WLN connected to the word line WL0 is supplied with the high-level voltage without logical change and the respective nMOS transistors N0 in the two memory cells MCN connected to the word line WLN become conducting. On the other hand, the word line WLP is supplied with a low-level voltage through the inverter 2 and the respective pMOS transistors P0 in the two memory cells MCP connected to the word line WLP become conducting. Thus, respective information stored in the two memory cells MCN and two memory cells MCP are read out into the corresponding bit lines BL0, BL2, BL1 and BL3.

Further, when data are read out from one of the memory cells connected to the word line WL0, a selector 3 selects one of the bit lines BL0 to BL3 to read data therefrom into the a data line 4.

If the semiconductor memory device including a plurality of memory cells is used as a storing ROM for program in a microcomputer, a storing ROM for character fonts to be displayed on a screen or the like, the memory cells have to be accessed always in a given order. If the semiconductor memory device is used as an FIFO memory for data transmission and the like between devices of different processing speeds, the memory cells have to be accessed in the order as data have been written. With the configuration of memory cell array shown in FIG. 33A, a semiconductor device, which needs to be controlled so that more than one memory cell may be accessed in a predetermined order as above, has a problem as below.

In the configuration of memory cell array shown in FIG. 33A, the memory cell MCN including the nMOS transistor N0 and the memory cell MCP including the pMOS transistor P0 are different from each other in electrical characteristics. It is generally known that the nMOS transistor is superior to the pMOS transistor in carrier mobility. Given this, in FIG. 33A, it takes longer to read data from the memory cell MCP than from the memory cell MCN into the bit line after almost simultaneous conduction of the nMOS transistor N0 and the pMOS transistor P0 with activation of the word lines WLN and WLP. The time period from activation of the word line to output of the data to the data line 4 depends on which of the memory cells MCN and MCP is first accessed after activation of the selected word line. In a sequential access to the memory cells in the predetermined order to read the stored data thereof, if the memory cell MCP is first accessed even once after activation of the selected word line, it is needed to lower a clock frequency for read operation of the semiconductor device so that the next data should not be read out until the data from the memory cell MCP are certainly outputted in the data line 4 for an output of correct data. As a result, the speed of reading data from the semiconductor device is markedly degraded. Furthermore, a processing of the data which are outputted from the data line 4 by a data processing circuit not shown is also delayed.

SUMMARY OF THE INVENTION

The present invention is directed to a semiconductor memory device. According to the present invention, the semiconductor memory device comprises: a plurality of memory cells arranged in a matrix, each including a data storage for storing data; a plurality of word lines provided correspondingly to rows of the plurality of memory cells; a plurality of bit lines provided correspondingly to columns of the plurality of memory cells; access control means for generating and outputting a first control signal and a second control signal for an access to each of the plurality of memory cells; word-line selection means for selecting one of the plurality of word lines in response to the first control signal outputted from the access control means to activate a selected word line; and bit-line selection means for selecting one of the plurality of bit lines in response to the second control signal outputted from the access control means to read data from a selected bit line. In the semiconductor memory device of the present invention, the plurality of memory cells comprise first type of memory cells each having at least one first field effect transistor connected between the data storage included therein and a corresponding bit line and second type of memory cells each having at least one second field effect transistor connected between the data storage included therein and a corresponding bit line, and the access control means generates the first and second control signals so that a bit line corresponding to one of the first type of memory cells which is connected to the selected word line is first selected by the bit-line selection means after activation of the selected word line every time selection of word line is made by the word-line selection means in a sequential read of data from the plurality of memory cells.

The present invention is also directed to a method of reading data from a semiconductor memory device. According to the present invention, the method is used for reading data from a semiconductor memory device which comprises a plurality of memory cells arranged in a matrix, each including a data storage for storing data; a plurality of word lines provided correspondingly to rows of the plurality of memory cells; a plurality of bit lines provided correspondingly to columns of the plurality of memory cells; word-line selection means for selecting one of the plurality of word lines to activate a selected word line; and bit-line selection means for selecting one of the plurality of bit lines to read data from a selected bit line and in which the plurality of memory cells include first type of memory cells each having at least one first field effect transistor connected between the data storage included therein and a corresponding bit line and second type of memory cells each having at least one second field effect transistor connected between the data storage included therein and a corresponding bit line. The method of the present invention comprises the step of first reading data stored in one of the first type of memory cells which is connected to the selected word line by the bit-line selection means after activation of the selected word line every time selection of word line is made by the word-line selection means in a sequential read of data from the plurality of memory cells.

In accordance with the semiconductor memory device of the present invention, if the conduction of the first field effect transistor is made faster than that of the second field effect transistor, data are read out first from the memory cell having the first field effect transistor corresponding to the selected word line, ensuring a read operation at higher speed.

Further, since the bit line corresponding to one of the first type memory cells which is connected to the selected word line is first selected after activation of the selected word line and bit lines corresponding to the second type memory cells which are connected to the selected word line are selected by end of the activation of the selected word line, the data stored in the first and second types of memory cells can be read out at higher speed, without being affected by the slow conduction of the second field effect transistor, when the memory cells corresponding to the selected word line are accessed.

In the semiconductor memory device of the present invention, one of the pair of word lines is connected to a control terminal of one of the at least one n-channel field effect transistor in each of the first type of memory cells and the other of the pair of word lines is connected to a control terminal of one of the at least one p-channel field effect transistor in each of the second type of memory cells. Since the bit line corresponding to one of first type of memory cells which is connected to the selected pair of word lines is first selected after the activation of the selected pair of word lines every time selection of pair of word lines is made, a sequential read of data from a plurality of memory cells including the first and second types of memory cells can be performed at higher speed because the conduction of the n-channel field effect transistor is made faster than that of the p-channel field effect transistor.

Further, since the bit line corresponding to one of the first type of memory cells which is connected to the selected word line is first selected after the activation of the selected word line every time selection of word line is made, a sequential read of data from a plurality of memory cells can be performed at higher speed, even in the arrangement where the first type of memory cells having the n-channel field effect transistor and the second type of memory cells having the p-channel field effect transistor are mixed, because the conduction of the n-channel field effect transistor is made faster than that of the p-channel field effect transistor.

In the semiconductor memory device of the present invention, since the conduction of the first field effect transistor having a larger gate width is made faster than that of the second field effect transistor, a read operation of data from a plurality of memory cells can be performed at higher speed.

In the semiconductor memory device of the present invention, since bit lines corresponding to all memory cells which are connected to the selected pair of word lines are sequentially selected by the bit-line selection means by the end of activation of the selected pair of word lines every time selection of pair of word lines is made, the number of changes of the pair of word lines is reduced to a minimum, and accordingly, for example, power consumption due to the change of lines is suppressed to a minimum.

In the semiconductor memory device of the present invention, the shift operation of the shift register is controlled according to the first control signal outputted from the access control means, and therefore a plurality of bit lines are sequentially activated in response to the shift operation of the shift register. Furthermore, the access control means has only to generate a 1-bit signal indicating enable/disable and its configuration to generate the first control signal may be simpler.

In accordance with the method of reading data of the present invention, the data stored in one of the first type of memory cells which is connected to the selected word line is first read out by the bit-line selection means after activation of the selected word line every time selection of word line is made by the word-line selection means in the semiconductor memory device where one of the pair of word lines is connected to a control terminal of one of the at least one first field effect transistor in each of the first type of memory cells and the other of the pair of word lines is connected to a control terminal of one of the at least one second field effect transistor in each of the second type of memory cells and further the pair of word lines included in the selected word line are both activated when selected. Therefore, if the conduction of the first field effect transistor is made faster than that of the second field effect transistor, data are read out first from the memory cell having the first field effect transistor corresponding to the selected word line, ensuring a read operation at higher speed.

Further, since the conduction of the n-channel field effect transistor is made faster than that of the p-channel field effect transistor, a sequential read of data from a plurality of memory cells including the first and second types of memory cells can be performed at higher speed.

Furthermore, even in the arrangement where the first type of memory cells having n-channel field effect transistors and the second type of memory cells having p-channel field effect transistors are mixed, a sequential read of data from the memory cells can be performed at higher speed because the conduction of the n-channel field effect transistor is made faster than that of the p-channel field effect transistor.

In accordance with the method of the present invention, a sequential read of data from the memory cells can be performed at higher speed because the conduction of the first field effect transistor having a larger gate width is made faster than that of the second field effect transistor.

An object of the present invention is to provide an accessing order of the memory cells to enable a faster read operation of data stored in a plurality of memory cells in the semiconductor memory device.

Particularly in a sequential read of the stored data from a plurality of memory cells, the object of the present invention is to provide a semiconductor memory device which is capable of performing a read operation of data in a shorter time and a method of reading data therefrom.

Furthermore, in the semiconductor memory device of the present invention, an array including a plurality of memory cells has a configuration of CMOS transistors or other array configuration.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 7A and 7B are charts showing an accessing order of the memory cells in the FIFO memory in accordance with the first preferred embodiment of the present invention;

FIGS. 8A to 8I are timing charts showing an operation of reading data from the FIFO memory in accordance with the first preferred embodiment of the present invention;

FIG. 10 is a truth table showing an operation of a column decoder in the writing bit-line selector in accordance with the first preferred embodiment of the present invention;

FIG. 11 is a truth table showing an operation of a row decoder in the FIFO memory in accordance with the first preferred embodiment of the present invention;

FIGS. 12A to 12M are timing charts showing an operation of writing data into the FIFO memory in accordance with the first preferred embodiment of the present invention;

FIGS. 14A to 14E are timing charts showing an operation of the access control circuit in accordance with a second preferred embodiment of the present invention;

FIGS. 15A and 15B are charts showing an accessing order of the memory cells in the FIFO memory in accordance with the second preferred embodiment of the present invention;

FIGS. 17A and 17B are charts showing an accessing order of the memory cells in the FIFO memory in accordance with the third preferred embodiment of the present invention;

FIGS. 19A and 19B are charts showing an accessing order of the memory cells in the FIFO memory in accordance with the fourth preferred embodiment of the present invention;

FIGS. 23A and 23B are charts showing an accessing order of the memory cells in the ROM circuit in accordance with the sixth preferred embodiment of the present invention;

FIGS. 24A to 24I are timing charts showing an operation of reading data from the ROM circuit in accordance with the sixth preferred embodiment of the present invention;

FIG. 25 is a circuit diagram showing an access control circuit in a ROM circuit in accordance with a seventh preferred embodiment of the present invention;

FIGS. 28A and 28B are charts showing an accessing order of the memory cells in the ROM circuit in accordance with the eighth preferred embodiment of the present invention;

DESCRIPTION OF THE PREFERRED EMBODIMENTS

<A. The First Preferred Embodiment>

<A-1. Overall Device Configuration>

Figure 1:
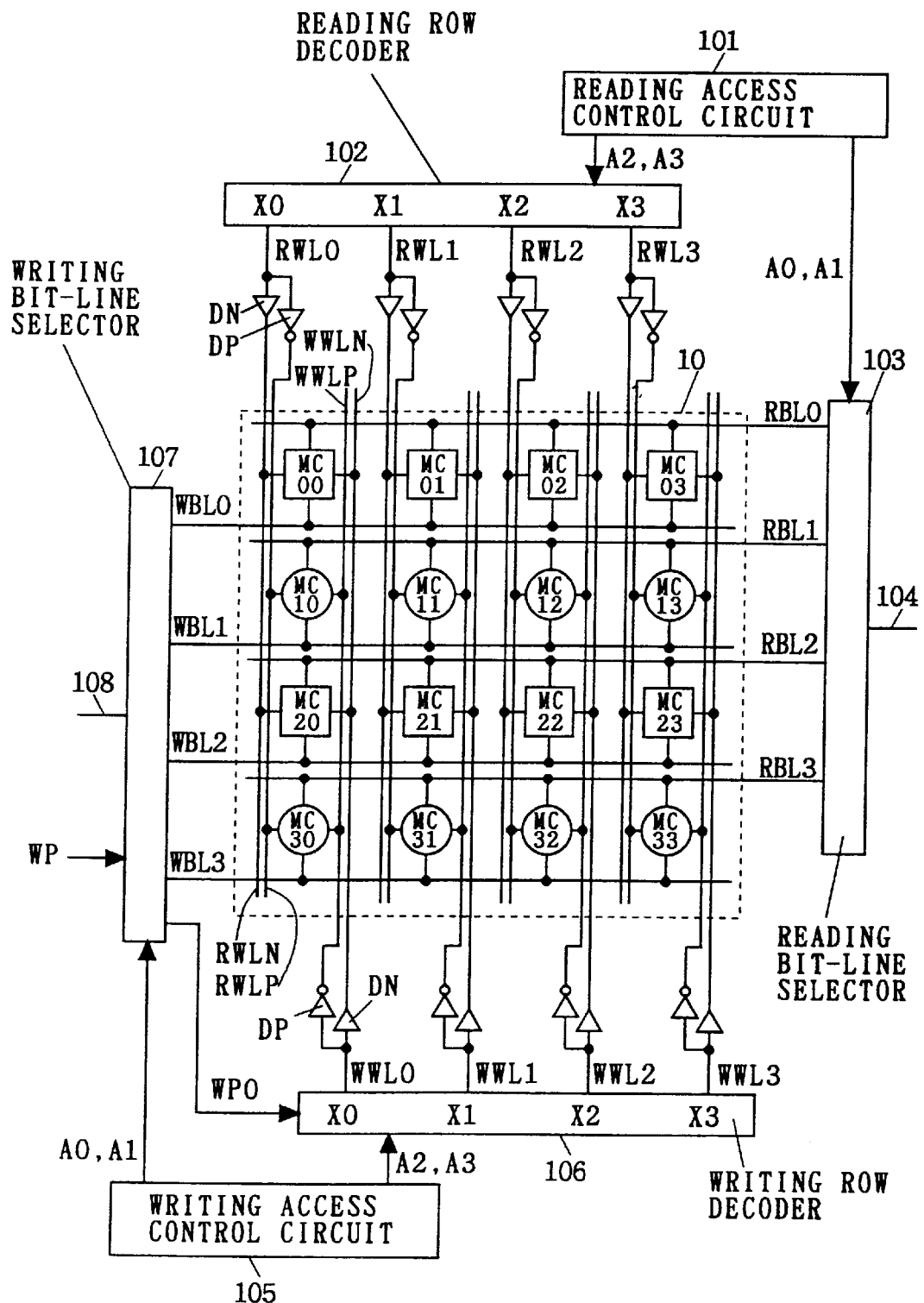
FIG. 1 is a circuit diagram showing a configuration of a semiconductor memory device, particularly an FIFO memory, in accordance with a first preferred embodiment of the present invention.

FIG. 1 is a circuit diagram showing a configuration of a semiconductor memory device, particularly an FIFO memory including a plurality of memory cells, from which stored data are read out in the order as written, in accordance with the first preferred embodiment of the present invention. The FIFO memory includes a memory cell array 10, a reading access control circuit 101, a reading row decoder 102, a reading bit-line selector 103, a writing access control circuit 105, a writing row decoder 106 and a writing bit-line selector 107.

The memory cell 10 of FIG. 1 includes memory cells MC00 to MC03, MC10 to MC13, MC20 to MC23 and MC30 to MC33 which are arranged in a matrix. Reading bit lines RBL0 to RBL3 are provided correspondingly to columns of the memory cells and reading word lines RWL0 to RWL3 are provided correspondingly to rows of the memory cells. Similarly, writing bit lines WBL0 to WBL3 are provided correspondingly to the columns of memory cells and the writing word lines WWL0 to WWL3 are provided correspondingly to the rows of the memory cells.

Each of the reading word lines RWL0 to RWL3 is separated into a word line RWLN through a driver DN and a word line RWLP through a driver DP. The word lines RWLN and RWLP constitute a pair of word lines. Each of the writing word lines WWL0 to WWL3 is separated into a word line WWLN through the driver DN and a word line WWLP through the driver DP. The word lines WWLN and WWLP constitute a pair of word lines. The driver DN consists of two inverters connected in series to each other, and supplies the word line RWLN with a voltage of the logic of a selection signal to be inputted. The driver DP is made of one inverter and supplies the word line RWLP with a voltage opposite in logic to the selection signal to be inputted.

The memory cells MC00 to MC03 are connected to the reading bit line RBL0 and the writing bit line WBL0. The memory cells MC10 to MC13 are connected to the reading bit line RBL1 and the writing bit line WBL1. The memory cells MC20 to MC23 are connected to the reading bit line RBL2 and the writing bit line WBL2. The memory cells MC30 to MC33 are connected to the reading bit line RBL3 and the writing bit line WBL3. On the other hand, the memory cells MC00 and MC20 are connected to the word line RWLN separated from the reading word line RWL0 and the word line WWLN separated from the writing word line WWL0. The memory cells MC10 and MC30 are connected to the word line RWLP separated from the reading word line RWL0 and the word line WWLP separated from the writing word line WWL0. The memory cells MC01 and MC21 are connected to the word line RWLN separated from the reading word line RWL1 and the word line WWLN separated from the writing word line WWL1. The memory cells MC11 and MC31 are connected to the word line RWLP separated from the reading word line RWL1 and the word line WWLP separated from the writing word line WWL1. The memory cells MC02 and MC22 are connected to the word line RWLN separated from the reading word line RWL2 and the word line WWLN separated from the writing word line WWL2. The memory cells MC12 and MC32 are connected to the word line RWLP separated from the reading word line RWL2 and the word line WWLP separated from the writing word line WWL2. The memory cells MC03 and MC23 are connected to the word line RWLN separated from the reading word line RWL3 and the word line WWLN separated from the writing word line WWL3. The memory cells MC13 and MC33 are connected to the word line RWLP separated from the reading word line RWL3 and the word line WWLP separated from the writing word line WWL3.

The reading access control circuit 101 generates a row address and a column address serving as the first and second control signals respectively used for an access to the memory cell to read stored data therefrom. The reading row decoder 102 decodes the row address outputted from the reading access control circuit 101 to select one of the reading word lines RWL0 to RWL3 and outputs the selection signal to activate the selected word line. The reading bit-line selector 103 decodes the column address outputted from the reading access control circuit 101 to select one of the reading bit lines RBL0 to RBL3 and reads data from the selected bit line into a reading data line 104.

On the other hand, the writing access control circuit 105 generates a row address and a column address serving as the first and second control signals respectively used for an access to the memory cell to write data therein. The writing row decoder 106 decodes the row address outputted from the writing access control circuit 105 to select one of the writing word lines WWL0 to WWL3 and outputs the selection signal to activate the selected word line. The writing bit-line selector 107 decodes the column address outputted from the writing access control circuit 105 to select one of the writing bit lines WBL0 to WBL3 and inputs data to the selected bit line from a writing data line 108. A signal WP applied to the writing bit-line selector 107 and a signal WP0 applied to the row decoder 106 from the writing bit-line selector 107 will be described later.

In FIG. 1 shown is the memory cell array configuration including a plurality of memory cells arranged in a matrix with 4 columns and 4 rows, for convenience of illustration, but an array may include more memory cells. Hereinafter, a plurality of memory cells arranged in a matrix with m columns and n rows (m<n) will be discussed.

<A-2. Configuration of Memory Cell>

Figure 2A:
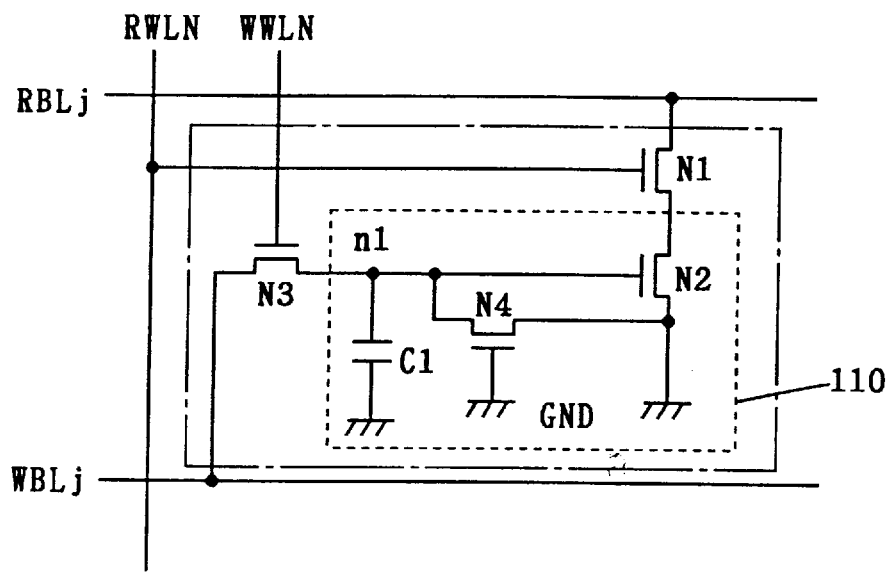
FIGS. 2A and 2B are circuit diagrams each showing a configuration of a memory cell in the FIFO memory in accordance with the first preferred embodiment of the present invention.
Figure 2B:
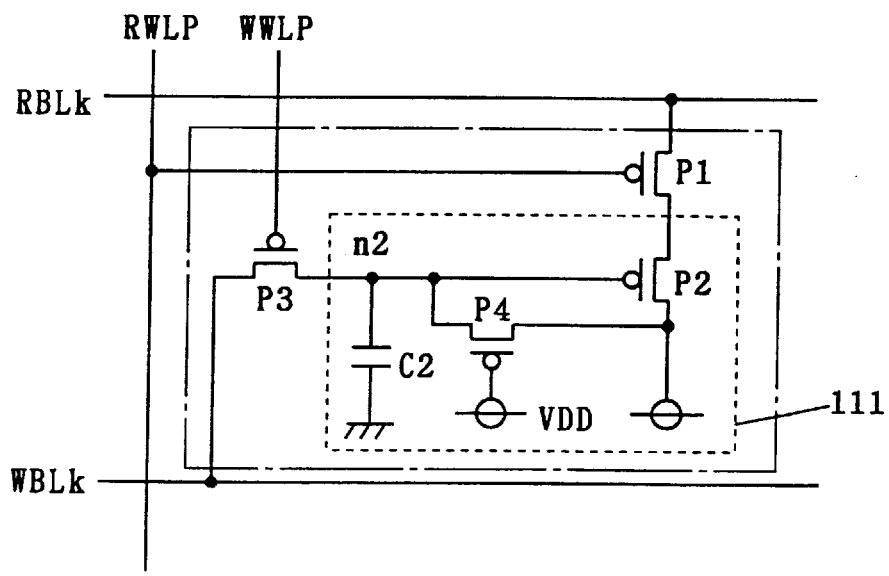

FIGS. 2A and 2B are circuit diagrams each showing a configuration of the memory cell. Each of the memory cells MC00 to MC03 and MC20 to MC23 consists of only n-channel field effect transistors (nMOS transistors). These memory cells are termed n-type memory cells. The memory cells MC00 to MC03 and MC20 to MC23 have the same configuration as shown in FIG. 2A. In FIG. 2A, a region surrounded by one-dot chain line is referred to as a memory cell.

On the other hand, each of the memory cells MC10 to MC13 and MC30 to MC33 consists of only p-channel field effect transistors (pMOS transistors). These memory cells are termed p-type memory cells. The memory cells MC10 to MC13 and MC30 to MC33 have the same configuration as shown in FIG. 2B. In FIG. 2B, a region surrounded by one-dot chain line is referred to as a memory cell. Those shown in FIGS. 2A and 2B are dynamic memory cells.

The n-type memory cell of FIG. 2A includes a data storage 110 and nMOS transistors N1 and N3. The nMOS transistor N1, which has the first electrode connected to the reading bit line RBLj(j=0, 2), the second electrode connected to the data storage 110 and a gate electrode connected to the word line RWLN separated from the corresponding reading word line, serves as a reading access transistor used for reading stored data from the data storage 110 into the reading word line. The nMOS transistor N3, which has the first electrode connected to the writing bit line WBLj, the second electrode connected to the data storage 110 and a gate electrode connected to the word line WWLN separated from the corresponding writing word line, serves as a writing access transistor used for writing data into the data storage 110 from the writing bit line.

The data storage 110 includes nMOS transistors N2 and N4 and a capacitor C1 connected to a node n1 serving as a storage node. The nMOS transistor N2 has the first electrode connected to the second electrode of the nMOS transistor N1, the second electrode connected to a ground terminal (where a ground voltage GND is 0V) and a gate electrode connected to the second electrode of the nMOS transistor N3 at the node n1. The nMOS transistor N4 has the first electrode connected to the node n1, the second electrode and a gate electrode which are connected in common to the ground terminal.

The capacitor C1 is provided as necessary, and accordingly it is not particularly necessary to provide any capacitor if the total of the capacitance between the second electrode and the gate electrode in the nMOS transistor N3, the gate capacitance of the nMOS transistor N2, the capacitance between the first electrode and the gate electrode and that between the second electrode and the gate electrode in the nMOS transistor N2 and the capacitance between the first electrode and the gate electrode comes to a predetermined capacitance.

The p-type memory cell of FIG. 2B includes a data storage 111 and pMOS transistors P1 and P3. The pMOS transistor P1, which has the first electrode connected to the reading bit line RBLk (k=1, 3), the second electrode connected to the data storage 111 and a gate electrode connected to the word line RWLP separated from the corresponding reading word line, serves as a reading access transistor used for reading stored data from the data storage 111 into the reading word line. The pMOS transistor P3, which has the first electrode connected to the writing bit line WBLk, the second electrode connected to the data storage 111 and a gate electrode connected to the word line WWLP separated from the corresponding writing word line, serves as a writing access transistor used for writing data into the data storage 111 from the writing bit line.

The data storage 111 includes pMOS transistors P2 and P4 and a capacitor C2 connected to a node n2 serving as a storage node. The pMOS transistor P2 has the first electrode connected to the second electrode of the pMOS transistor P1, the second electrode connected to a power supply terminal (where a power supply voltage VDD is specifically 3.3V) and a gate electrode connected to the second electrode of the pMOS transistor P3 at the node n2. The pMOS transistor P4 has the first electrode connected to the node n2, the second electrode and a gate electrode which are connected in common to the power supply terminal. Like the capacitor C1, the capacitor C2 is provided as necessary.

<A-3. Operation of Memory Cell>

Now, read and write operations of the memory cells will be discussed below.

In writing data into the n-type memory cell of FIG. 2A, the word line WWLN is charged to high level ("H") while the word line RWLN remains low level ("L"), and then the nMOS transistor N3 becomes conducting and the nMOS transistor N1 becomes non-conducting. The potential at the node n1 is determined according to the potential of the data to be inputted from the writing bit line WBLj through the nMOS transistor N3. After that, with the word line WWLN brought into "L", the nMOS transistor N3 becomes non-conducting. The data transmitted from the writing bit line WBLj is stored in the node n1 as the potential of "H" or "L".

On the other hand, in reading data from the n-type memory cell of FIG. 2A, the word line RWLN is charged to "H" while the word line WWLN remains "L", and then the nMOS transistor N1 becomes conducting and the nMOS transistor N3 becomes non-conducting. If the potential at the node n1 is "H", the nMOS transistor N2 becomes conducting and the potential at the reading bit line RBLj is brought into the ground potential GND. As a result, the data of "L" are read out into the reading bit line RBLj. If the potential at the node n1 is "L", the nMOS transistor N2 is not conducting and the reading bit line RBLj is electrically separated from the ground terminal. As a result, it is judged that the reading bit line RBLj should be precharged to "H", and the data of "H" are read out into the reading bit line RBLj.

In writing data into the p-type memory cell of FIG. 2B, the word line WWLP is brought into "L" while the word line RWLP remains charged to "H" and then the pMOS transistor P3 becomes conducting and the pMOS transistor P1 becomes non-conducting. The potential at the node n2 is determined according to the potential of the data to be inputted from the writing bit line WBLk through the pMOS transistor P3. After that, with the word line WWLP charged to "H", the pMOS transistor P3 becomes non-conducting. The data transmitted from the writing bit line WBLk is stored in the node n2 as the potential of "H" or "L".

On the other hand, in reading data from the p-type memory cell of FIG. 2A, the word line RWLP is brought into "L" while the word line WWLP remains charged to "H", and then the pMOS transistor P1 becomes conducting and the pMOS transistor P3 becomes non-conducting. If the potential at the node n2 is "L", the pMOS transistor P2 becomes conducting and the potential at the reading bit line RBLk is brought into the power supply potential VDD. As a result, the data of "H" are read out into the reading bit line RBLk. If the potential at the node n2 is "H", the pMOS transistor P2 is not conducting and the reading bit line RBLk is electrically separated from the power supply terminal. As a result, it is judged that the reading bit line RBLk should be precharged to "L", and the data of "L" are read out into the reading bit line RBLk.

The nMOS transistors N1 to N4 in the n-type memory cell of FIG. 2A and the pMOS transistors P1 to P4 in the p-type memory cell of FIG. 2B have the same transistor size, i.e., the same gate length and gate width. The memory cell array 10 including the n-type memory cells and the p-type memory cells has a gate array configuration of CMOS transistors, the detailed layout of which is disclosed in Japanese Patent Application No. 7-157908 (see FIG. 5, for example).

As revealed in the Japanese Patent Application No. 7-157908, the nMOS transistor N4 of FIG. 2A is provided to electrically isolate a source-drain region serving as the second electrode of the nMOS transistor N3 from a source-drain region serving as the second electrode of the nMOS transistor N2. Similarly, the pMOS transistor P4 of FIG. 2B is provided to electrically isolate a source-drain region serving as the second electrode of the pMOS transistor P3 from a source-drain region serving as the second electrode of the pMOS transistor P2. Therefore, there is no need for additionally providing any oxide film on a chip to isolate the source-drain regions. That allows an enhancement in circuit integration. If the circuit integration is out of consideration, it is not necessary to provide the nMOS transistor N4 or the pMOS transistor P4.

<A-4. Configuration for Reading Data>

Next, specific configuration and operation for reading data from the FIFO memory of FIG. 1 will be discussed.

Figure 3:
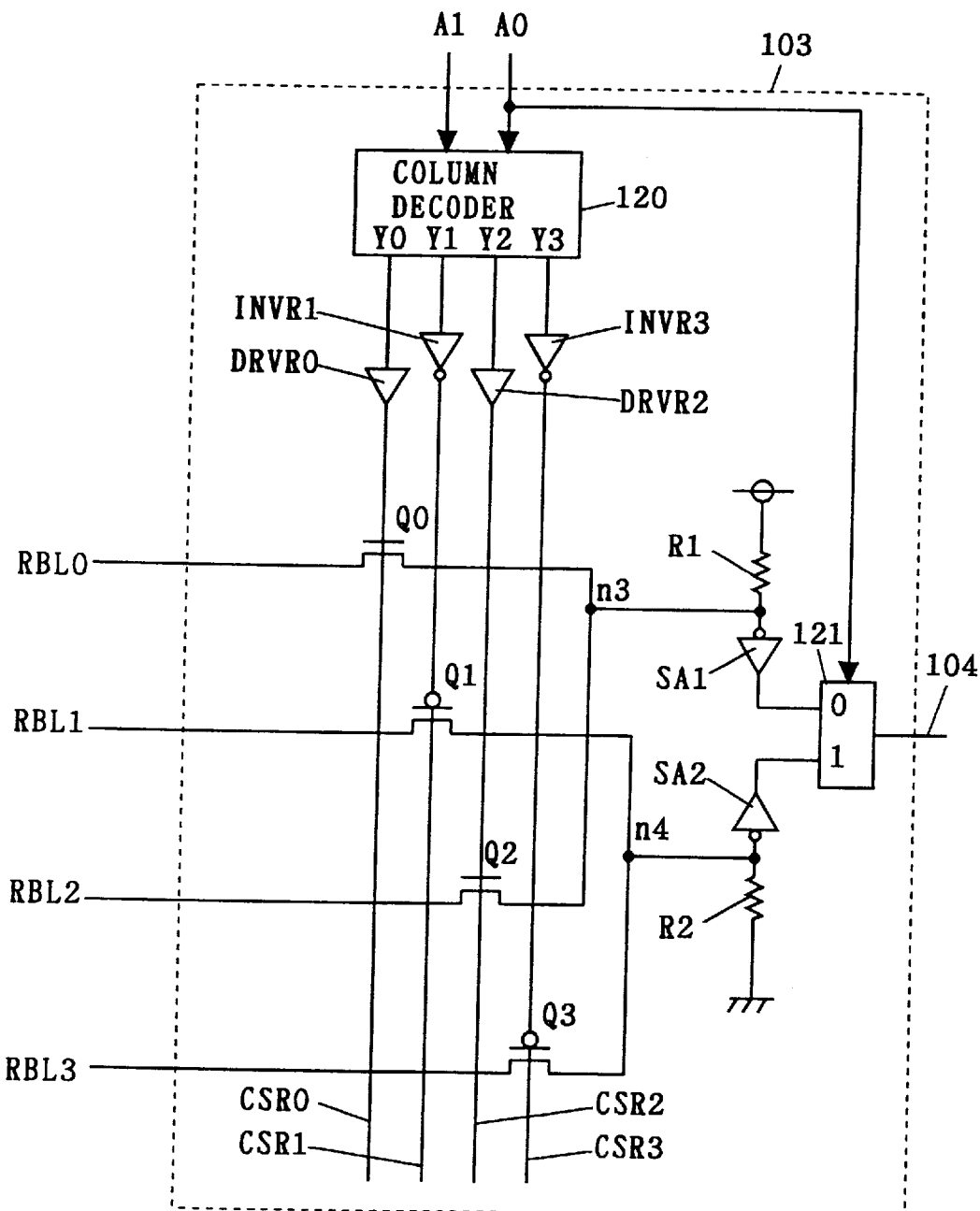
FIG. 3 is a circuit diagram showing a reading bit-line selector in the FIFO memory in accordance with the first preferred embodiment of the present invention.

FIG. 3 is a circuit diagram showing the reading bit-line selector 103. The reading bit-line selector 103 includes a column decoder 120 for decoding a column-address signal of two bits (A0, A1) generated by the reading access control circuit 101 into a selection signal of four bits (Y0 to Y3), an nMOS transistor Q0 connected between the reading bit line RBL0 and a node n3, a pMOS transistor Q1 connected between the reading bit line RBL1 and a node n4, an nMOS transistor Q2 connected between the reading bit line RBL2 and the node n3, a pMOS transistor Q3 connected between the reading bit line RBL3 and the node n4, a sense amplifier SA1 made of an inverter whose input is connected to the node n3, for inverting a logic of inputted signal for sense-amplification, a sense amplifier SA2 made of an inverter whose input is connected to the node n4, for inverting a logic of inputted signal for sense-amplification and a selector 121 receiving the amplified signals outputted from the sense amplifiers SA1 and SA2, for selecting one of these two signals according to the signal A0 of the column address to be outputted to the reading data line 104.

The reading bit-line selector 103 further includes a driver DRVR0, an inverter INVR1, a driver DRVR2 and an inverter INVR3 receiving output signals Y0 to Y3 from the column decoder 120, respectively.

The reading bit-line selector 103 furthermore includes a selection signal line CSR0 connecting an output of the driver DRVR0 and the gate electrode of the nMOS transistor Q0, a selection signal line CSR1 connecting an output of the inverter INVR1 and the gate electrode of the pMOS transistor Q1, a selection signal line CSR2 connecting an output of the driver DRVR2 and the gate electrode of the nMOS transistor Q2, a selection signal line CSR3 connecting an output of the inverter INVR3 and the gate electrode of the pMOS transistor Q3, a pull-up resistor R1 connected between the power supply terminal and the node n3, for pulling up the potential at the node n3 to the power supply voltage VDD and a pull-down resistor R2 connected between the ground terminal and the node n4, for pulling down the potential at the node n4 to the ground voltage GND.

The drivers DRVR0 and DRVR2 output the logics of their inputted signals to drive the selection signal lines CSR0 and CSR2, respectively. On the other hand, the inverters INVR1 and INVR output the logics opposite to those of their inputted signals to drive the selection signal lines CSR1 and CSR3. The selector 121 selects the input from the sense amplifier SA1 if the signal A0 of the column address is "L" and selects the input from the sense amplifier SA2 if the signal A0 of the column address A0 is "H", and outputs the selected one to the reading data line 104.

<A-5. Operation of Column Decoder>

Figures 4, 5, 6:
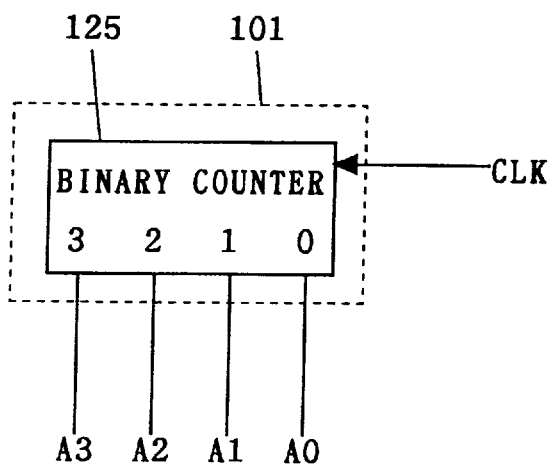
FIG. 4 is a truth table showing an operation of a column decoder in the reading bit-line selector in accordance with the first preferred embodiment of the present invention.
FIG. 5 is a truth table showing an operation of a row decoder in the FIFO memory in accordance with the first preferred embodiment of the present invention.
FIG. 6 is a circuit diagram showing an access control circuit in the FIFO memory in accordance with the first preferred embodiment of the present invention.

FIG. 4 is a truth table showing an operation of the column decoder 120. If the column address signal (A0, A1)=("L", "L"), the output signal Y0 is "H" and the others are "L". The nMOS transistor Q0 becomes conducting through the driver DRVR0 and the pMOS transistors Q1 and Q3 and the nMOS transistor Q2 become non-conducting, and then the reading bit line RBL0 is selected to be electrically connected to the node n3. If the column address signal (A0, A1)=("H", "L"), the output signal Y1 is "H" and the others are "L". The pMOS transistor Q1 becomes conducting through the inverter INVR1 and the nMOS transistors Q0 and Q2 and the pMOS transistor Q3 become non-conducting, and then the reading bit line RBL1 is selected to be electrically connected to the node n4. If the column address signal (A0, A1)=("L", "H"), the output signal Y2 is "H" and the others are "L". The nMOS transistor Q2 becomes conducting through the driver DRVR2 and the pMOS transistors Q1 and Q3 and the nMOS transistor Q0 become non-conducting, and then the reading bit line RBL2 is selected to be electrically connected to the node n3. If the column address signal (A0, A1)=("H", "H"), the output signal Y3 is "H" and the others are "L". The pMOS transistor Q3 becomes conducting through the inverter INVR3 and the nMOS transistors Q0 and Q2 and the pMOS transistor Q1 become non-conducting, and then the reading bit line RBL3 is selected to be electrically connected to the node n4.

<A-6. Operation of Row Decoder>

The row decoder 102 of FIG. 1 decodes a row address of two bits (A2, A3) into a selection signal of four bits (X0 to X3) which is to be given as four output signals X0 to X3 to the reading word lines RWL0 to RWL3, respectively.

FIG. 5 is a truth table showing a decoding operation of the row decoder 102. If the row address signal (A2, A3)=("L", "L"), the reading word line RWL0 is activated to be "H" and the reading word lines RWL1 to RWL3 are "L". Similarly, if the row address signal (A2, A3)=("H", "L"), the reading word line RWL1 is activated to be "H" and the other reading word lines are "L". If the row address signal (A2, A3)=("L", "H"), the reading word line RWL2 is activated to be "H" and the other reading word lines are "L". If the row address signal (A2, A3)=("H", "H"), the reading word line RWL3 is activated to be "H" and the other reading word lines are "L". For example, when the reading word line RWL0 is activated to be "H", the word line RWLN separated from the word line RWL0 comes into high level through the driver DN and the word line RWLP comes into low level through the driver DP. Then, the nMOS transistors N1 in the memory cells MC00 and MC20 and pMOS transistors P1 in the memory cells MC10 and MC30 become conducting. The same is applied in other cases where any of the other reading word lines RWL1 to RWL3 is activated.

<A-7. Configuration of Access Control Circuit>

FIG. 6 is a circuit configuration of the reading access control circuit 101. The reading access control circuit 101 is made of 4-bit binary counter 125.

The binary counter 125 has four terminals, and of these terminals, a terminal 0 outputs the least significant bit and a terminal 3 outputs the most significant bit. Counting the rise of a clock signal CLK, the binary counter 125 sequentially outputs values "0" to "15" in binary representation. The signals A0 and A1 of the column address generated by the reading access control circuit 101 are outputted from the terminals 0 and 1 of the binary counter 125 and the signals A2 and A3 of the row address are outputted from the terminals 2 and 3 of the binary counter 125, respectively.

<A-8. Operation of Access Control Circuit>

FIG. 7A is a chart showing values of the signals A0 to A3 outputted from the reading access control circuit 101. A cycle refers to a time period from a rise of the clock signal CLK to the next rise. The row "T" of FIG. 7A shows sixteen sequential cycles 0 to 15 of the clock signal CLK. Address signals AD0 to AD15 in the row "AD#" are generated in the respective cycles, each having values of the signals A0 to A3 shown in the right four rows.

In FIG. 7A, "0" and "1" indicate "L" and "H" respectively as above and the same applies to the following.

The binary counter 125 has a reset terminal (not shown). With a reset signal inputted to the reset terminal, an operation starts to sequentially read 1-bit stored data of the sixteen memory cells as serial data. At the cycle 0, the binary counter 125 is reset and the signals A0 to A3 are all "0". The binary counter 125 sequentially outputs "0000" to "1111" in synchronization with the clock signal CLK.

The row "BL#" of FIG. 7A shows the reading bit lines selected by the reading bit-line selector 104 in the sixteen cycles according to the signals A0 and A1 of the address signal shown in the row "AD#". In the row "WL#" are shown the reading word lines selected by the row decoder 102 in the sixteen cycles according to the signals A2 and A3 of the address signal shown in the row "AD#". If the reading bit line RBLj and the reading word line RWLi are selected, the memory cells MCji connected to these lines is accessed and data stored therein are outputted to the reading data line 104. Thus, in this preferred embodiment, the memory cell is accessed according to the order as shown in the row "MC#" of FIG. 7A and the stored data thereof are sequentially outputted.

FIG. 7B is a simplified illustration of an arrangement of the memory cells of FIG. 1 and the number given to each of the memory cells represents the accessing order of the memory cell.

<A-9. Operation of Reading Data>

Referring to FIGS. 8A to 8I, detailed discussion will be presented on the operation of reading data from the FIFO memory of FIG. 1. In these figures, the clock signal CLK rises to "H" at the time t0, t1, t2, t3, t4 and t5 and the cycles 0 to 4 of FIG. 7A correspond to the time slots t0 to t1, t1 to t2, t2 to t3, t3 to t4 and t4 to t5, respectively. FIG. 8B (AD#) shows a change of the address signals AD0, AD1, AD2, . . . . FIG. 8C (CSL#) shows which of the transistors Q0 to Q3 becomes conducting, indicating a change of the potential level of the selection signal lines CSR0 to CSR3. FIG. 8D (WLS#) shows which of the reading word lines RWL0 to RWL3 is selected, indicating a change of potential level of the reading word lines RWL0 to RWL3. FIGS. 8E to 8H (RBL0 to RBL3) each show which of the memory cells is accessed, indicating a change of data which are read out into the reading bit line. FIG. 8I shows which of the memory cells has stored the data outputted from the reading data line 104, indicating a change of signal outputted from the reading data line 104.

<A-9-1. Operation of Cycle 0>

At the cycle 0, the reading access control circuit 101 outputs the address signal AD0 behind the rise of the clock signal CLK at the time t0 by time td1. The column decoder 120 in the reading bit-line selector 103 decodes the signals A0 and A1 of the address signal AD0 to bring the selection signal lines CSR0, CSR1 and CSR3 into "H" and the selection signal line CSR2 into "L" behind the output of the address signal AD0 by time td2. Accordingly, the transistor Q0 becomes conducting and the transistors Q1, Q2 and Q3 remain non-conducting. On the other hand, the row decoder 102 decodes the signals A2 and A3 of the address signal AD0 to bring the reading word line RWL0 into "H" behind the output of the address signal AD0 by time td3. The other reading word lines remain "L".

As can be seen from FIGS. 8B and 8C, the delay time td3 is longer than the delay time td2 because the number (n) of rows of the memory cells is larger than the number (m) of columns of the memory cells in the memory cell array 10 as mentioned earlier. In other words, since the number of word lines is larger than the number of bit lines, the row decoder 102 includes more logic gates than the column decoder 104 and therefore the operation of the row decoder 102 takes longer than that of the column decoder 104.

With the reading word line RWL0 activated, the nMOS transistors N1 in the memory cells MC00 and MC20 connected to the reading word line RWL0 through the driver DN become conducting and the pMOS transistors P1 in the memory cells MC10 and MC30 connected to the reading word line RWL0 through the driver DP also become conducting. Then, data are read out from the memory cells MC00, MC10, MC20 and MC30 into the reading bit lines RBL0 to RBL3. The data stored in the memory cells MC00 and MC20 are read out in the reading bit lines RBL0 and RBL2 behind the activation of the reading word line RWL0 by time tdn and the data stored in the memory cells MC10 and MC30 are read out in the reading bit lines RBL1 and RBL3 behind the activation of the reading word line RWL0 by time tdp. In FIGS. 8F and 8G, TaN=(td1+td3+tdn) and TaP=(td1+td3+tdp).

The selector 121 in the reading bit-line selector 103 has already selected the sense amplifier SA1 in response to the signal A0 of "0" and the selection signal line CSR0 has been activated to be "H" to make the nMOS transistor Q0 conducting at the start of activation of the reading word line RWL0, and therefore, the data stored in the memory cell MC00 are outputted to the reading data line 104 through the reading bit line RBL0.

If the node n1 in the memory cell MC00 keeps "H", the potential at the node n3 is brought into the ground potential GND through the nMOS transistors N1 and N2 simultaneously with conduction of the nMOS transistor N1 in the memory cell MC00 since the nMOS transistor N2 is conducting. Consequently, the logic of the potential at the node n3 is inverted by the sense amplifier SA1 and the logic "H" is outputted to the reading data line 104. On the other hand, if the node n1 in the memory cell MC00 keeps "L", the potential at the node n3 is pulled up by the resistor R1 though the nMOS transistor N1 becomes conducting since the nMOS transistor N2 in the memory cell MC00 is not conducting. Consequently, the logic of the potential at the node n3 is inverted by the sense amplifier SA1 and the logic "L" is outputted to the reading data line 104.

The stored data of the memory cell MC00 are outputted to the reading data line 104 behind the rise of the clock signal CLK by time TBL0. The delay time TBL0 is equal to the delay time TaN.

<A-9-2. Operation of Cycle 1>

At the cycle 1, the reading access control circuit 101 outputs the address signal AD1 behind the rise of the clock signal CLK at the time t1 by the time td1. The column decoder 120 in the reading bit-line selector 103 decodes the signals A0 and A1 of the address signal AD1 to bring the selection signal line CSR3 into "H" and the selection signal lines CSR0, CSR1 and CSR2 into "L" behind the output of the address signal AD1 by the time td2. Accordingly, the transistor Q1 becomes conducting and the transistors Q0, Q2 and Q3 are non-conducting. On the other hand, since the signals A2 and A3 of the address signal AD1 do not change, the row decoder 102 keeps the reading word line RWL0 "H".

The selector 121 in the reading bit-line selector 103 selects the sense amplifier SA2 in response to the signal A0 of "1" and the selection signal line CSR0 is changed into "L" to make the pMOS transistor Q1 conducting. Thus, the data which have been read out in the reading bit line RWL1 are outputted to the reading data line 104 behind the conduction of the pMOS transistor Q1 by time td4.

If the node n1 in the memory cell MC10 keeps "L", the potential at the node n4 is brought into the power supply potential VDD with conduction of the pMOS transistor Q2. Consequently, the logic of the potential at the node n4 is inverted by the sense amplifier SA2 and the logic "L" is outputted to the reading data line 104. On the other hand, if the node n1 in the memory cell MC10 keeps "H", the potential at the node n4 is pulled down to the ground potential GND by the resistor R2 though the pMOS transistor Q2 becomes conducting. Consequently, the logic of the potential at the node n4 is inverted by the sense amplifier SA2 and the logic "H" is outputted to the reading data line 104. The stored data of the memory cell MC10 are outputted to the reading data line 104 behind the time t1 by time TBL1. The delay time TBL1 is equal to delay time (td1+td2+td4). Furthermore, the time td4 is sufficiently shorter than the time tdn or tdp.

After the cycle 1, the reading access control circuit 101 sequentially outputs the address signals AD2, AD3 and AD4 behind the rise of the clock signal CLK by the time td1. When the signals A0 and A1 of the column address change, only the selected one of the transistors Q0 to Q3 becomes conducting behind the output of the signals A0 and A1 by the time td2. On the other hand, when the signals A2 and A3 of the row address change, the selected one of the reading word lines RWL0 to RWL3 is activated behind the output of the signals A0 and A1 by the time td3

<A-9-3. Operation of Cycles 2 and 3>

At the cycles 2 and 3, with no change of the signals A2 and A3, the reading word line RWL0 remain activated. At the cycle 2, the selection signal line CSR2 is changed into "H" to make the transistor Q2 conducting, and the data which have been read out in the reading bit line RBL2 are inverted by the sense amplifier SA1 and outputted to the reading data line 104 as the stored data of the memory cell MC20. At the cycle 3, the selection signal line CSR3 is changed into "L" to make the transistor Q3 conducting, and the data which have been read out in the reading bit line RBL3 are inverted by the sense amplifier SA2 and outputted in the reading data line 104 as the stored data of the memory cell MC30. When the stored data of the memory cell MC20 are outputted behind the time t2 at the cycle 2 and the stored data of the memory cells MC30 are outputted behind the time t3 at the cycle 3, the delay time is TBL1 like at the cycle 1.

<A-9-4. Operation of Cycle 4 and Later>

After that, at the cycles 4, 8 and 12, the selected word line is changed and the n-type memory cells MC01, MC02 and MC03 are accessed respectively and the stored data thereof are read out. At these cycles, the operation of outputting the stored data from the respective memory cells to the reading data line 104 is performed in the same manner as done at the cycle 0, and the stored data of the memory cells are outputted behind the rise of the clock CLK by the delay time TBL0.

At other cycles, no change of the reading word line is made. At these cycles, the operation of outputting the stored data from the memory cells to the reading data line 104 is performed in the same manner as done at the cycles 1 to 3, and the stored data of the memory cells are outputted behind the rise of the clock CLK by the delay time TBL1.

Thus, in this preferred embodiment, the stored data of the memory cells are read out according to the accessing order (MC00, MC10, MC20, MC30, MC01, MC11, MC21, MC31, MC02, MC12, MC22, MC32, MC03, MC13, MC23 and MC33), as indicated in the row "MC#". The read of data from these memory cells is always performed according to this order. In particular, the reading word lines RWL0 to RWL3 of this preferred embodiment are configured so that the reading bit line corresponding to the n-type memory cell should be first selected after activation of the selected reading word line every time one of the reading word lines RWL0 to RWL3 is selected and further the reading bit line corresponding to the p-type memory cell should be selected by the end of the activation of the selected reading word line.

<A-10. Characteristics of Read Operation>

In the FIFO memory of this preferred embodiment, data can be faster read from the memory cell.

Typically discussing as to the cycle 4, the reading word line RWL1 is activated at time t4a, and then data are read out from the memory cell MC01 behind the activation of the reading word line RWL1 by the time tdn and data are read out from the memory cell MC11 behind the activation of the reading word line RWL1 by the time tdp. If the node n1 of the memory cell MC01 keeps "H" and the node n2 of the memory cell MC11 keeps "L", for example, the nMOS transistor N1 of the memory cell MC01 becomes conducting and the reading bit line RBL0 is thereby pulled down to the ground potential GND, in other words, discharged to "L", and the pMOS transistor P1 of the memory cell MC11 becomes conducting and the reading bit line RBL1 is thereby pulled up to the power supply potential VDD, in other words, charged to "H".

In a case of using typical nMOS transistor and pMOS transistor which have the same transistor size, i.e., gate width and gate length, of which the gate electrode are supplied with the power supply potential VDD of 3.3V and the ground potential GND of 0V respectively, the pMOS transistor has carrier mobility half as much as the nMOS transistor. Accordingly, the delay time tdp is twice as long as the delay time tdn.

In this case, since the bit line connected to the n-type memory cell is first selected by the reading bit-line selector 103 every time the word lines RWLN and RWLP separated from the reading word line are both activated according to the row address and the column address generated by the reading access control circuit 101, the data can be faster read from the memory cell into the reading data line 104, as compared with a case where the bit line connected to the p-type memory cell is first selected, by the difference between the time tdn and the time tdp. Further, since the bit line connected to the p-type memory cell is selected by the end of the activation of the word lines, the stored data of the p-type memory cell have been already read out into the bit line until the selection of bit line is made and the time period TBL1 for reading the stored data from the p-type memory cell into the reading data line 104 is not affected by the delay time tdp. Thus, avoiding the delay which would be caused if the p-type memory cell is first accessed after the activation of the word lines, the stored data of the p-type memory cell can be read out after the stored data of the n-type memory cell are read out.

Furthermore, even once the p-type memory cell is first accessed after the activation of the word lines, the cycle of the clock signal CLK must be insured at least for the period until the data read out from the p-type memory cell are surely outputted to the reading data line 104 (tdp0 of FIG. 8D). In this preferred embodiment, however, when data are sequentially read out from the sixteen memory cells, the bit line connected to the n-type memory cell is first selected by the reading bit-line selector 103 after activation of the selected reading word line every time one of the reading word lines is selected. Therefore, the cycle of the clock signal CLK can be reduced at most to the period until the data read out from the n-type memory cell are surely outputted to the reading data line 104 (tdn0 of FIG. 8D). Thus, an improvement in speed of reading data from the FIFO memory is achieved.

<A-11. Configuration for Writing Data>

Next, specific configuration and operation for writing data into the FIFO memory of FIG. 1 will be discussed.

The order of writing data into the memory cells in the FIFO memory is the same as the accessing order of the memory cells in reading data as shown in the row "MC#" of FIG. 7A. First, a configuration for writing data will be discussed below.

The writing access control circuit 105 generates the signals A0 and A1 of the column address and signals A2 and A3 of the row address for an access to the memory cell to write data. The writing access control circuit 105 has the same configuration as the reading access control circuit 101 shown in FIG. 6, and sequentially outputs the signals A0 to A3 shown in FIG. 7A. Like the read operation, an operation of writing 16-bit serial data into the sixteen memory cells by one bit starts with inputting the reset signal to the binary counter. The binary counter sequentially outputs "0000" to "1111" in synchronization with the clock signal CLK.

The writing bit-line selector 107 selects one of the writing bit lines WBL0 to WBL3 according to the column address signal (A0, A1) generated by the writing access control circuit 105 and transmits data from the writing data line 108 to the selected writing bit line.

Figure 9:
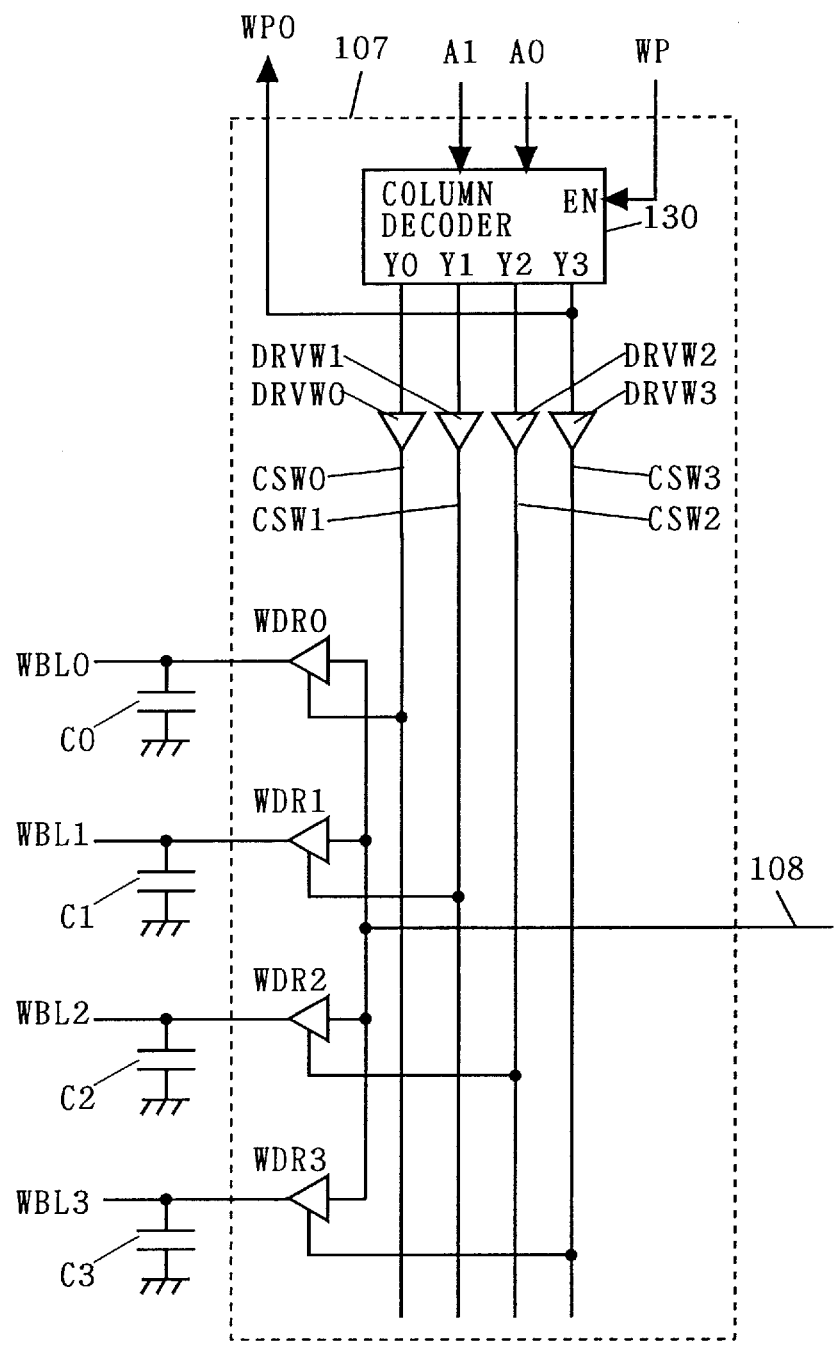
FIG. 9 is a circuit diagram showing a writing bit-line selector 107 in the FIFO memory in accordance with the first preferred embodiment of the present invention.

FIG. 9 is a circuit diagram showing a configuration of the writing bit-line selector 107. The writing bit-line selector 107 includes a column decoder for decoding the column address signal (A0, A1) generated by the writing access control circuit 105 into the selection signal (Y0 to Y3), drivers DRVW0 to DRVW3 receiving the signals Y0 to Y3 of the selection signal outputted from the column decoder 130 respectively, selection signal lines CSW0 to CSW3 connected to the outputs of the drivers DRVW0 to DRVW3 respectively, and bit-line drivers WDR0 to WDR3 whose inputs are connected in common to the writing data line 108 and outputs are connected to the bit lines WBL0 to WBL3 respectively. The drivers DRVW0 to DRVW3 output the logics of the respective input signals to drive the selection signal lines CSW0 to CSW3, respectively. The bit-line drivers WDR0 to WDR3 receive signals on the selection signal lines CSW0 to CSW3, respectively, as an enable signal. Each of the bit-line drivers WDR0 to WDR3 outputs the logic of its input signal to drive the corresponding one of the writing bit lines WBL0 to WBL3 if the corresponding one of the selection signal lines CSW0 to CSW3 is "H" and does not drive the corresponding writing bit line if the corresponding selection signal line is "L".

Capacitors C0 to C3 are wiring capacitances of the writing bit lines WBL0 to WBL3, respectively.

<A-12. Operation of Column Decoder>

The column decoder 130 performs a decoding operation according to a truth table of FIG. 10.

If the column address signal (A0, A1)=("L", "L"), the selection signal line CSW0 is activated to be "H" through the driver DRVW0 and the selection signal lines CSW1 to CSW3 are brought into "L". Accordingly, the bit-line driver WDR0 is selected to work so that data inputted to the writing data line 108 may be transmitted to the writing bit line WBL0. Similarly, if the column address signal (A0, A1)= ("H", "L"), only the selection signal line CSW1 is activated to be "H" through the driver DRVW1 and the bit-line driver WDR1 is selected to work so that data inputted to the writing data line 108 may be transmitted to the writing bit line WBL1. If the column address signal (A0, A1)=("L", "H"), only the selection signal line CSW2 is activated to be "H" through the driver DRVW2 and the bit-line driver WDR2 is selected to work so that data inputted to the writing data line 108 may be transmitted to the writing bit line WBL2. If the column address signal (A0, A1)=("H", "H"), only the selection signal line CSW3 is activated to be "H" through the driver DRVW3 and the bit-line driver WDR3 is selected to work so that data inputted to the writing data line 108 may be transmitted to the writing bit line WBL3.

Receiving a write pulse WP given from outside of the device as an enable signal, the column decoder 130 performs the above decoding operation if the write pulse WP is "H", and on the other hand, brings all the signals Y0 to Y3 into "L" if the write pulse WP is "L".

<A-13. Operation of Row Decoder>

The writing row decoder 106 decodes the row address signal (A2, A3) generated by the writing access control circuit 105 into the selection signal (X0 to X3) to be outputted. The signals X0 to X3 are given to the writing word lines WWL0 to WWL3 respectively, and one of the writing word lines WWL0 to WWL3 is selected to be activated. The row decoder 106 performs a decoding operation according to a truth table of FIG. 11.

If the row address signal (A2, A3)=("L", "L"), the writing word line WWL0 is selected to become "H" and the other writing word lines are brought into "L". If the row address signal (A2, A3)=("H", "L"), the writing word line WWL1 is selected to become "H" and the other writing word lines are brought into "L". If the row address signal (A2, A3)=("L", "H"), the writing word line WWL2 is selected to become "H" and the other writing word lines are brought into "L". If the row address signal (A2, A3)=("H", "H"), the writing word line WWL3 is selected to become "H" and the other writing word lines are brought into "L".

For example, when the writing word line WWL0 is activated to be "H", the word line WWLN separated from the writing word line WWL0 is brought into "H" through the driver DN and the word line WWLP is brought into "L" through the driver DP. The nMOS transistors N3 of the memory cells MC00 and MC20 and the pMOS transistors P3 of the memory cells MC10 and MC30 become conducting. In cases where other writing word lines WWL1 to WWL3 are activated, the similar operation are performed.

The writing row decoder 106 receives the signal Y3 from the column decoder 130 in the writing access control circuit 107 as a control signal WP0. The control signal WP0 serves as an enable signal of the row decoder 106. If the control signal WP0 is "H", the writing row decoder 106 performs a decoding operation according to the truth table of FIG. 11, and on the other hand, if the control signal WP0 is "L", all the signal X0 to X3 become "L" so that no writing word line is activated.

<A-14. Operation of Writing Data>

Referring to FIGS. 12A to 12M, detailed discussion will be presented on the operation of writing data into the memory cells.

The following discussion relates to a case where 1-bit data D0 to D15 are written into the memory cells according to the order shown in FIG. 7A.

In FIGS. 12A to 12M, the clock signal CLK rises at the time t0, t1, t2, t3, t4 and t5. The write pulse WP0 is inputted to the writing bit-line selector 107 so that one pulse of "H" may be generated in each cycle 0, 1, 2 . . . The binary counter in the writing access control circuit 105 counts the rise of the clock signal CLK and outputs the address signals AD0 to AD15 in the cycles 0 to 15 according to FIG. 7A. The data D0 to D15 are inputted to the writing data line 108 in synchronization with the rise of the clock signal CLK.

<A-14-1. Operation of Cycle 0>

At the cycle 0, the row decoder 106 receives the address signal AD0, where the signals (A3, A2)=("0", "0"). At this time, since the output signal Y3 of the column decoder 130 remains "L", no word line is activated. The writing word line WWL0 is not activated until the cycle 4 where the signals (A3, A2)=("0", "0") of the address signal AD3 is decoded and the output signal Y3 becomes "H".

On the other hand, the column decoder 130 in the writing bit-line selector 107 decodes the address signal AD0, where the signals (A1, A0)=("0", "0"), and selects the bit-line driver WDR0. Since the column decoder 130 outputs the decoding result while the write pulse WP0 is "H", the selection signal line CSW0 comes into "H" and the bit-line driver WDR0 becomes active only during the pulse 0 of FIG. 12B. As a result, the data D0 are transmitted from the writing data line 108 to the writing bit line WBL0 simultaneously with a start of driving operation by the bit-line driver WDR0. The bit-line driver WDR0 stops the driving operation with a fall of the pulse 0. The writing bit line WBL0 comes into a floating state where it is not electrically connected to the power supply terminal or the ground terminal after the driving operation of the bit-line driver WDR0 stops. However, since the capacitor C0 holds electric charges enough to make the bit-line driver WDR0 keep the same potential as the data D0, the writing bit line WBL0 keeps the data D0 also after the operation of the bit-line driver WDR0 stops.

<A-14-2. Operation of Cycles 1 and 2>

Similarly, at the cycle 1, the column decoder 130 decodes the address signal AD1, where the signals (A1, A0)=("0", "1"), and selects the bit-line driver WDR1. During the pulse 1, the selection signal line CSWl comes into "H" and the bit-line driver WDR1 performs a driving operation. The data D1 are transmitted to the writing bit line WBL1 simultaneously with a start of the driving operation by the bit-line driver WDR1. The writing bit line WBL1 keeps the potential of the data D1 by the electric charges stored in the capacitor C1 even after the operation of the bit-line driver WDR1 stops. Further, at the cycle 2, the address signal AD2, where the signals (A1, A0)=("1", "0"), is decoded and as a result the selection signal line CSW2 comes into "H" to drive the bit-line driver WDR2 during the pulse 2. The data D2 are transmitted to the writing bit line WBL2 simultaneously with a start of the driving operation. The writing bit line WBL2 keeps the potential of the data D2 at the end of the cycle 2.

<A-14-3. Operation of Cycle 3>

At the cycle 3, the column decoder 130 decodes the address signal AD3, where the signals (A1, A0)=("1", "1"), and selects the bit-line driver WDR3. At this time, the output signal Y3 of the column decoder 130 is brought into "H". Accordingly, since the control signal WP0 becomes "H", the row decoder 105 decodes the row address signal (A3, A2)=("0", "0") and the writing word line WWL0 is activated to be "H" during the pulse 3 as shown in FIG. 12M. Simultaneously with generation of the pulse 3, the nMOS transistors N3 in the memory cells MC00 and MC20 become conducting through the driver DN and the pMOS transistors P3 in the memory cells MC10 and MC30 become conducting through the driver DP.

During the pulse 3, the selection signal line CSW3 comes into "H" and the bit-line driver WDR3 performs a driving operation. Thus, the data D3 are given to the node n2 in the memory cell MC30 from the writing data line 108 through the writing bit line WBL3 and the conducting pMOS transistor P3. On the other hand, with the generation of the pulse 3, the nMOS transistors N3 in the memory cells MC00 and MC20 and the pMOS transistor P3 in the memory cell MC10 become conducting, and the data D0 to D2 which have been held in the writing bit lines WBL0 to WBL2 until the generation of the pulse 3 are given to the storage nodes n1 of the memory cells MC00 and MC20 and the storage node n2 of the memory cell MC10. At the end of the pulse 3, the writing word line WWL0 is brought into "L", and the nMOS transistors N3 in the MC00 and MC20 and the pMOS transistors P3 in the memory cells MC10 and MC30 become non-conducting.

Thus, at the cycle 3, the serial data D0 to D3 are simultaneously written into the memory cells MC00, MC10, MC20 and MC30, respectively.

<A-14-4. Operation of Cycle 4 and Later>

Not shown in FIGS. 12A to 12M, at the following cycles 4 to 7, the writing access control circuit 105 sequentially outputs the column address signals (A1, A0)=("0", "0"), ("0", "1"), ("1", "0") and ("1", "1"), respectively. Further, during the cycles 4 to 7, the row address signal (A3, A2)=("0", "1") is outputted. Since the writing word line WWL1 is not activated until the cycle 7, the data D4 to D7 from the writing data line 108 are simultaneously written into the memory cells MC01, MC11, MC21 and MC31 at the cycle 7.

At the cycles 8 to 11, the writing access control circuit 105 sequentially outputs the column address signals (A1, A0)= ("0", "0"), ("0", "1"), ("1", "0") and ("1", "1"), respectively. Further, during the cycles 8 to 11, the row address signal (A3, A2)=("1", "0") is outputted. Since the writing word line WWL2 is not activated until the cycle 11, the data D8 to D11 from the writing data line 108 are simultaneously written into the memory cells MC02, MC12, MC22 and MC32 at the cycle 11.

Finally, at the cycles 12 to 15, the writing access control circuit 105 sequentially outputs the column address signals (A1, A0)=("0", "0"), ("0", "1"), ("1", "0") and ("1", "1"), respectively. Further, during the cycles 12 to 15, the row address signal (A3, A2)=("1", "1") is outputted. Since the writing word line WWL3 is not activated until the cycle 15, the data D12 to D15 from the writing data line 108 are simultaneously written into the memory cells MC03, MC13, MC23 and MC33 at the cycle 15.

The write of data into these memory cells is performed always according to this accessing order.

Furthermore, the FIFO memory of FIG. 1 may be mounted on a chip. Or, the FIFO memory of FIG. 1 may be mounted on a board, providing the reading access control circuit 101 and the writing access control circuit 105 on a chip and the other circuits on another chip.

<B. The Second Preferred Embodiment>

<B-1. Configuration of Access Control Circuit>

Figure 13:
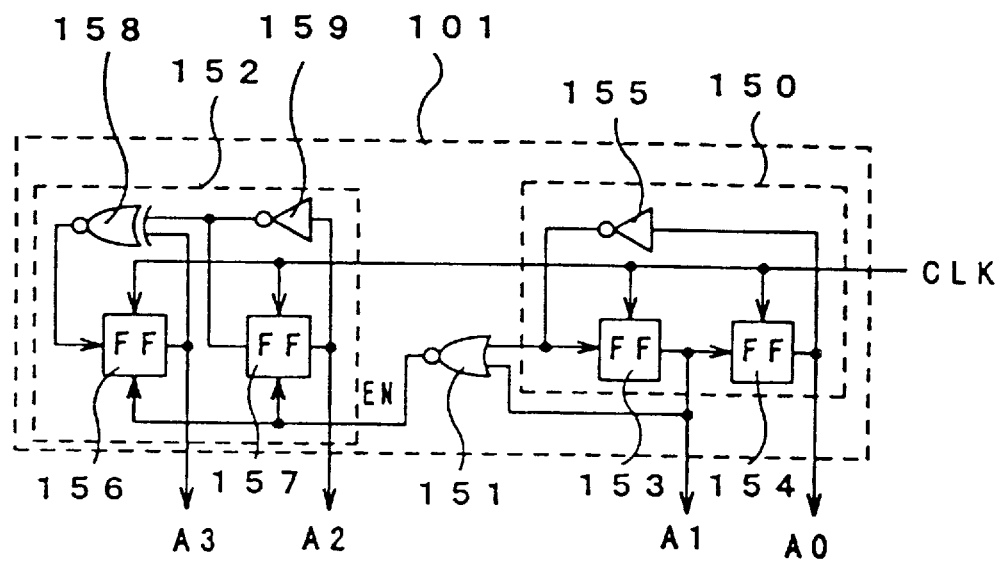
FIG. 13 is a circuit diagram showing an access control circuit in an FIFO memory in accordance with a second preferred embodiment of the present invention.

FIG. 13 is a circuit diagram showing another configuration of the reading access control circuit 101 in the semiconductor memory device of FIG. 1.

The reading access control circuit 101 includes a feedback-shift-register (FSR) counter 150, a NOR gate 151 and a 2-bit binary counter 152.

The FSR counter 150 includes two flip flop (FF) circuits 153 and 154 connected in series to each other, for receiving input signals in synchronization with the rise of the clock signal CLK to hold them, and an inverter 155 for inverting the logic of an output signal of the FF circuit 154 to give the inverted signal to the FF circuit 153. The FF circuits 153 and 154 constitute a shift register to shift the respective hold data in synchronization with the clock signal CLK and output their output signals to the reading bit-line selector 103 as the signals A1 and A0 of the column address signal respectively.

<B-2. Operation of Access Control Circuit>

Referring to timing charts of FIGS. 14A to 14E, the operation of the access control circuit 101 will be discussed. At time t0, the FF circuits 153 and 154 are reset to "0". At time t1, through the first shift operation, the FF circuit 154 holds "0" which has been held in the FF circuit 153 until the first shift operation and the FF circuit 153 holds "1" which is an inverted signal of "0" which has been held in the FF circuit 154 until the first shift operation. At time t2, through the second shift operation, the FF circuit 154 holds "1" which has been held in the FF circuit 153 until the second shift operation and the FF circuit 153 holds "1" which is an inverted signal of "0" which has been held in the FF circuit 154 until the second shift operation. At time t3, through the third shift operation, the FF circuit 154 holds "1" which has been held in the FF circuit 153 until the third shift operation and the FF circuit 153 holds "0" which is an inverted signal of "1" which has been held in the FF circuit 154 until the third shift operation. At time t4, through the fourth shift operation, the FF circuit 154 holds "0" which has been held in the FF circuit 153 until the fourth shift operation and the FF circuit 153 holds "0" which is an inverted signal of "1" which has been held in the FF circuit 154 until the fourth shift operation. Thus, the reading access control circuit 101 repeatedly outputs the column address signal (A1, A0) in the order of ("0", "0"), ("1", "0"), ("1", "1"), ("0", "1").

The binary counter 152 sequentially counts the rise of the clock signal CLK and sequentially outputs "0", "1", "2", "3" in binary representation. The binary counter 152 includes FF circuits 156 and 157, an inverter 159 for inverting the logic of an output signal of the FF circuit 157 to give the inverted signal to the FF circuit 157 and an EXNOR circuit 158 to give an exclusive NOR of an output signal of the FF circuit 156 and an output signal of the inverter 159 to the FF circuit 156. The output signals of the FF circuits 156 and 157 are regarded as the most significant bit and the least significant bit, respectively.

The reading access control circuit 101 outputs the least significant bit and the most significant bit of the binary counter 152 as the signals A2 and A3 of the row address, respectively. The binary counter 152 receives an output signal of the NOR circuit 151 which is a NOR logic of the inverted signal of the signal A0 and the signal A1 as an enable signal EN. The FF circuits 156 and 157 each receive the enable signal EN. When the enable signal EN is "1", the FF circuits 156 and 157 receive and hold the input signals. Accordingly, the binary counter 152 performs the count operation only when the output signal of the NOR gate 151 is "1".

As can be seen from the timing charts of FIGS. 14A to 14E, the binary counter 152 is reset to "0" at the time t0. From the time t1 to the time t3, the binary counter 152 continuously outputs "0" without count-up operation since the enable signal EN remains "0". At time t3, through the shift operation of the FSR counter 150, the signal A0 becomes "1" and the signal A1 becomes "0", and then the enable signal EN becomes "1" to enable the count operation of the binary counter 152. The binary counter 152 does not count up the value to be outputted, from "0" to "1", until the time t4. On the other hand, the FSR counter 150 outputs the signals A1 and A0 both of "0" and accordingly the enable signal EN becomes "0" after the time t4. The binary counter 152 counts up once during four cycles of the clock signal CLK and changes the row address every time the column address signal (A1, A0) changes from ("0", "1") to ("0", "0").

FIG. 15A is a chart showing the values of the signals A0 to A3 outputted from the reading access control circuit 101 in this preferred embodiment. In the row "T" of this figure shown are sixteen consecutive cycles from 0 to 15 of the clock signal CLK in the reading access control circuit 101 of FIG. 13. The rows "AD#", "BL#", "WL#" and "MC#" are the same as those of FIG. 7A. FIG. 15B is a simplified illustration of an arrangement of the memory cells of FIG. 1 and the number given to each of the memory cells represents the accessing order of the memory cell.

The four FF circuits in the FSR counter 150 and the binary counter 152 each have a reset terminal not shown. The operation of sequentially reading 1-bit stored data from the sixteen memory cells as serial data starts with inputting a reset signal to each reset terminal. Thus, the stored data of the memory cell MC00 are first read out, and subsequently, with count operations of the FSR counter 150 and the binary counter 152, the stored data are read from the memory cells MC20, MC30, MC10, MC01, MC21, MC31, MC11, MC02, MC22, MC32, MC12, MC03, MC23, MC33 and MC13 in this order. The read of the stored data from the memory cells is always performed according to this accessing order.

Furthermore, the specific operation of reading data from the memory cells in the FIFO memory in the second preferred embodiment is the same as that of the first preferred embodiment except the accessing order of the memory cells.

<B-3. Characteristics of Read Operation>

In the second preferred embodiment, the bit line connected to the n-type memory cell is first selected by the reading bit-line selector 103 after every activation of the pair of word lines RWLN and RWLP and the bit line connected to the p-type memory cell is selected by the end of the activation of the word lines RWLN and RWLP, like in the first preferred embodiment.

Further, in a sequential read of the stored data from the sixteen memory cells, the bit line connected to the n-type memory cell is first selected by the reading bit-line selector 103 after activation of the selected reading word line every time selection of reading word line is made, and the bit line connected to the p-type memory cell is selected by the end of the activation of the selected reading word line. Therefore, the semiconductor device of this preferred embodiment produces the same effect as that of the first preferred embodiment.

The writing access control circuit 105 of the second preferred embodiment have the same configuration as the circuit of FIG. 13 and the writing row decoder 106 have the same configuration as that of the first preferred embodiment. The writing bit-line selector 107 have the same configuration as that of FIG. 9, except that the control signal WP0 is obtained as the output signal Y1 not as the output signal Y3. The 16-bit serial data given from the writing data line 108 are divided into sixteen 1-bit data and written into the respective memory cells in the same order as the accessing order of FIG. 15A.

<C. The Third Preferred Embodiment>
<C-1. Configuration of Access Control Circuit>

Figure 16:
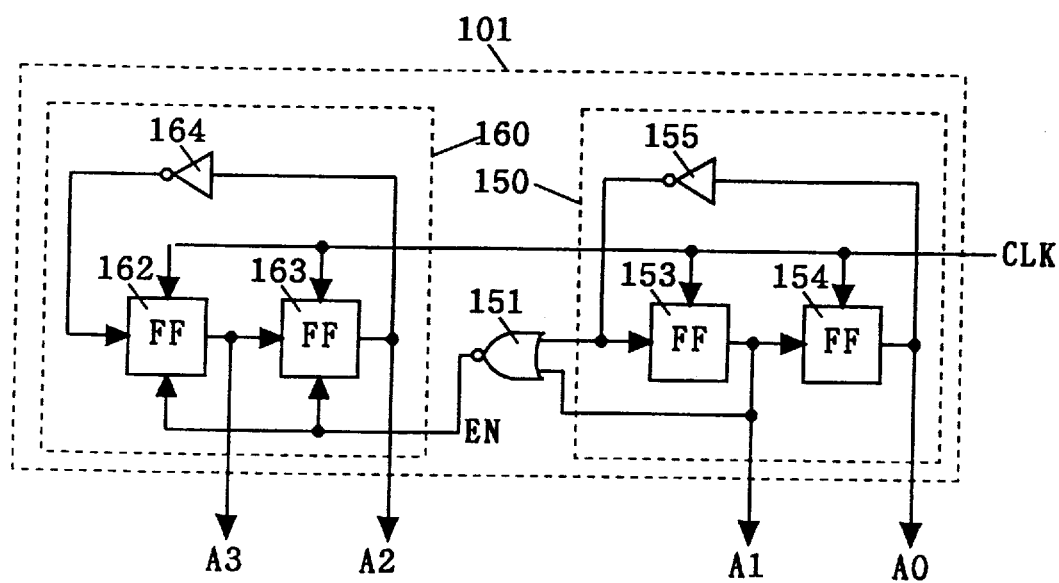
FIG. 16 is a circuit diagram showing an access control circuit in an FIFO memory in accordance with a third preferred embodiment of the present invention.

FIG. 16 is a circuit diagram showing a further configuration of the reading access control circuit 101 in the semiconductor memory device of FIG. 1.

The reading access control circuit 101 of the third preferred embodiment have the same configuration as that of FIG. 13 except that an FSR counter 160 is employed instead of the binary counter 152 of FIG. 13.

The FSR counter 160 includes two FF circuits 162 and 163 connected in series to each other, each holding 1-bit data, and an inverter 164 for inverting the logic of an output signal of the FF circuit 163 to give the inverted signal to the FF circuit 162. The FF circuits 162 and 163 constitute a shift register to shift the hold data of the FF circuit 162 to the FF circuit 163 in synchronization with the clock signal CLK and output their output signals to the row decoder 102 as the signals A3 and A2 of the row address respectively. The FF circuits 162 and 163 receive the output signal of the NOR gate 151 as the enable signal EN. When the enable signal EN is "1", the FF circuits 162 and 163 receive and hold the input signals.

The FSR counter 160 repeatedly outputs the column address signal (A1, A0) in the order of ("0", "0"), ("1", "0"), ("1", "1"), ("0", "1") through its operation, like the FSR counter 150. However, the FSR counter 160 performs one shift operation during the four cycles of the clock signal CLK according to the enable signal EN. In other words, the FSR counter 160 changes the row address every time the column address signal (A1, A0) changes from ("0", "1") to ("0", "0").

<C-2. Characteristics of Read Operation>

FIG. 17A is a chart showing the values of the signals A0 to A3 outputted from the reading access control circuit 101 in this preferred embodiment. In the row "T" of this figure shown are sixteen consecutive cycles from 0 to 15 of the clock signal CLK in the reading access control circuit 101 of FIG. 16. The rows "AD#", "BL#", "WL#" and "MC#" are the same as those of FIG. 7A. FIG. 17B is a simplified illustration of an arrangement of the memory cells of FIG. 1 and the number given to each of the memory cells represents the accessing order of the memory cell.

The four FF circuits in the FSR counters 150 and 160 each have a reset terminal not shown. The operation of sequentially reading 1-bit stored data from the sixteen memory cells as serial data starts with inputting a reset signal to each reset terminal. Thus, the stored data of the memory cell MC00 are first read out, and subsequently, with count operations of the FSR counters 150 and 160, the stored data are read from the memory cells MC20, MC30, MC10, MC02, MC22, MC32, MC12, MC03, MC23, MC33, MC13, MC01, MC21, MC31 and MC11 in this order. The read of the stored data from the memory cells is always performed according to this accessing order.

Furthermore, the specific operation of reading data from the memory cells in the FIFO memory in the third preferred embodiment is the same as that of the first preferred embodiment except the accessing order of the memory cells.

<C-3. Characteristics of Read Operation>

In the third preferred embodiment, the bit line connected to the n-type memory cell is first selected by the reading bit-line selector 103 after every activation of the pair of word lines RWLN and RWLP and the bit line connected to the p-type memory cell is selected by the end of the activation of the word lines RWLN and RWLP, like in the first preferred embodiment.

Further, in a sequential read of the stored data from the sixteen memory cells, the bit line connected to the n-type memory cell is first selected by the reading bit-line selector 103 after activation of the selected reading word line every time selection of reading word line is made, and the bit line connected to the p-type memory cell is selected by the end of the activation of the selected reading word line. Therefore, the semiconductor device of this preferred embodiment produces the same effect as that of the first preferred embodiment.

Furthermore, as is clear from the second and third preferred embodiments, the means for generating the signals A3 and A2 of the row address has only to fulfill a counter function and may have any configuration for convenience of design. For example, the FSR counter 160 of the third preferred embodiment is preferable to the binary counter 152 of the second preferred embodiment which is larger in circuit scale by the EXNOR gate 158.

The writing access control circuit 105 of the third preferred embodiment have the same configuration as the circuit of FIG. 16 and the writing row decoder 106 have the same configuration as that of the first preferred embodiment. The writing bit-line selector 107 have the same configuration as that of FIG. 9, except that the control signal WP0 is obtained as the output signal Y1 not as the output signal Y3. The 16-bit serial data given from the writing data line 108 are divided into sixteen 1-bit data and written into the respective memory cells in the same order as the accessing order of FIG. 17A.

<D. The Fourth Preferred Embodiment>
<D-1. Configuration of Access Control Circuit>

Figure 18:
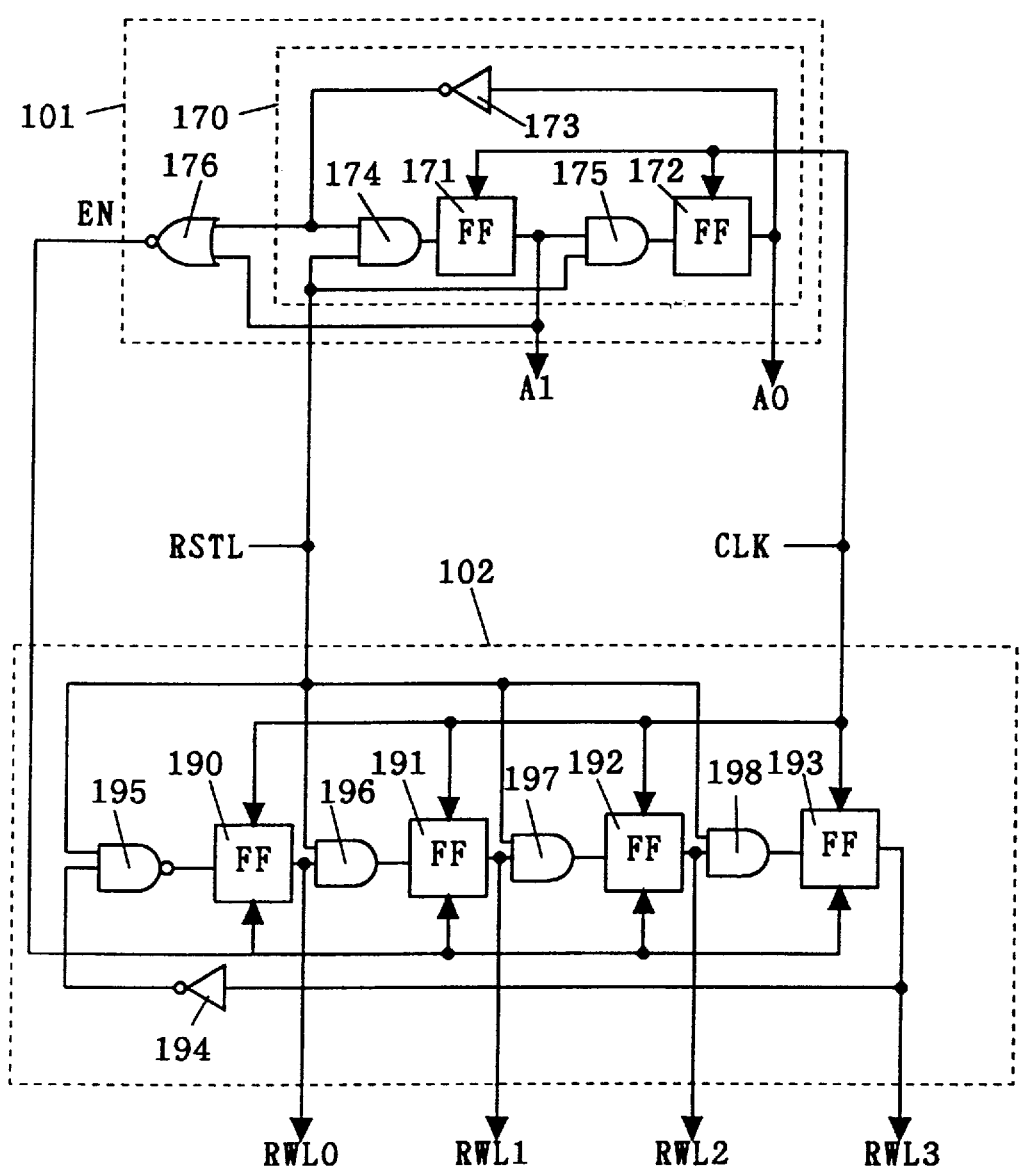
FIG. 18 is a circuit diagram showing an access control circuit and a row decoder in an FIFO memory in accordance with a fourth preferred embodiment of the present invention.

FIG. 18 is a circuit diagram showing another configuration of the reading access control circuit 101 and the row decoder 102 in the semiconductor memory device of FIG. 1.

The reading access control circuit 101 of the fourth preferred embodiment includes an FSR counter 170 and a NOR gate 176.

The FSR counter 170 includes two FF circuits 171 and 172 for receiving input signals in synchronization with the rise of the clock signal CLK to hold them, an inverter 173 for inverting the logic of an output signal of the FF circuit 172, an AND gate 174 for outputting an AND logic of an output signal of the inverter 173 and a reset signal RSTL to the FF circuit 171 and an AND gate 175 for outputting an AND logic of an output signal of the FF circuit 171 and the reset signal RSTL to the FF circuit 172.

The NOR gate 176 outputs a NOR logic signal of the output signal of the FF circuit 171 and the output signal of the inverter 173 as the enable signal EN.

The reading access control circuit 101 outputs the output signals of the FF circuits 171 and 172 to the reading bit-line selector 103 as the signals A1 and A0 of the column address, respectively.

The row decoder 102 includes FF circuits 190 to 193 receiving the input signals in synchronization with the rise of the clock signal CLK to hold them, an inverter 194 for inverting the logic of an output signal of the FF circuit 193, a NAND gate 195 for outputting a NAND logic of an output signal of the inverter 194 and the reset signal RSTL to the FF circuit 190, an AND gate 196 for outputting an AND logic of an output signal of the FF circuit 190 and the reset signal RSTL to the FF circuit 191, an AND gate 197 for outputting an AND logic of an output signal of the FF circuit 191 and the reset signal RSTL to the FF circuit 192 and an AND gate 198 for outputting an AND logic of an output signal of the FF circuit 192 and the reset signal RSTL to the FF circuit 193.

Each of the FF circuits 190 to 193 receives the enable signal EN outputted from the NOR gate 176, and receives the input signal to hold it when the enable signal EN is "1". The outputs of the FF circuits 190 to 193 are connected to the reading bit lines RWL0 to RWL3, respectively.

<D-2. Operation of Access Control Circuit>

When the reset signal RSTL is "0", the AND gates 174 and 175 in the reading access control circuit 101 each output "0", the AND gates 196 to 198 in the row decoder 102 each output "0" and the NAND gate 195 outputs "1". In other words, the FF circuits 174, 175 and 191 to 193 are reset to "0" in synchronization with the clock signal CLK and only the FF circuit 190 is set to "1".

When the reset signal RSTL is "1", in the reading access control circuit 101, the AND gate 174 outputs the output signal of the inverter 173 without changing its logic and the AND gate 175 outputs the output signal of the FF circuit 171 without changing its logic. Since the FSR counter 170 performs the same operation as the FSR counter 150 shown in FIG. 13, the reading access control circuit 101 repeatedly outputs the column address signal (A1, A0) in the order of ("0", "0"), ("1", "0"), ("1", "1"), ("0", "1"). When the signal A1 is "0" and the signal A0 is "1", the enable signal EN outputted from the NOR gate 176 is "1", and otherwise "0".

Further, when the reset signal RSTL is "1", in the row decoder 102, the AND gates 196 to 198 output the output signals of the FF circuits 190 to 192 respectively without changing their logics and the NAND gate 195 outputs the output signal of the FF circuit 193 without changing its logic through the inverter 194. Thus, the row decoder 102 serves as a shift register to circularly shift the hold data of the FF circuits 190 to 193 in synchronization with the clock signal CLK. The shift operation is performed only when the enable signal EN is "1". When the enable signal EN is "0", the FF circuits receive no data, causing no shift operation.

The operation of reading data from the memory cells in the fourth preferred embodiment will be discussed below.

FIG. 19A is a chart showing the values of the signals A0 and A1 outputted from the reading access control circuit 101 of FIG. 18 and the values of potential level of the reading word lines. In the row "T" of this figure shown are sixteen consecutive cycles from 0 to 15 of the clock signal CLK in the reading access control circuit 101 of FIG. 18. The rows "BL#" and "MC#" are the same as those of FIG. 7A.

The operation of reading the respective 1-bit stored data from the sixteen memory cells as serial data starts with the reset signal being "0".

When the operation starts at the cycle 0, the signals A1 and A0 outputted from the reading access control circuit 101 of FIG. 18 each become "0" and the reading bit-line selector 103 selects the reading bit line RBL0. On the other hand, since the FF circuit 190 in the row decoder 102 is set to "1" and the FF circuits 191 to 193 are each reset to "0", the reading word line RWL0 is activated to be "1", i.e., "H" and the other reading word lines are brought into "0", i.e., "L", not being selected. Accordingly, the memory cell MC00 is accessed and the stored data thereof are read out.

At the cycles 1 to 3, the FSR counter 170 performs the same operation as the FSR counter 150 of FIG. 13 and therefore the reading access control circuit 101 outputs the column address signal (A1, A0) at each cycle in the order of ("1", "0"), ("1", "1"), ("0", "1"). On the other hand, the row decoder 102 activates only the word line RWL0 at the cycles 1 to 3, like at the cycle 0, since the enable signal EN remains "0" until the start of the cycle 3. Accordingly, the memory cells MC20, MC30 and MC10 are accessed and the stored data thereof are read out at the cycles 1 to 3 respectively.

At the cycle 4, since the enable signal EN is "1" on the start of the cycle, the row decoder 102 performs the shift operation of the signals in the FF circuits 190 to 193. In particular, with the shift of the data "1" stored in the FF circuit 190 to the FF circuit 191, the reading word line RWL1 is activated to be "1", i.e., "H". On the other hand, the other reading word lines are brought into "0", i.e., "L".

After that, the row decoder 102 performs the shift operation every four cycles. At the cycles 4 to 7, only the reading word line RWL1 is activated while the column address signal (A1, A0) is sequentially outputted in the order of ("0", "0"), ("1", "0"), ("1", "1"), ("0", "1"), so that the memory cells MC01, MC21, MC31 and MC11 are accessed in this order and the stored data thereof are read out.

At the cycles 8 to 11, only the reading word line RWL2 is activated while the column address signal (A1, A0) is sequentially outputted in the order of ("0", "0"), ("1", "0"), ("1", "1"), ("0", "1"), so that the memory cells MC02, MC22, MC32 and MC12 are accessed in this order and the stored data thereof are read out.

At the cycles 12 to 5, only the reading word line RWL3 is activated while the column address signal (A1, A0) is sequentially outputted in the order of ("0", "0"), ("1", "0"), ("1", "1"), ("0", "1"), so that the memory cells MC03, MC23, MC33 and MC13 are accessed in this order and the stored data are thereof read out.

<D-3. Characteristics of Read Operation>

In the semiconductor device using the reading access control circuit 101 of the fourth preferred embodiment, the bit line connected to the n-type memory cell is first selected by the reading bit-line selector 103 after every activation of the pair of word lines RWLN and RWLP and the bit line connected to the p-type memory cell is selected by the end of the activation of the word lines RWLN and RWLP, like in the first preferred embodiment.

Further, in a sequential read of the stored data from the sixteen memory cells, the bit line connected to the n-type memory cell is first selected by the reading bit-line selector 103 after activation of the selected reading word line every time selection of reading word line is made, and the bit line connected to the p-type memory cell is selected by the end of the activation of the selected reading word line. Therefore, the semiconductor device of this preferred embodiment produces the same effect as that of the first preferred embodiment.

Furthermore, the row decoder 102 has the shift register constituted of the FF circuits 190 to 193 and through its shift operation, it sequentially selects one of the reading word lines. Accordingly, the reading access control circuit 101 has only to generate a 1-bit signal which enables/disables the shift operation, i.e., the enable signal EN, and does not need, for example, the binary counter 152 of FIG. 12 or the FSR counter 160 of FIG. 15. Thus, the reading access control circuit 101 may have a simpler configuration and therefore can be more easily designed.

Furthermore, the writing access control circuit 105, the writing row decoder 106 and the writing bit-line selector 107 of the fourth preferred embodiment are the same in configuration as those of the second preferred embodiment.

<E. The Fifth Preferred Embodiment>

The configuration of a memory cell to be adopted in the above first to fourth preferred embodiments is not limited to the n-type memory cell as shown in FIG. 2A or the p-type memory cell as shown in FIG. 2B. The data storages 110 and 111 of FIGS. 2A and 2B may have any configuration to fulfill the function of storing data. For example, a static memory cell can be used, where the data storage 110 or 111 includes a latch circuit. Specifically, to produce the same effect as the above first to fourth preferred embodiments, it is only necessary to provide two types of memory cells, i.e., the first type of memory cell including an nMOS transistor connected between the reading bit line RBLj and the data storage 110, of which the gate terminal is connected to the reading word line RWLN, and the second type of memory cell including a pMOS transistor connected between the reading bit line RBLk and data storage 111, of which the gate terminal is connected to the reading word line RWLP.

<F. The Sixth Preferred Embodiment>

<F-1. Overall Device Configuration>

Figure 20:
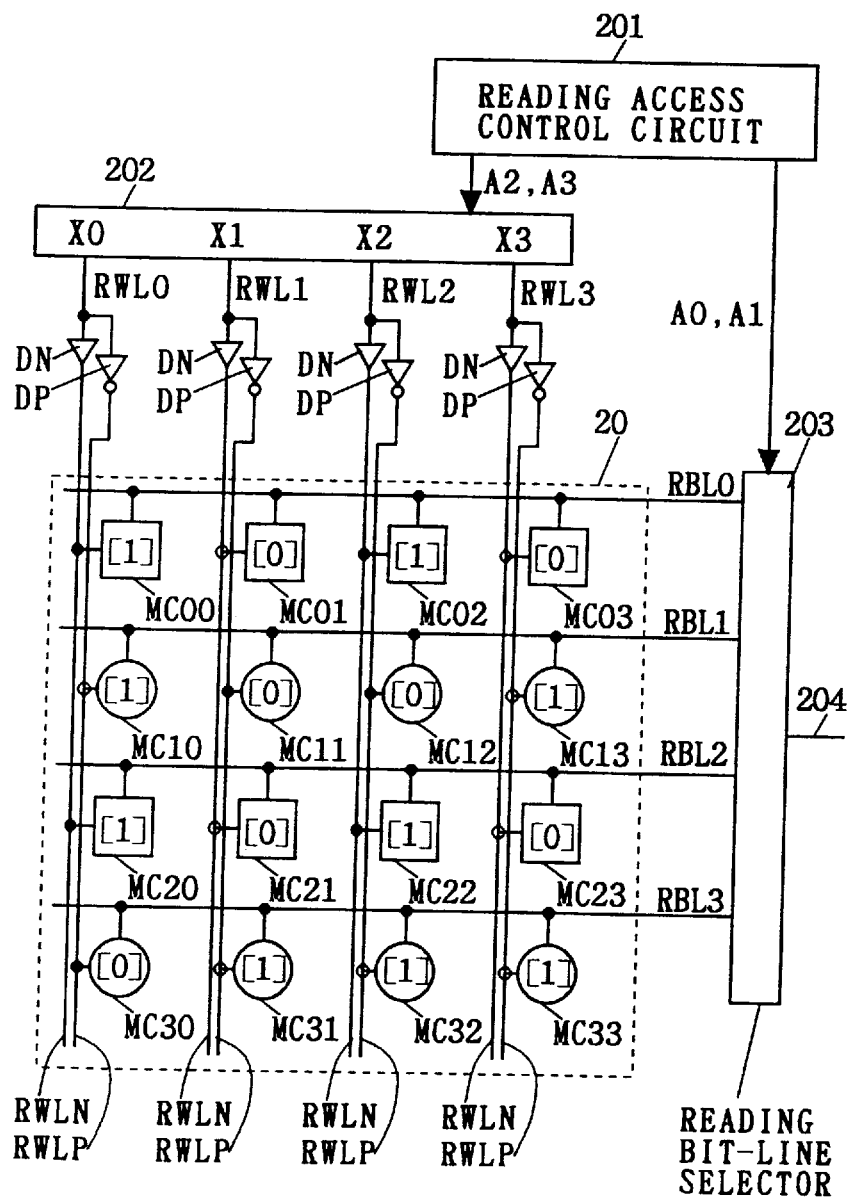
FIG. 20 is a circuit diagram showing a configuration of a semiconductor memory device, particularly a ROM circuit, in accordance with a sixth preferred embodiment of the present invention.

FIG. 20 is a circuit diagram showing a semiconductor memory device in accordance with the sixth preferred embodiment of the present invention. This figure particularly illustrates a ROM circuit for reading the respective stored data from a plurality of memory cells in a predetermined order, especially used for storing a program of a microcomputer or storing character fonts for display. The ROM circuit includes a memory cell array 20, a reading access control circuit 201, a reading row decoder 202 and a reading bit-line selector 203.

The memory cell array of FIG. 20 includes n-type memory cells MC00 to MC03 and MC20 to MC23 and p-type memory cells MC10 to MC13 and MC30 to MC33. The reading bit line RBL0 is provided correspondingly to the column of the memory cells MC00 to MC03, the reading bit line RBL1 is provided correspondingly to the column of the memory cells MC10 to MC13, the reading bit line RBL2 is provided correspondingly to the column of the memory cells MC20 to MC23 and the reading bit line RBL3 is provided correspondingly to the column of the memory cells MC30 to MC33. On the other hand, the reading word line RWL0 is provided correspondingly to the row of the memory cells MC00, MC10, MC20 and MC30, the reading word line RWL1 is provided correspondingly to the row of the memory cells MC01, MC11, MC21 and MC31, the reading word line RWL2 is provided correspondingly to the row of the memory cells MC02, MC12, MC22 and MC32 and the reading word line RWL3 is provided correspondingly to the row of the memory cells MC03, MC13, MC23 and MC33.

Like in FIG. 1, the reading word lines RWL0 to RWL3 are each separated into the word line RWLN through the driver DN and the word line RWLP through the driver DP. The word lines RWLN and RWLP constitute a pair of word lines.

The reading access control circuit 201 generates a row address (the first control signal) and a column address (the second control signal), which are used to specify a memory cell to be accessed. The reading row decoder 202 decodes the row address outputted from the reading access control circuit 201 to select one of the reading word lines RWL0 to RWL3 and outputs the selection signal to activate the selected word line. The reading bit-line selector 203 decodes the column address outputted from the reading access control circuit 201 to select one of the reading bit lines RBL0 to RBL3 and reads data from the selected bit line into a reading data line 204.

The row decoder 202 decodes the signals A2 and A3 of the row address according to the truth table of FIG. 5 to output a 4-bit signal (output signals X0 to X3), like in the first preferred embodiment. The output signals X0 to X3 are given to the reading word lines RWL0 to RWL3, respectively.

The reading bit-line selector 203 has the same configuration as shown in FIG. 3.

<F-2. Configuration of Memory Cell>

The memory cells MC00 to MC03 and MC20 to MC23 are each an n-type memory cell and the memory cells MC10 to MC13 and MC30 to MC33 are each a p-type memory cell. Specifically, the n-type memory cell has either of configurations shown in FIGS. 21A and 21B and the p-type memory cell has either of configurations shown in FIGS. 21C and 21D.

Figure 21A:
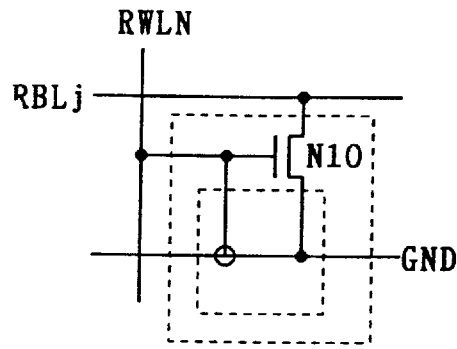
FIGS. 21A to 21D are circuit diagrams each showing a configuration of a memory cell in the ROM circuit in accordance with the sixth preferred embodiment of the present invention.

FIG. 21A is a circuit diagram showing an n-type memory cell storing "1". The n-type memory cell has an nMOS transistor N10 connected between the reading bit line RBLj and a ground line, of which the gate terminal is connected to the word line RWLN separated from the reading word line. When the corresponding reading word line is activated and the word line RWLN separated therefrom comes into "H", the nMOS transistor N10 becomes conducting and the reading bit line RBLj is discharged to the ground potential GND. When the reading bit line RBLj is selected by the reading bit-line selector 203, the ground potential GND of the reading bit line RBLj is inverted by the sense amplifier SA1 (FIG. 3) and eventually the data of "H", i.e., "1" are outputted from the reading data line 204.

Figure 21B:
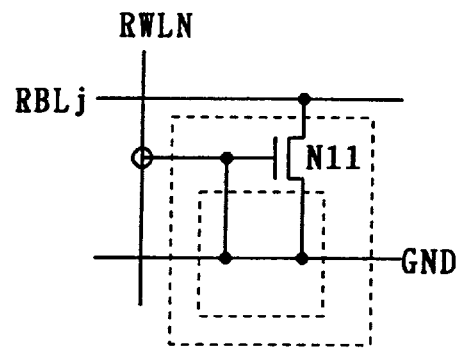

FIG. 21B is a circuit diagram showing an n-type memory cell storing "0". The n-type memory cell has an nMOS transistor N11 connected between the reading bit line RBLj and a ground line, of which the gate terminal is connected to the ground line. Even if the corresponding reading word line is activated, the nMOS transistor N11 does not become conducting and the reading bit line RBLj is brought into a floating state. When the reading bit line RBLj is selected by the reading bit-line selector 203, the potential of the reading bit line RBLj is pulled up to "H" by the resister R1 (FIG. 3) and further inverted by the sense amplifier SA1, and eventually the data of "L", i.e., "0" are outputted from the reading data line 204.

Figure 21C:
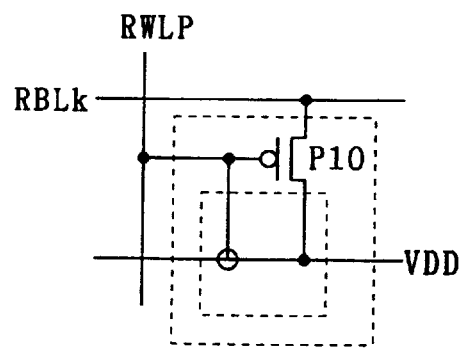

FIG. 21C is a circuit diagram showing a p-type memory cell storing "0". The p-type memory cell has a pMOS transistor P10 connected between the reading bit line RBLk and a power supply line, of which the gate terminal is connected to the word line RWLP separated from the reading word line. When the corresponding reading word line is activated and the word line RWLP separated therefrom comes into "L", the pMOS transistor P10 becomes conducting and the reading bit line RBLk is charged to the power supply potential VDD. When the reading bit line RBLk is selected by the reading bit-line selector 203, the power supply potential VDD ("H") of the reading bit line RBLk is inverted by the sense amplifier SA2 (FIG. 3) and eventually the data of "L", i.e., "0" are outputted from the reading data line 204.

Figure 21D:
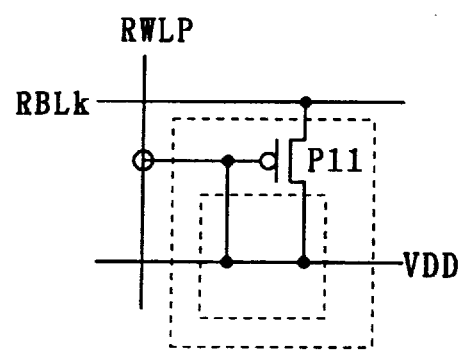

FIG. 21D is a circuit diagram showing a p-type memory cell storing "1". The p-type memory cell has a pMOS transistor P11 connected between the reading bit line RBLk and a power supply line, of which the gate terminal is connected to the power supply line. Even if the corresponding reading word line is activated, the pMOS transistor P11 does not become conducting and the reading bit line RBLk is brought into a floating state. When the reading bit line RBLk is selected by the reading bit-line selector 203, the potential of the reading bit line RBLk is pulled down to "L" by the resister R2 (FIG. 3) and further inverted by the sense amplifier SA2, and eventually the data of "H", i.e., "1" are outputted from the reading data line 204.

In FIGS. 21A to 21D, blank circles at intersections of signal lines represent that the signal lines are not connected. As to a ROM circuit, there is an often-utilized method in which, for example, n-type memory cells having the same configuration are prepared and the points represented by the blank circles are cut by a laser and the like according to data to be stored in the respective memory cells. Naturally, the same applies to p-type memory cells. Further, in FIGS. 21A to 21D, a region surrounded by an inner broken line is termed a data storage and a region surrounded by an outer broken line is termed a memory cell.

In the sixth preferred embodiment, the memory cells each store "1" or "0" as given in FIG. 20. The memory cells MC00, MC02, MC20 and MC22 each have the configuration of FIG. 21A and store "1". The memory cells MC01, MC03, MC21 and MC23 each have the configuration of FIG. 21B and store "0". The memory cells MC11, MC12 and MC30 each have the configuration of FIG. 21C and store "0". The memory cells MC10, MC13, MC31, MC32 and MC33 each have the configuration of FIG. 21 D and store "1".

<F-3. Configuration of Access Control Circuit>

Figure 22:
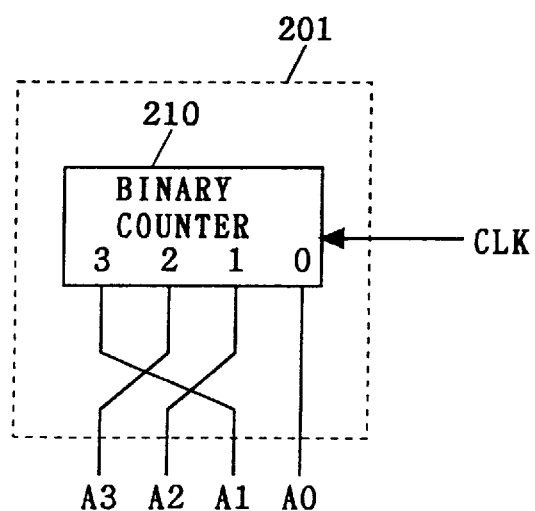
FIG. 22 is a circuit diagram showing an access control circuit in the ROM circuit in accordance with the sixth preferred embodiment of the present invention.

The reading access control circuit 201 includes a binary counter 210 as shown in FIG. 22. The binary counter 210 having four terminals 0 to 3, in which the least significant bit is located on the side of terminal 0 and the most significant bit is located on the side of terminal 3, sequentially outputs values from "0" to "15" in binary representation from the terminals 0 to 3. The signals A0 and A1 of the column address are outputted from the terminals 0 and 3 of the binary counter 210 respectively and the signals A2 and A3 of the row address are outputted from the terminals 1 and 2 of the binary counter 210 respectively.

FIG. 23A is a chart showing the values of the signals A0 to A3 outputted from the reading access control circuit 201 in this preferred embodiment. In the row "T" of this figure shown are sixteen consecutive cycles from 0 to 15 of the clock signal CLK in the reading access control circuit 201 of FIG. 20. The rows "AD#", "BL#", "WL#" and "MC#" are the same as those of FIG. 7A.

FIG. 23B is a simplified illustration of an arrangement of the memory cells of FIG. 20 and the number given to each of the memory cells represents the accessing order of the memory cell.

<F-4. Operation of Reading Data>

Referring to FIGS. 24A to 24I, an operation of reading data in the ROM circuit of FIG. 20 will be discussed below. In these figures, the clock signal CLK rises at the time t0, t1, t2, t3, t4 and t5 and the binary counter 210 of the reading access control circuit 201 counts the rise of the clock signal CLK. The cycles 0 to 3 correspond to the time periods t0 to t1, t1 to t2, t2 to t3 and t3 to t4, respectively. The others are the same as shown in FIGS. 8A to 8I.

The operation of reading the respective 1-bit stored data from the sixteen memory cells as serial data starts with inputting the reset signal into a reset terminal of the binary counter 210. Like in FIG. 8A, the reading access control circuit 201 sequentially outputs the addresses AD0 to AD15 behind the rise of the clock signal CLK by the time td1. When the signals A0 and A1 of the column address change, the selected one of the transistors Q0 to Q3 becomes conducting behind the output of the address signal by the time td2. On the other hand, when the signals A2 and A3 of the row address change, the selected one of the reading word lines RWL0 to RWL3 is activated behind the output of the address signal by the time td3.

<F-4-1. Operation of Cycle 0>

At the cycle 0, the reading word line RWL0 is selected by the address signal AD0, to be activated. Like in FIG. 1, the data of the memory cells MC00 and MC20 are read out into the reading bit lines RBL0 and RBL2 respectively behind the activation of the reading word line RWL0 by the time tdn and the data of the memory cell MC30 are read out into the reading bit line RBL3 behind the activation of the word line RWL0 by the time tdp. On the other hand, the pMOS transistor P11 of the memory cell MC10 is always non-conducting, and the stored data of the memory cell MC10 are not read out into the reading bit line RBL1 even if the reading word line RWL0 is activated.

Since the reading bit-line selector 203 selects the reading bit line RBL0 by the address signal AD0, the data "1" stored in the memory cell MC00 are outputted to the reading data line 204 at time (t0+TBL0), where TBL0=td1+td3+tdn.

<F-4-2. Operation of Cycle 1>

At the cycle 1, in response to the address signal AD1 outputted from the reading access control circuit 201, the reading word line RWL0 remains activated, and on the other hand, the selection signal line CSL1 is changed into "L" in the reading bit-line selector 203 to make the pMOS transistor Q1 conducting. The reading bit line RBL1 is pulled down to "L" by the resistor R2. The resistor R2 is designed so as to pull the reading bit line down to "L" behind the conduction of the pMOS transistor Q1 or Q3 by time tdx which is shorter than the delay time tdp. The stored data "1" of the memory cell MC10 are outputted to the reading data line 204 at time (t1+TBL2) where TBL2=td1+td2+tdx.

<F-4-3. Operation of Cycle 2>

At the cycle 2, in response to the address signal AD2 outputted from the reading access control circuit 201, the reading word line RWL1 is activated. In the memory cell MC11 corresponding to the reading word line RWL1, the pMOS transistor P10 becomes conducting and the stored data thereof are read out into the reading bit line RBL1 behind the activation of the reading word line RWL1 by the time tdp. In the other corresponding memory cells MC01, MC21 and MC31, the transistors N11 and P11 remain non-conducting. On the other hand, in response to the address signal AD2, the selection signal line CSLO is changed into "H" in the reading bit-line selector 203 to make the nMOS transistor Q0 conducting. With the conduction of the nMOS transistor Q0, the reading bit line RBL0 is pulled up to "H" by the resistor R1. The stored data "0" of the memory cell MC01 are outputted to the reading data line 204 at time (t2+TBL2).

Furthermore, the resistor R1 is designed so as to pull the reading bit line up to "H" behind the conduction of the nMOS transistor Q0 or Q2 by the time tdx.

<F-4-4. Operation of Cycle 3>

At the cycle 3, in response to the address signal AD3 outputted from the reading access control circuit 201, the reading word line RWL1 remains activated, and on the other hand, the pMOS transistor Q1 becomes conducting in the reading bit-line selector 203. The stored data "0" of the memory cell MC11 which have been already read out into the reading word line RWL1 are outputted to the reading data line 204 at time (t3+TBL1) where TBL1=td1+td2+td4.

Furthermore, at the cycles 2 and 3, the stored data of the memory cells MC21 and MC31 are not read out into the corresponding reading bit lines RBL2 and RBL3, respectively.

<F-4-5. Operation of Cycle 4>

At the cycle 4, in response to the address signal AD4 outputted from the reading access control circuit 201, the reading word line RWL2 is activated behind the output of the address signal AD4 by the time td3. In the memory cells MC02 and MC22 corresponding to the reading word line RWL2, the nMOS transistors N10 become conducting and thereby the stored data are read out into the reading bit lines RBL0 and RBL2 respectively behind the activation of the reading word line RWL2 by the time tdn. In the corresponding memory cell MC12, the transistor P10 becomes conducting and thereby the stored data are read out into the reading bit line RBL1 behind the activation of the reading word line RWL2 by the time tdp. The reading bit-line selector 203 selects the reading bit line RBL0 and the stored data "1" of the memory cell MC02 are outputted to the reading data line 204 at time (t4+TBL0).

Thus, since the signals A2 and A3 of the row address are outputted from the terminals 1 and 2 of the binary counter 201 respectively, the reading word line to be selected is changed at the even cycles. Further, the signals A0 and A1 of the column address are outputted from the terminals 0 and 3 of the binary counter 210 respectively, the reading bit line RBL0 or RBL2 is selected by the reading bit-line selector 203 at the even cycles and one of the n-type memory cells is necessarily selected. If the n-type memory cell which is first accessed after the activation of the reading word line stores "1" (or has the configuration of FIG. 21A), the stored data "1" are read out into the data line 204 behind the rise of the clock signal CLK by the time TBL0. If the n-type memory cell which is first accessed after the activation of the reading word line stores "0" (or has the configuration of FIG. 21B), the stored data "0" are read out into the data line 204 behind the rise of the clock signal CLK by the time TBL2.

On the other hand, at the odd cycles, there is no change of the reading word line to be selected. The reading bit line RBL1 or RBL3 is selected by the reading bit-line selector 203 and one of the p-type memory cells is necessarily selected. If the accessed p-type memory cell stores "0" (or has the configuration of FIG. 21C), the stored data "0" are read out into the data line 204 behind the rise of the clock signal CLK by the time TBL1. If the accessed p-type memory cell stores "1" (or has the configuration of FIG. 21D), the stored data "1" are read out into the data line 204 behind the rise of the clock signal CLK by the time TBL2.

Thus, the stored data are outputted in the order of the memory cells MC00, MC10, MC01, MC11, MC02, MC12, MC03, MC13, MC20, MC30, MC21, MC31, MC22, MC32, MC23 and MC33 as shown in the row "MC#" of FIG. 23A, and serial data "1100100110011101" are outputted for the sixteen cycles. The serial data can represent, for example, an instruction set of 16 bits for a microcomputer or a character font of 16 bits. The read of the data from the memory cells is performed always according to the above order. In particular, the reading word lines RWL0 to RWL3 are configured so that the reading bit line corresponding to the n-type memory cell should be first selected after activation of the selected reading word line every time one of the reading word lines RWL0 to RWL3 is selected and further the reading bit line corresponding to the p-type memory cell should be selected by the end of the activation of the selected reading word line.

<F-5. Characteristics of Read Operation>

The memory cell array of the ROM circuit of the sixth preferred embodiment has a gate array configuration of CMOS transistors. Each memory cell has one of the configurations shown in FIGS. 21A to 21D according to the content to be stored therein. If the memory cell array has at least one p-type memory cell of FIG. 21C having the pMOS transistor connected between the bit line and the data storage, of which the gate terminal is connected to the word line, and the p-type memory cell is first accessed after activation of the selected reading word line, particularly, it disadvantageously takes more time to read data out into the reading bit line. As discussed in this preferred embodiment, when data are sequentially read out from the sixteen memory cells, the reading bit line connected to the n-type memory cells is first selected by the reading bit-line selector 203 after activation of the selected reading word line every time one of the reading word lines is selected. Therefore, with any configuration of the n-type and p-type memory cells for storing "1" or "0", it is possible to reduce the cycle of the clock signal CLK for reading data, like in the first preferred embodiment, and an improvement in speed of reading data in the ROM circuit is achieved.

Furthermore, the ROM circuit of FIG. 20 may be mounted on a chip. Or, the ROM circuit of FIG. 20 may be mounted on a board, providing the reading access control circuit 201 on a chip and other circuits on another chip.

<G. The Seventh Preferred Embodiment>

<G-1. Configuration of Access Control Circuit>

FIG. 25 is a circuit diagram showing another configuration of the reading access control circuit 201 in the semiconductor memory device of FIG. 20.

The reading access control circuit 201 of FIG. 25 includes a 1-bit counter 230 and an FSR counter 240.

The 1-bit counter 230 includes an FF circuit 231 for receiving an input signal in synchronization with the rise of the clock signal CLK to hold it and an inverter 232 for inverting the logic of an output signal of the FF circuit 231 to give the inverted signal to the FF circuit 231. The output signal of the FF circuit 231 serves as the signal A0 of the column address. Accordingly, the counter 230 alternately outputs "0" and "1" in synchronization with the rise of the clock signal CLK as the signal A0.

The FSR counter 240 includes FF circuits 241 to 243 connected in series, for receiving input signals in synchronization with the rise of the clock signal CLK to hold and output them.

The FSR counter 240 further includes an EX0R gate 244 for outputting an EX0R logic of two output signals of the FF circuits 242 and 243, a NOR gate 245 for outputting a NOR logic of two output signals of the FF circuits 241 and 242 and an EX0R gate 246 for outputting an EX0R logic of two output signals of the EX0R gate 244 and the NOR gate 245 to the FF circuit 241. The output signals of the FF circuit 241 and 242 serve as the signals A3 and A2 of the row address, respectively, and the output signal of the FF circuit 243 serves as the signal A1 of the column address. The FF circuits 241 to 243 perform a shift operation in synchronization with the rise of the clock signal CLK. Further, each of the FF circuits 241 to 243 receives the enable signal EN and receives the input signal to hold it only when the enable signal EN is "1". The enable signal EN is the output signal of the FF circuit 231, i.e., the signal A0.

The operation of reading the respective 1-bit stored data from the sixteen memory cells as serial data starts with resetting the FF circuits 231 and 241 to 243 in the 1-bit counter 230 and the FSR counter 240 to hold "0".

With the respective functions of the EX0R gates 244 and 246 and the NOR gate 245, the FSR counter 240 sequentially outputs the signals (A3, A2, A1) in order of ("1", "0", "0"), ("0", "1", "0"), ("1", "0", "1"), ("1", "1", "0"), ("1", "1", "1"), ("0", "1", "1") and ("0", "0", "1") at every shift operation. The shift operation of the FF circuits 241 to 243 starts with the rise of the clock signal CLK only when the enable signal EN, i.e., the signal A0, is "1".

<G-2. Operation of Access Control Circuit>

Figures 26A, 26B:
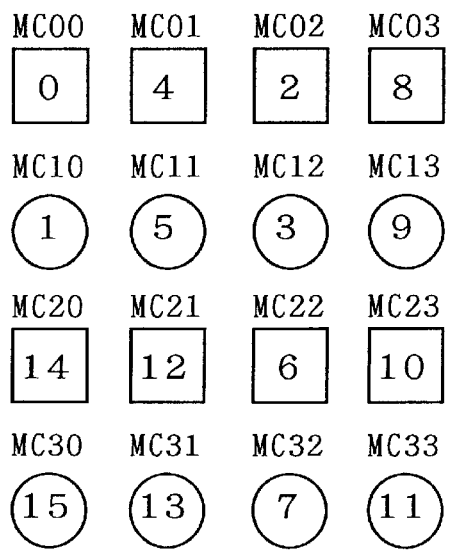
FIGS. 26A and 26B are charts showing an accessing order of the memory cells in the ROM circuit in accordance with the seventh preferred embodiment of the present invention.

FIG. 26A is a chart showing the values of the signals A0 to A3 outputted from the reading access control circuit 201 of FIG. 25 in this preferred embodiment. In the row "T" of this figure shown are sixteen consecutive cycles from 0 to 15 of the clock signal CLK. The rows "AD#", "BL#", "WL#" and "MC#" are the same as those of FIG. 7A.

FIG. 26B is a simplified illustration of an arrangement of the memory cells of FIG. 20) and the number given to each of the memory cells represents the accessing order of the memory cell.

Thus, in the seventh preferred embodiment, the stored data are outputted in the order of the memory cells MC00, MC10, MC02, MC12, MC01, MC11, MC22, MC32, MC03, MC13, MC23, MC33, MC21, MC31, MC20 and MC30 as shown in the row "MC#" of FIG. 26A, unlike in the sixth preferred embodiment. Further, to read the serial data "1100100110011101" like in the sixth preferred embodiment, it is necessary that the n-type memory cells MC00, MC01, MC03 and MC21 should have the configuration of FIG. 20A, the n-type memory cells MC02, MC20, MC22 and MC23 should have the configuration of FIG. 20B, the p-type memory cells MC11, MC12 and MC13 should have the configuration of FIG. 20C and the p-type memory cells MC10, MC30, MC31, MC32 and MC33 should have the configuration of FIG. 20D. The read of the data from the memory cells is performed always according to the above order.

<G-3. Characteristics of Read Operation>

Thus, when data are sequentially read out from the sixteen memory cells, the reading access control circuit 201 of FIG. 25 also operates so that the n-type memory cell may be first accessed after activation of the selected reading word line every time one of the reading word lines is selected. Therefore, in the seventh preferred embodiment, it is possible to improve the speed of read operation in the ROM circuit, like in the sixth preferred embodiment.

<H. The Eighth Preferred Embodiment>

<H-1. Configuration of Access Control Circuit>

Figure 27:
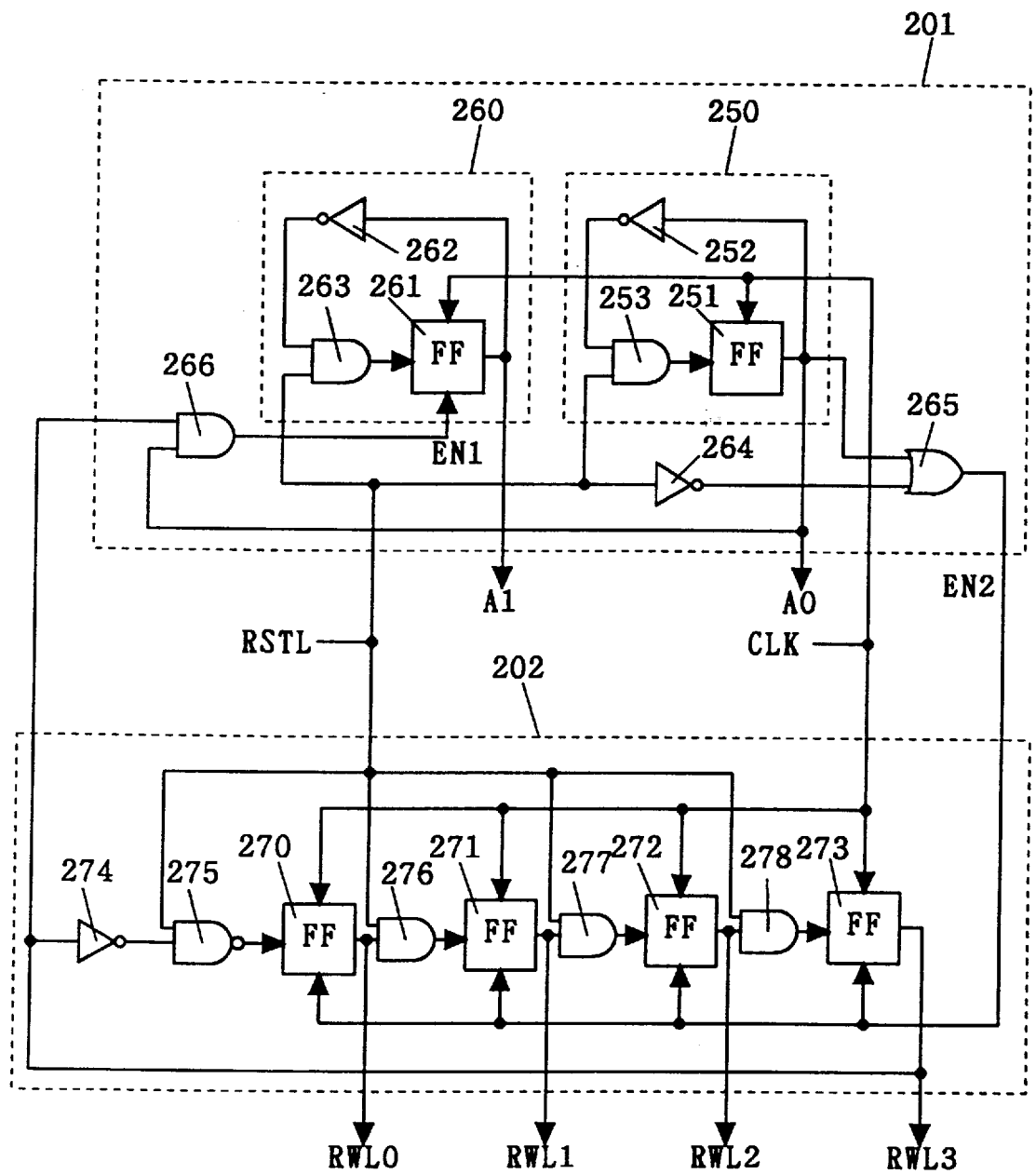
FIG. 27 is a circuit diagram showing an access control circuit and a row decoder in a ROM circuit in accordance with an eighth preferred embodiment of the present invention.

FIG. 27 is a circuit diagram showing another configuration of the reading access control circuit 201 and the row decoder 202 in the semiconductor memory device of FIG. 20.

The reading access control circuit 201 of FIG. 27 includes two 1-bit counters 250 and 260.

The 1-bit counter 250 includes an FF circuit 251 for receiving an input signal in synchronization with the rise of the clock signal CLK to hold it, an inverter 252 for inverting the logic of an output signal of the FF circuit 251 and an AND gate 253 for outputting an AND logic of an output signal of the inverter 252 and the reset signal RSTL to the FF circuit 251.

The 1-bit counter 260 includes an FF circuit 261 for receiving an input signal in synchronization with the rise of the clock signal CLK to hold it, an inverter 262 for inverting the logic of an output signal of the FF circuit 261 and an AND gate 263 for outputting an AND logic of an output signal of the inverter 262 and the reset signal RSTL to the FF circuit 261. In particular, the FF circuit 261 receives an enable signal EN1, and receives the input signal to hold it only when the enable signal EN1 is "1" and do not receive the input signal when the enable signal EN1 is "0".

The reading access control circuit 201 further includes an inverter 264 for generating an inverted signal of the reset signal RSTL and an OR gate 265 for generating an OR logic signal of an output signal of the inverter 264 and the output signal of the FF circuit 251. The OR gate 265 outputs the OR logic signal as an enable signal EN2 to the row decoder 202.

In the reading access control circuit 201, the output signal of the FF circuit 251 serves as the signal A0 of the column address and the output signal of the FF circuit 261 serves as the signal A1 of the column address.

On the other hand, the row decoder 202 includes FF circuits 270 to 273 for receiving input signals in synchronization with the rise of the clock signal CLK to hold them, an inverter 274 for inverting an output signal of the FF circuit 273, a NAND gate 275 for outputting an NAND logic of an output signal of the inverter 274 and the reset signal RSTL to the FF circuit 270, an AND gate 276 for outputting an AND logic of an output signal of the FF circuit 270 and the reset signal RSTL to the FF circuit 271, an AND gate 277 for outputting an AND logic of an output signal of the FF circuit 271 and reset signal RSTL to the FF circuit 272 and an AND gate 278 for outputting an AND logic of an output signal of the FF circuit 272 and the reset signal RSTL to the FF circuit 273. Each of the FF circuits 270 to 273 receives the enable signal EN2, and receives the input signal to hold it only when the enable signal EN2 is "1" and does not receive the input signal when the enable signal EN2 is "0".

In the row decoder 202, the output signals of the FF circuits 270 to 273 are connected to the reading word lines RWL0 to RWL3, respectively.

The reading access control circuit 201 further includes an AND gate 266 for outputting an AND logic of the output signal of the FF circuit 251 and the output signal of the FF circuit 273 in the row decoder 202. An output signal of the AND gate 266 serves as the enable signal EN1 to be inputted to the FF circuit 261.

When the reset signal RSTL is "0", the AND gates 253, 263, 276 to 278 output "0" and only the NAND gate 275 outputs "1". On the other hand, the inverter 264 outputs "1" and accordingly the OR gate 265 outputs "1". Therefore, upon resetting the reset signal to "0", the enable signal EN2 of "1" is obtained. In synchronization with the first rise of the clock signal CLK after the reset signal becomes "0", the FF circuits 251 and 261 in the reading access control circuit 201 each hold and output "0", the FF circuit 270 in the row decoder 202 holds and outputs "1" and the FF circuits 271 to 273 each hold and output "0". Accordingly, only the reading word line RWL0 is selected to be activated to "1", i.e., "H".

When the reset signal RSTL is "1", since the AND gate 253 gives the inverted signal outputted from the inverter 252 to the FF circuit 251 without changing its logic, the output signal of the FF circuit 251, i.e., the signal A0, changes from "1" to "0" and from "0" to "1" alternately in the 1-bit counter 250 of the reading access control circuit 201.

On the other hand, in the row decoder 202, the AND gates 276 to 278 output the stored data of the FF circuits 270 to 272 respectively without changing their logics and the NAND gate 274 outputs the stored data of the FF circuit 273 without changing its logic through the inverter 274. Accordingly, the stored data of the FF circuit 270 shifts to the FF circuit 271, the stored data of the FF circuit 271 shifts to the FF circuit 272, the stored data of the FF circuit 272 shifts to the FF circuit 273 and the stored data of the FF circuit 273 shifts to the FF circuit 270 in synchronization with the rise of the clock signal CLK. Thus, the row decoder 202 serves as a shift register to circularly shift the stored data of the FF circuits 270 to 273. The circular shift operation is performed only when the enable signal EN2 is "1", and no shift operation is performed when the enable signal EN2 is "0". Since the data "1" set in the FF circuit 270 at the outset sequentially shifts to the subsequent FF circuits, one of the reading word lines RWL0 to RWL3 is selected to be activated.

Further, when the reset signal RSTL is "1", the signal A1 changes from "1" to "0" and from "0" to "1" alternately in the 1-bit counter 260. With the AND gate 266, however, the FF circuit 261 receives the signal from the AND gate 263 only when the output signals of the FF circuits 251 and 273 are both "1", and otherwise the 1-bit counter 260 do not perform the count operation.

<H-2. Operation of Access Control Circuit>

An operation of reading data from the memory cells in the eighth preferred embodiment will be discussed below.

FIG. 28A is a chart showing the values of the signals A0 and A1 outputted from the reading access control circuit 201 of FIG. 27 and the values of potential level of the reading word lines. In the row "T" of this figure shown are sixteen consecutive cycles from 0 to 15 of the clock signal CLK in the reading access control circuit 201 of FIG. 27. The rows "BL#" and "MC#" are the same as those of FIG. 7A.

The operation of reading the respective 1-bit stored data from the sixteen memory cells as serial data starts with resetting the reset signal to "0".

In synchronization with the rise of the clock signal CLK starting the cycle 0, both the signals A1 and A0 come into "0" and the reading bit line RBL0 is selected. On the other hand, the reading word line RWL0 comes into "1" and the other word lines come into "0". Accordingly, the memory cell MC00 is accessed and the stored data thereof are read out into the reading data line 204.

During the cycle 0, the reset signal RSTL changes from "0" to "1" and remains "1" for the cycles 1 to 5.

At the cycle 1, since the reset signal RSTL is "1" and the signal A0 is "0" at the outset, the FF circuits 270 to 273 in the row decoder 202 do not perform the shift operation even if the clock signal CLK rises to start the cycle 1 and accordingly the reading word line RWL0 remains activated. The 1-bit counter 250 outputs "1" as the signal A0 in synchronization with the rise of the clock signal CLK of the cycle 1. On the other hand, since the FF circuit 273 outputs "0" also at this cycle, the enable signal EN1 is "0". The 1-bit counter 260 do not perform the count operation and continues to output "0" during the cycle 1. Accordingly, the memory cell MC10 is accessed and the stored data thereof are read out into the reading data line 204.

After that, the signal A0 outputted from the 1-bit counter 250 becomes "1" at the odd cycles and "0" at the even cycles. The FF circuits 270 to 273 in the row decoder 202 perform the shift operation in synchronization with the rises of the clock signal CLK of the odd cycles. Accordingly, at the cycles 2 and 3, the FF circuit 271 holds "1" and the reading word line RWL1 is selected to be activated. At the cycles 4 and 5, the FF circuit 272 holds "1" and the reading word line RWL2 is selected to be activated. At the cycles 6 and 7, the FF circuit 273 holds "1" and the reading word line RWL3 is selected to be activated.

In synchronization with the rise of the clock signal CLK starting the cycle 8, the data "1" having been stored in the FF circuit 273 at the cycle 7 shifts to the FF circuit 270 and the reading word line RWL0 is selected to be activated. Further, at the cycle 9, the reading word line RWL0 remains selected to be activated. At the cycles 10 and 11, the reading word line RWL1 is selected to be activated again. At the cycles 12 and 13, the reading word line RWL2 is selected to be activated again. At the cycles 14 and 15, the reading word line RWL3 is selected to be activated again.

The 1-bit counter 260 outputs "0" without count operation during the cycles 0 to 7. The enable signal EN1 becomes "1" at the cycle 7 where the signal A0 is "1" and the reading word line RWL3 is activated to be "H". Therefore, the 1-bit counter 260 starts the count operation in synchronization with the rise of the clock signal CLK of the cycle 8 and outputs "1" as the signal A1 during the cycle 8. Since the FF circuit 273 outputs "0" through the shift operation in the row decoder 202, the enable signal EN1 becomes "0" again at the cycle 9 and remains "0" later. Accordingly, the 1-bit counter 260 continues to output "1" as the signal A1 during the cycles 8 to 15.

<H-3. Characteristics of Read Operation>

Thus, in the eighth preferred embodiment, the stored data are outputted in the order of the memory cells MC00, MC10, MC01, MC11, MC02, MC12, MC03, MC13, MC20, MC30, MC21, MC31, MC22, MC32, MC23 and MC33 as shown in the row "MC#" of FIG. 23A, like in the sixth preferred embodiment, and serial data "1100100110011101" are outputted for the sixteen cycles. The read of the data from the memory cells is performed always according to the above order. In particular, the reading word lines RWL0 to RWL3 are configured so that the reading bit line corresponding to the n-type memory cell should be first selected after activation of the selected reading word line every time one of the reading word lines RWL0 to RWL3 is selected.

Therefore, the eighth preferred embodiment produces an effect of improving the speed of reading data, like the sixth preferred embodiment.

Furthermore, in the eighth preferred embodiment, the row decoder 202 has the shift register constituted of the FF circuits 270 to 273 and it sequentially selects the reading word line through the shift operation. Accordingly, the reading access control circuit 201 has only to generate the 1-bit signal which enables/disables the shift operation, i.e., the enable signal EN2, and does not need the FSR counter 240 in the seventh preferred embodiment of FIG. 25 to generate the signals A2 and A3 of the row address. Therefore, the reading access control circuit 201 may have a simpler configuration and may be more easily designed.

<I. The Ninth Preferred Embodiment>

In the ROM circuit of FIG. 20, the reading access control circuit 201 may have the configuration of the binary counter 125 of FIG. 6 or the configuration of FIG. 13 or FIG. 16. Further, the reading access control circuit 201 and the row decoder 202 may have the configuration of FIG. 18.

In the ROM circuit having the above configuration, the accessing order of the sixteen memory cells is like shown in FIG. 7A, where all the memory cells arranged in the row corresponding to the selected reading word line are sequentially accessed and the stored data thereof are read out while the selected reading word line is activated. According to the ninth preferred embodiment, the number of changes of the selected reading word line since the start of read operation is three, which is less than seven in the sixth preferred embodiment, for example. Accordingly, the number of driving operations for the word lines RWLN and RWLP by the drivers DN and DP respectively also decreases and power consumption of the drivers DN and DP can be reduced to the lowest possible.

<J. The Tenth Preferred Embodiment>

<J-1. Overall Device Configuration>

Figure 29:
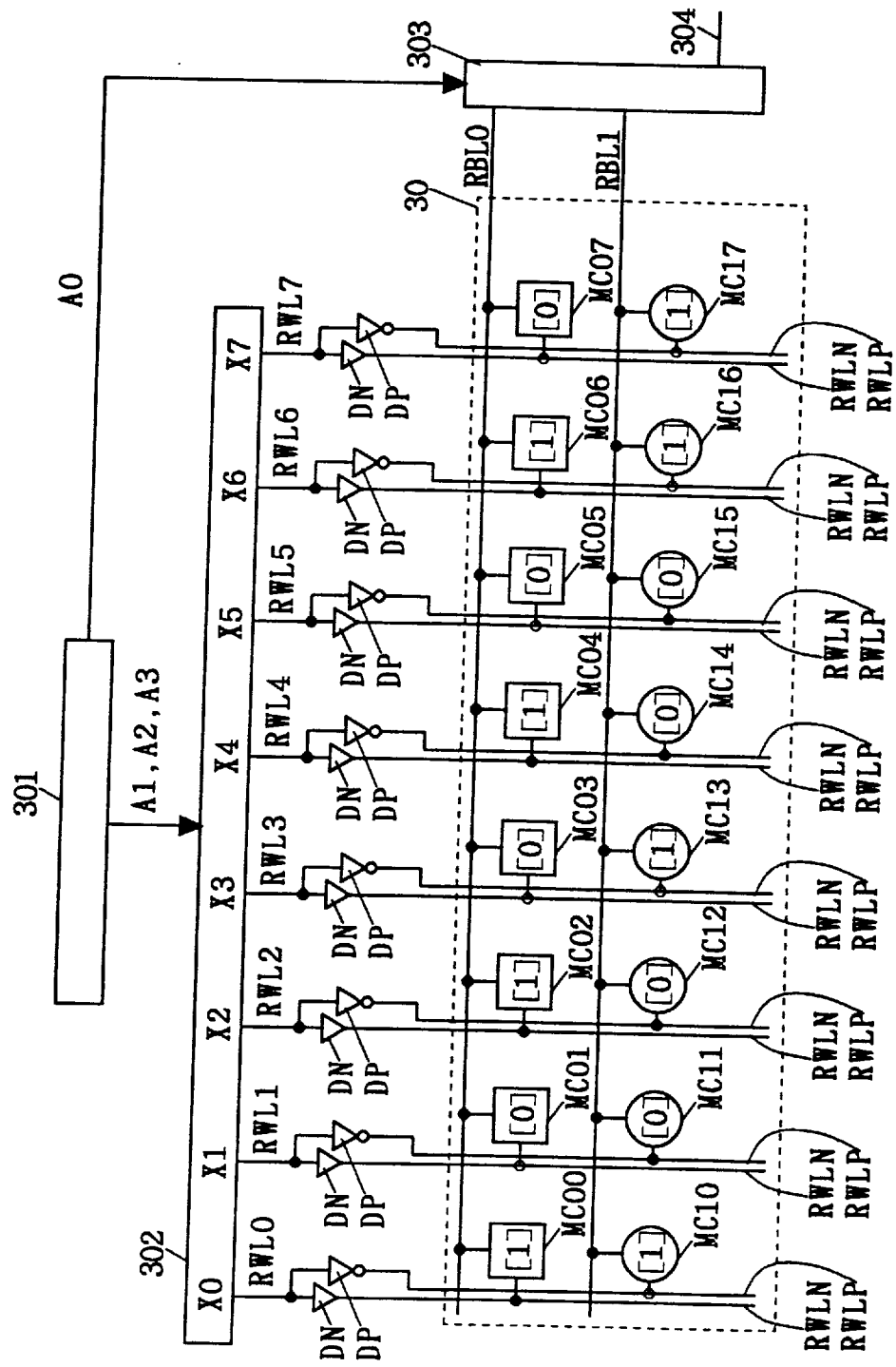
FIG. 29 is a circuit diagram showing a configuration of a semiconductor memory device, particularly a ROM circuit, in accordance with a tenth preferred embodiment of the present invention.

FIG. 29 is a circuit diagram showing a semiconductor memory device, particularly, a ROM circuit in accordance with the tenth preferred embodiment. The ROM circuit includes a memory cell array 30, a reading access control circuit 301, a reading row decoder 302 and a reading bit-line selector 303.

The memory cell array 30 of FIG. 29 includes n-type memory cells MC00 to MC07 and p-type memory cells MC10 to MC17. The reading bit line RBL0 is provided correspondingly to a column of the memory cells MC00 to MC07 and the reading bit line RBL1 is provided correspondingly to a column of the memory cells MC10 to MC17.

On the other hand, the reading word line RWL0 is provided correspondingly to a row of the memory cell MC00 and MC10, the reading word line RWL1 is provided correspondingly to a row of the memory cell MC01 and MC11, the reading word line RWL2 is provided correspondingly to a row of the memory cell MC02 and MC12, the reading word line RWL3 is provided correspondingly to a row of the memory cell MC03 and MC13, the reading word line RWL4 is provided correspondingly to a row of the memory cell MC04 and MC14, the reading word line RWL5 is provided correspondingly to a row of the memory cell MC05 and MC15, the reading word line RWL6 is provided correspondingly to a row of the memory cell MC06 and MC16 and the reading word line RWL7 is provided correspondingly to a row of the memory cell MC07 and MC17.

The reading access control circuit 301 has the same configuration as that of the seventh preferred embodiment of FIG. 25, except that the signal A0 outputted from the FF circuit 231 of FIG. 25 is given to the reading bit-line selector 303 as the column address and the signals A3, A2 and A1 outputted from the FF circuits 241 to 243 respectively are given to the row decoder 302 as the row address. The signals A0 to A3 are outputted at every cycle of the clock signal CLK according to the order shown in FIG. 26A.

<J-2. Configuration of Bit-Line Selector>

Figure 30:
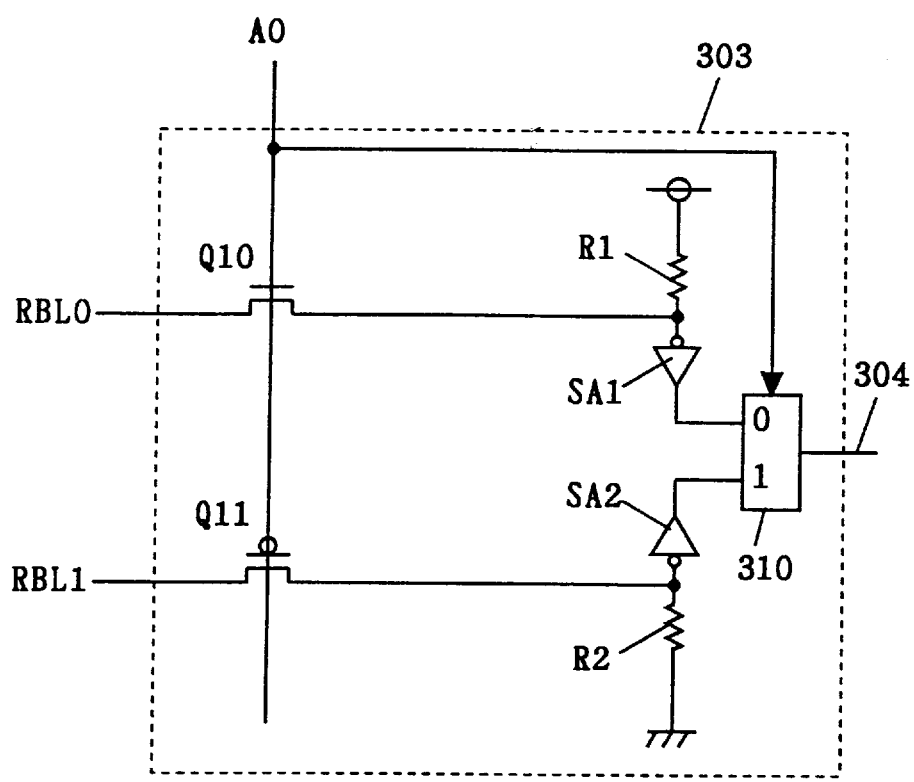
FIG. 30 is a circuit diagram showing a reading bit-line selector in the ROM circuit in accordance with the tenth preferred embodiment of the present invention.

FIG. 30 is a circuit diagram showing the reading bit-line selector 303. The reading bit-line selector 303 includes an nMOS transistor Q10 and a pMOS transistor Q11 of which the gate electrodes each receive the 1-bit signal A0 generated by the reading access control circuit 301 as the column address, a sense amplifier SA1 having an inverter whose input is connected to one of the terminals of the nMOS transistor Q10, for inverting the logic of an input signal for sense-amplification, a sense amplifier SA2 having an inverter whose input is connected to one of the terminals of the pMOS transistor Q11, for inverting the logic of an input signal for sense-amplification, a pull-up resister R1 connected between one of the terminals of the nMOS transistor Q10 and the power supply terminal and a pull-down resister R2 connected between one of the terminals of the pMOS transistor Q11 and the ground terminal. A selector 310 has the same configuration as the selector 121 of FIG. 3, and selects either of the sense amplifiers SA1 and SA2 to output the amplified signal of the selected sense amplifier to the reading data line 304. The reading bit line RBL0 is connected to the other terminal of the nMOS transistor Q10 and the reading bit line RBL1 is connected to the other terminal of the pMOS transistor Q11.

<J-3. Operation of Bit-Line Selector>

In the reading bit-line selector 303, when the signal A0 of the column address is "0", the pMOS transistor Q11 is non-conducting and the nMOS transistor Q10 becomes conducting. Accordingly, the reading bit line RBL0 is selected and the data thereon are outputted to the reading data line 304 through the sense amplifier SA1 and the selector 310. When the signal A0 is "1", the nMOS transistor Q10 is non-conducting and the pMOS transistor Q11 becomes conducting. Accordingly, the reading bit line RBL1 is selected and the data thereon are outputted to the reading data line 304 through the sense amplifier SA2 and the selector 310. A detailed operation of reading data from the reading bit line in this preferred embodiment is the same as discussed in association with FIG. 3, and omitted.

<J-4. Operation of Row Decoder>

The row decoder 302 decodes the 3-bit row address, i.e., the signals A1 to A3, generated by the reading access control circuit 301 to output an 8-bit signal, i.e., output signals X0 to X7. The output signals X0 to X7 are given to the reading word line RWL0 to RWL7, respectively.

When the row address signal (A3, A2, A1) is ("0", "0", "0"), only the output signal X0 is "1" and the other signals are each "0". Accordingly, only the reading word line RWL0 is selected to be activated.

When the row address signal (A3, A2, A1) is ("0", "0", "1"), only the output signal X1 is "1" and the other signals are each "0". Accordingly, only the reading word line RWL1 is selected to be activated.

When the row address signal (A3, A2, A1) is ("0", "1", "0"), only the output signal X2 is "1" and the other signals are each "0". Accordingly, only the reading word line RWL2 is selected to be activated.

When the row address signal (A3, A2, A1) is ("0", "1", "1"), only the output signal X3 is "1" and the other signals are each "0". Accordingly, only the reading word line RWL3 is selected to be activated.

When the row address signal (A3, A2, A1) is ("1", "0", "0"), only the output signal X4 is "1" and the other signals are each "0". Accordingly, only the reading word line RWL4 is selected to be activated.

When the row address signal (A3, A2, A1) is ("1", "0", "1"), only the output signal X5 is "1" and the other signals are each "0". Accordingly, only the reading word line RWL5 is selected to be activated.

When the row address signal (A3, A2, A1) is ("1", "1", "0"), only the output signal X6 is "1" and the other signals are each "0". Accordingly, only the reading word line RWL6 is selected to be activated.

When the row address signal (A3, A2, A1) is ("1", "1", "1"), only the output signal X7 is "1" and the other signals are each "0". Accordingly, only the reading word line RWL7 is selected to be activated.

As shown in FIG. 29, the memory cells MC00, MC02, MC04 and MC06 each store "1" and have the configuration shown in FIG. 21A. The memory cells MC01, MC03, MC05 and MC07 each store "0" and have the configuration shown in FIG. 21B. The memory cells MC10, MC13, MC16 and MC17 each store "1" and have the configuration shown in FIG. 21D. The memory cells MC11, MC12, MC14 and MC15 each store "0" and have the configuration shown in FIG. 21C.

In the ROM circuit as above configured, since the signals A0 to A3 are sequentially outputted as indicated in FIG. 26A, the accessing order of the memory cells is MC00, MC10, MC02, MC12, MC01, MC11, MC06, MC16, MC03, MC13, MC07, MC17, MC05, MC15, MC04 and MC14. The read of the data from the memory cells is performed always according to the above accessing order, and serial data "1110001101010010" are outputted from the reading data line 304.

<J-5. Characteristics of Read Operation>

In the reading access control circuit 301, the row address does not change when the column address, i.e., the signal A0, changes from "0" to "1" but the row address always changes when the signal A0 changes from "1" to "0". Thus, when data are sequentially read out from the sixteen memory cells, the data stored in the n-type memory cell may be first read out after activation of the selected reading word line every time one of the reading word lines is selected. Therefore, in the tenth preferred embodiment, it is possible to improve the speed for reading data, like in the sixth preferred embodiment.

<K. The Eleventh Preferred Embodiment>

<K-1. Overall Device Configuration>

Figure 31:
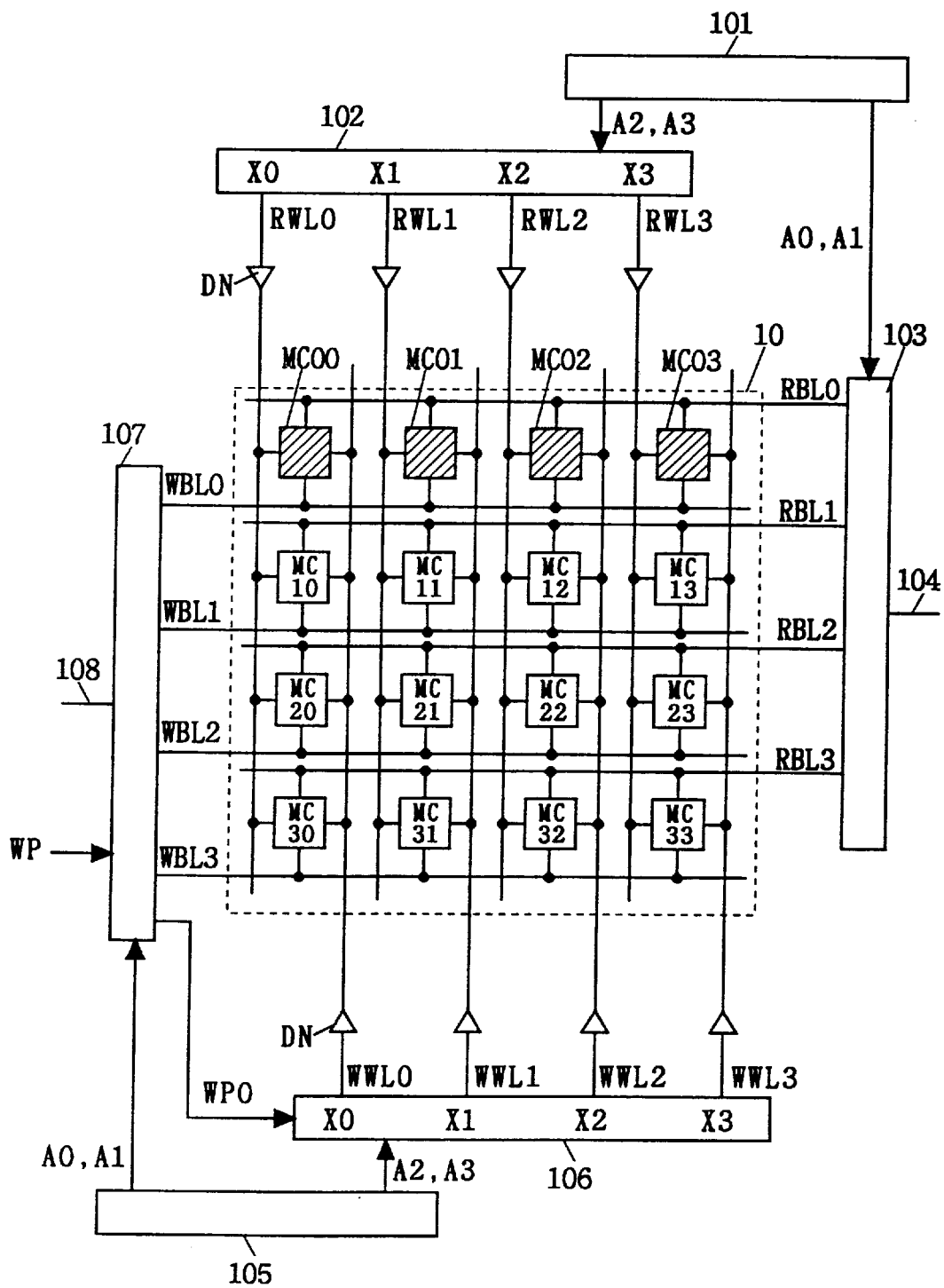
FIG. 31 is a circuit diagram showing a configuration of a semiconductor memory device, particularly an FIFO memory, in accordance with an eleventh preferred embodiment of the present invention.

FIG. 31 is a circuit diagram showing a configuration of a semiconductor memory device, particularly an FIFO memory where data stored in a plurality of memory cells are read out in the order as written, in accordance with the eleventh preferred embodiment.

In the FIFO memory, the sixteen memory cells MC00 to MC03, MC10 to MC13, MC20 to MC23 and MC30 to MC33 are each an n-type memory cell. Accordingly, there is no need for separating the word line into two through the drivers DN and DP of FIG. 1 and the memory cells arranged on each row are connected to a common word line.

Each of the n-type memory cells has the configuration of FIG. 2A. With respect to each memory cell, the corresponding reading word line is connected to the gate electrode of the nMOS transistor N1, the corresponding writing word line is connected to the gate electrode of the nMOS transistor N3, the corresponding reading bit line is connected to one of the electrodes of the nMOS transistor N1 and the corresponding writing bit line is connected to one of the electrodes of the nMOS transistor N3.

In FIG. 31, the respective nMOS transistors N1 to N4 included in the shaded memory cells MC00, MC01, MC02 and MC03 are larger in gate width than the nMOS transistors included in the other memory cells.

<K-2. Layout Pattern of Memory Cell Array>

Figure 32:
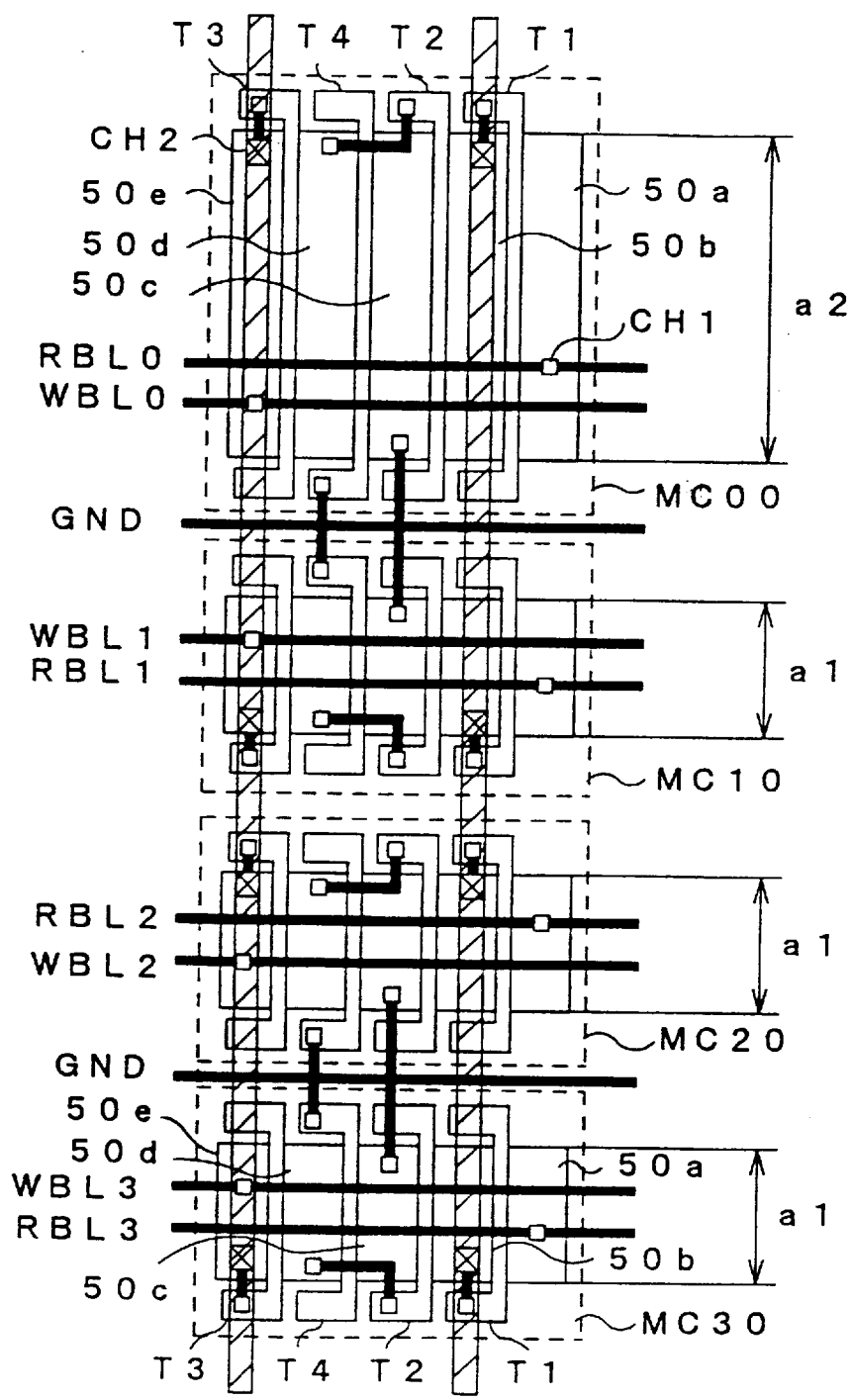
FIG. 32 is a plan view showing a layout pattern of memory cells in the FIFO memory in accordance with the eleventh preferred embodiment of the present invention.
Figure 33A:
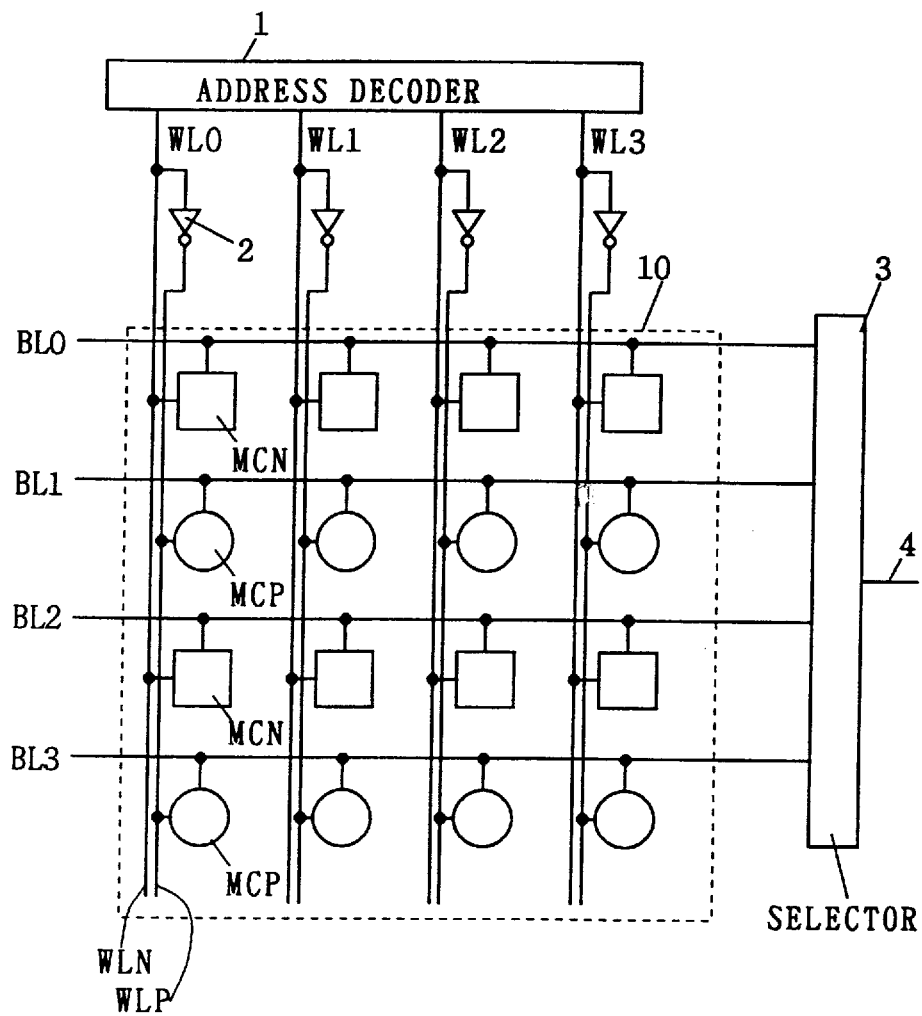
FIGS. 33A to 33C are circuit diagrams each showing a ROM circuit in the background art.
Figure 33B:
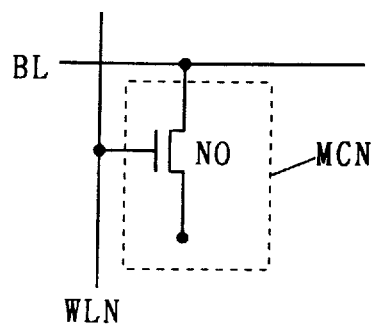
Figure 33C:
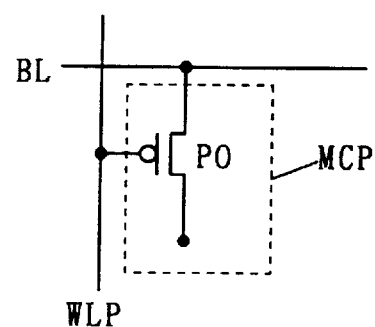

FIG. 32 is a plan view showing a layout pattern of a memory cell array arranged on the row of the memory cells MC00, MC10, MC20 and MC30.

In each memory cell, n-type semiconductor impurity regions 50a to 50e are provided so that four respective gate electrode portions T1 to T4 may be arranged in a direction of the bit line and channel regions may be formed therebelow. The gate electrode portions T1 to T4 correspond to the gate electrodes of the nMOS transistors N1 to N4 shown in FIG. 2A, respectively.

In FIG. 32, the first wiring layers are black-hatched and the second wiring layers provided in an upper position than the first wiring layers are shaded. Blank squares represent contact holes CH1 each connecting the first wiring layer and an impurity diffusion region or an gate electrode portion, and blank squares with a cross represent contact holes CH2 each connecting the first wring layer and the second wiring layer.

The reading bit line and the writing bit line are made of the first wiring layers and the reading word line and the writing word line are made of the second wiring layers.

In each memory cell, the impurity region 50d and the gate electrode portion T2 are electrically connected to each other with the first wiring layer through the contact holes CH1 provided respectively thereon. The impurity region 50c and the gate electrode portion T4 are electrically connected to the ground GND with the first wiring layer through the contact holes CH1 provided respectively thereon. The impurity region 50a is electrically connected to the corresponding reading bit line of the first wiring layer through the contact hole CH1 provided thereon. The impurity region 50e is electrically connected to the corresponding writing bit line of the first wiring layer through the contact hole CH1 provided thereon. The gate electrode portion T1 is electrically connected to the reading word line RWL0 through the contact hole CH1, the first wiring layer and the contact hole CH2. The gate electrode portion T3 is electrically connected to the writing word line WWL0 through the contact hole CH1, the first wiring layer and the contact hole CH2.

Particularly, the respective impurity regions 50a to 50e in the memory cells MC10, MC20 and MC30 have the same length a1 in a direction of the word line, and on the other hand, the impurity regions 50a to 50e have the length a2 which is twice as long as a1 in the direction of the word line. Accordingly, the respective nMOS transistors N1 to N4 in the memory cells MC00, MC01, MC02 and MC03 each have a larger gate width than those in the other memory cells.

Memory cell arrays disposed on the other rows have the same configuration as shown in FIG. 32.

The access control circuits 101 and 105, the row decoders 102 and 106, the reading bit-line selector 103 and the writing bit-line selector 107 have the same configuration and operate in the same manner as those of the first preferred embodiment.

<K-3. Operation of Reading Data>

The accessing order of the memory cells of this preferred embodiment is MC00, MC10, MC20, MC30, MC01, MC11, MC21, MC31, MC02, MC12, MC22, MC32, MC03, MC13, MC23 and MC33, like in the first preferred embodiment. The read of the stored data from the memory cells is always performed according to the accessing order.

For example, when the reading word line RWL0 is selected to be activated, the nMOS transistors N1 in the memory cells MC00, MC10, MC20 and MC30 become conducting. The nMOS transistor N1 in the memory cell MC00 has a larger gate width than those in the other memory cells, and therefore the reading bit line corresponding to the memory cell MC00 is charged and discharged faster. Since the reading bit line corresponding to the memory cell MC00 is first selected by the reading bit-line selector 103 after activation of the reading word line RWL0, data can be faster read from the memory cell into the reading data line 104.

Since the reading bit lines corresponding to the memory cells MC10, MC20 and MC30 are sequentially selected while the reading word line RWL0 is activated, the stored data of the memory cells MC00, MC10, MC20 and MC30 have been already read out into the corresponding reading bit lines and therefore the stored data of the memory cells MC10, MC20 and MC30 can be sequentially read out subsequent to the stored data of the memory cell MC00 without delay in reading data due to the small gate width of the nMOS transistors in the memory cells MC10, MC20 and MC30. Furthermore, this configuration in which the MOS transistors in the memory cells MC10, MC20 and MC30, other than the memory cell MC00, have smaller gate width can curb an increase in area of the layout, resulting in higher circuit integration.

<K-4. Characteristics of Read Operation>

When the stored data of the memory cells are sequentially read out, in particular, the memory cell including a MOS transistor with larger gate width is first selected by the reading bit-line selector 103 after activation of the selected reading word line every time one of the reading word lines RWL0 to RWL3 is selected, and therefore the clock signal CLK of higher frequency can be used to operate the FIFO memory, resulting in faster operation of the FIFO memory.

Furthermore, there may be also an effective case where only the nMOS transistors N1 in the memory cells MC00 to MC03 are larger in gate width than those in the other memory cells though all the nMOS transistors N1 to N4 in the memory cells MC00 to MC03 are larger in gate width than those of the other memory cells in the above example.

Though the memory cells in the above example are n-type memory cells having the configuration of FIG. 2A, the memory cells may be p-type memory cells having the configuration of FIG. 2B and will produce the same effect as the above only if the p-type memory cell including a pMOS transistor with larger gate width is first selected by the reading bit-line selector 103 after activation of the selected reading word line every time one of a plurality of reading word lines is selected.

While the invention has been shown and described in detail, the foregoing description is in all preferred embodiments illustrative and not restrictive. It is therefore understood that numerous modifications and variations can be devised without departing from the scope of the invention.

We claim:

1. A semiconductor memory device, comprising:

a plurality of memory cells arranged in a matrix, each including a data storage for storing data;

a plurality of word lines provided corresponding to rows of said plurality of memory cells;

a plurality of bit lines provided corresponding to columns of said plurality of memory cells;

access control means for generating and outputting a first control signal and a second control signal for an access to each of said plurality of memory cells;

word-line selection means for selecting one of said plurality of word lines in response to said first control signal outputted from said access control means to activate a selected word line; and bit-line selection means for selecting one of said plurality of bit lines in response to said second control signal outputted from said access control means to read data from a selected bit line, wherein said plurality of memory cells comprise first type of memory cells each having at least one first field effect transistor connected between said data storage included therein and a corresponding bit line and second type of memory cells each having at least one second field effect transistor connected between said data storage included therein and a corresponding bit line, said at least one first field effect transistor of said first type of memory cells having transistors of a different conductivity than said at least one second field effect transistor of said second type of memory cells, and said access control means generates said first and second control signals so that a bit line corresponding to one of said first type of memory cells which is connected to said selected word line is first selected by said bit-line selection means after activation of said selected word line every time selection of word line is made by said word-line selection means in a sequential read of data from said plurality of memory cells.

2. The semiconductor memory device of claim 1, wherein said access control means generates said first and second control signals so that a bit line corresponding to one of said first type memory cells which is connected to said selected word line is first selected after activation of said selected word line and bit lines corresponding to said second type memory cells which are connected to said selected word line are selected by said bit-line selection means at an end of said activation of said selected word line.

3. The semiconductor memory device of claim 1, wherein said at least one first field effect transistor is at least one n-channel field effect transistor, said at least one second field effect transistor is at least one p-channel field effect transistor, each of said plurality of word lines comprises a pair of word lines, one of said pair of word lines is connected to a control terminal of one of said at least one n-channel field effect transistor in each of said first type of memory cells and the other of said pair of word lines is connected to a control terminal of one of said at least one p-channel field effect transistor in each of said second type of memory cells, and said pair of word lines included in said selected word line are both activated when said selected word line is selected by said word-line selection means.

4. The semiconductor memory device of claim 1, wherein said at least one first field effect transistor is at least one n-channel field effect transistor, said at least one second field effect transistor is at least one p-channel field effect transistor, each of said first type of memory cells includes only said at least one n-channel field effect transistor, each of said second type of memory cells includes only said at least one p-channel field effect transistor, and said plurality of memory cells are arranged so that said first type of memory cells and said second type of memory cells are mixed in each row.

5. The semiconductor memory device of claim 1, wherein said at least one first field effect transistor has a first gate width, and said at least one second field effect transistor has a second gate width which is smaller than said first gate width.

6. The semiconductor memory device of claim 1, wherein each of said plurality of word lines comprises a pair of word lines, and said access control means generates said first and second control signals so that bit lines corresponding to all memory cells which are connected to said pair of word lines included in said selected word line are sequentially selected by said bit-line selection means by an end of activation of said pair of word lines every time a selection of word line is made by said word-line selection means in a sequential read of data from said plurality of memory cells.

7. The semiconductor memory device of claim 1, wherein said access control means comprises a first counter for performing a count operation to output a count signal as said second control signal; and a second counter for performing a count operation to output a count signal as said first control signal, said count operation being enabled/disabled according to said second control signal.

8. The semiconductor memory device of claim 1, wherein said access control means includes
   a counter for performing a count operation to output a count signal; and
   a shift register comprising a plurality of data storing circuits, an output of which being connected to an input, for performing a circular-shift operation of stored data of said data storing circuits to output signals, said circular-shift operation being controlled by said count signal,
   and wherein said count signal outputted from said counter serves as said second control signal and said signals outputted from said shift register serves as said first control signal.

9. The semiconductor memory device of claim 1, wherein said word-line selection means comprises a shift register constituted of a plurality of data storing circuits, an output of which being connected to an input, for performing a circular-shift operation of stored data of said data storing circuits to output signals from said plurality of data storing circuits, said circular-shift operation being controlled by said first control signal outputted from said access control means,
   and wherein said signals outputted from said plurality of data storing circuits are given to said plurality of word lines, respectively.

10. A method of reading data from a semiconductor memory device, wherein
    said semiconductor memory device comprises:
       a plurality of memory cells arranged in a matrix, each including a data storage for storing data;
       a plurality of word lines provided correspondingly to rows of said plurality of memory cells;
       a plurality of bit lines provided correspondingly to columns of said plurality of memory cells;
       word-line selection means for selecting one of said plurality of word lines to activate a selected word line; and
       bit-line selection means for selecting one of said plurality of bit lines to read data from a selected bit line,
       and wherein said plurality of memory cells include first type of memory cells each having at least one first field effect transistor connected between said data storage included therein and a corresponding bit line and second type of memory cells each having at least one second field effect transistor connected between said data storage included therein and a corresponding bit line, said at least one first field effect transistor of said first type of memory cells having transistors of a different conductivity than said at least one second field effect transistor of said second type of memory cells,
    said method comprising the step of first reading data stored in one of said first type of memory cells which is connected to said selected word line by said bit-line selection means after activation of said selected word line every time selection of word line is made by said word-line selection means in a sequential read of data from said plurality of memory cells.

11. The method of claim 10, wherein
    said at least one first field effect transistor is at least one n-channel field effect transistor,
    said at least one second field effect transistor is at least one p-channel field effect transistor,
    each of said plurality of word lines comprise s a pair of word lines,
    one of said pair of word lines is connected to a control terminal of one of said at least one n-channel field effect transistor in each of said first type of memory cells and the other of said pair of word lines is connected to a control terminal of one of said at least one p-channel field effect transistor in each of said second type of memory cells,
    said pair of word lines of said selected word line are both activated when said selected word line is selected by said word-line selection means,
    and wherein data stored in one of said first type of memory cells which is connected to said pair of word lines of said selected word line are first read out by said bit-line selection means after activation of said selected word line every time selection of word line is made by said word-line selection means in a sequential read of data from said plurality of memory cells.

12. The method of claim 10, wherein
    said at least one first field effect transistor is at least one n-channel field effect transistor,
    said at least one second field effect transistor is at least one p-channel field effect transistor,
    each of said first type of memory cells includes only said at least one n-channel field effect transistor,
    each of said second type of memory cells includes only said at least one p-channel field effect transistor,
    said plurality of memory cells are arranged so that said first type of memory cells and said second type of memory cells are mixed in each row,
    and wherein data stored in one of said first type of memory cells which is connected to said pair of word lines comprised in said selected word line are first read out by said bit-line selection means after activation of said selected word line every time selection of word line is made by said word-line selection means in a sequential read of data from said plurality of memory cells.

13. The method of claim 10, wherein
    said at least one first field effect transistor has a first gate width,
    said at least one second field effect transistor has a second gate width which is smaller than said first gate width,
    and wherein data stored in one of said first type of memory cells which is connected to said selected word line are first read out by said bit-line selection means after activation of said selected word line every time selection of word line is made by said word-line selection means in a sequential read of data from said plurality of memory cells.

* * * * *